(12) United States Patent
Kimura et al.

(10) Patent No.: US 11,385,266 B2
(45) Date of Patent: Jul. 12, 2022

(54) CURRENT DETECTION CIRCUIT, SEMICONDUCTOR DEVICE, AND SEMICONDUCTOR SYSTEM

(71) Applicant: RENESAS ELECTRONICS CORPORATION, Tokyo (JP)

(72) Inventors: Keisuke Kimura, Tokyo (JP); Hideyuki Tajima, Tokyo (JP); Wataru Saito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/820,178

(22) Filed: Mar. 16, 2020

(65) Prior Publication Data

US 2020/0309824 A1   Oct. 1, 2020

(30) Foreign Application Priority Data

Mar. 25, 2019   (JP) .............................. JP2019-055993

(51) Int. Cl.
*G01R 19/165* (2006.01)
*G05F 3/26* (2006.01)

(52) U.S. Cl.
CPC ....... *G01R 19/16538* (2013.01); *G05F 3/262* (2013.01)

(58) Field of Classification Search
CPC ..................... G01R 19/16538; G05F 3/262
See application file for complete search history.

(56) References Cited

U.S. PATENT DOCUMENTS

| | | | |
|---|---|---|---|
| 6,377,034 B1* | 4/2002 | Ivanov ................... | G05F 3/245 323/224 |
| 2005/0046438 A1* | 3/2005 | Tam ........................ | G11C 7/062 324/76.11 |
| 2006/0197580 A1* | 9/2006 | Barker ................ | H03K 17/0822 327/365 |
| 2016/0013765 A1* | 1/2016 | Peluso .................... | H03F 1/303 330/260 |
| 2017/0279357 A1* | 9/2017 | Tajima ................... | H02M 3/158 |
| 2017/0294772 A1* | 10/2017 | Illing et al. ............ | H02H 9/025 |

OTHER PUBLICATIONS

Extended European Search Report issued in corresponding European Patent Application No. 20165442.3-1203, dated Jul. 27, 2020.

* cited by examiner

*Primary Examiner* — Harry R Behm
(74) *Attorney, Agent, or Firm* — McDermott Will & Emery LLP

(57) ABSTRACT

The present invention provides a current detection circuit, semiconductor device, and a semiconductor system suitable for improving a current sensing accuracy. According to one embodiment, the current detection circuit 12 comprises a sense transistor Tr11 through which a first sense current proportional to the current flowing through the drive transistor MN1 flows, an operational amplifier AMP1 for amplifying the potential difference of the voltage of the external output terminal OUT and the source voltage of the sense transistor Tr11 for outputting the first sense current, a transistor Tr12 provided in series with the sense transistor Tr11 and to which the output voltage of the operational amplifier AMP1 is applied to the gate, and a switch SW3 provided between the external output terminal OUT and the source of the sense transistor Tr11 and turned on when the drive transistor MN1 is turned off.

6 Claims, 44 Drawing Sheets

CURRENT DETECTION CIRCUIT, SEMICONDUCTOR DEVICE, AND SEMICONDUCTOR SYSTEM

CROSS-REFERENCE TO RELATED APPLICATIONS

The disclosure of Japanese Patent Application No. 2019-055993 filed on Mar. 25, 2019 including the specification, drawings and abstract is incorporated herein by reference in its entirety.

BACKGROUND

The present disclosure relates to a current detection circuit, semiconductor device and a semiconductor system, for example, a current detection circuit, semiconductor device and a semiconductor system suitable for improving current sensing accuracy.

The Background of the Invention

A vehicle is equipped with an electronic control unit for controlling a supplying of electric current to a solenoid valve for controlling opening and closing of a clutch. The electronic control unit controls the opening and closing of the clutch by controlling supply of electric current to the solenoid valve, thereby transmitting the driving force of an engine to the transmission at the time of starting, stopping, and shifting of the vehicle. Here, the electronic control unit needs to accurately open and close the clutch by accurately controlling the current supplied to the solenoid valve.

Therefore, the electronic control unit is provided with a current detection circuit for detecting whether or not the value of the current outputted from the solenoid driver indicates a normal value. Of course, in this current detection circuit, it is required to detect the current with high accuracy.

As a current detection circuit with high current detecting accuracy, a current detection circuit for detecting a current flowing through a driver using a shunting resistor is known. However, in the current detection circuit of the shunt resistor method, there is a problem that the circuit size is increased. Particularly, when a plurality of solenoid drivers are required to be mounted on one chip, a plurality of shunt-resistor current detection circuit are provided on one chip, and therefore, the chip size becomes very large.

There are disclosed techniques listed below.
[Patent Document 1] U.S. Pat. No. 6,377,034

Patent Document 1 discloses a solution to these problems. The current detection circuit disclosed in Patent Document 1 detects a current flowing in a driver (transistor) by using a sense transistor in which a current proportional to a current flowing in the driver (transistor) flows. As a result, this current detection circuit can suppress an increase in the circuit size as compared with the circuit size of the shunt-resistor type current detection circuit.

SUMMARY

Incidentally, the current detection circuit disclosed in Patent Document 1 includes an amplifier and a voltage control transistor in order to equalize the source voltage of the driver and the source voltage of the sense transistor to the same values. The amplifier amplifies a potential difference between the source voltage of the sense transistor and a ground voltage. The voltage control transistor is provided between the source and the detection current output terminal of the sense transistor, and controls the current flowing between the source and the drain based on the output voltage of the amplifier.

However, in the configuration of the Patent Document 1, when the sense transistor is in an off state, the current flowing through the voltage control transistor decreases to the vicinity of 0 A, so that a gain of the loop composed of the amplifier and the voltage control transistor decrease, and the feedback by the loop becomes ineffective. As a result, the voltage control transistor is not completely turned off, so that the source voltage of the sense transistor of the off state exhibits a voltage different from the voltage of 0V. That is, the source-drain voltage of the driver of the off state and the source-drain voltage of the sense transistor of the off state differ from each other.

Here, when the source-drain voltage of the off state driver and the source-drain voltage of the sense transistor of the off state have different values, degrees of deteriorations of the driver and the sense transistor, caused by the leakage current, are different. As a result, in the configuration of the Patent Document 1, a ratio of currents flowing in the driver and the sense transistor of the on state fluctuates, so that the current flowing in the driver cannot be accurately detected. Other objects and novel features will become apparent from the description of this specification and the accompanying drawings.

Means of Solving the Problems

According to an embodiment, a current detecting circuit comprises: a first sense transistor to which a voltage of a first power supply is supplied together with a first drive transistor provided between the first power supply and an external output terminal to which a load is connected, and through which a first sense current proportional to a current flowing through the first drive transistor flows; a first amplifier amplifying a potential difference of the external output terminal and a voltage of the output terminal of the first sense transistor, which outputs the first sense current; a first voltage control transistor, provided in series with the first sense transistor, to which the output voltage of the first amplifier is applied to a gate, at an output terminal of the first sense transistor; a first voltage control transistor, provided between the external output terminal and an output terminal of the first sense transistor, which is turned on when the first drive transistor is turned off; and a first switch, which is turned off when the first drive transistor is turned on, wherein the current detection circuit outputs the first sense current as a detection current.

According to an embodiment, a current detecting circuit includes: a first sense transistor, to which a voltage of the external output terminal is supplied together with a first drive transistor, of the first drive transistor provided between a first power supply and an external output terminal connected to a load, or a second drive transistor provided between the external output terminal and a second power supply, and a first sense current flows in proportion to a current flowing through the first drive transistor; a first amplifier for amplifying a potential difference of a voltage of the first power supply and a voltage of an output terminal of the first sense transistor for outputting the first sense current; a first voltage control transistor provided in series with the first sense transistor on an output terminal side of the first sense transistor and having a gate to which an output voltage of the first amplifier is applied; and a first voltage control transistor provided between the first power supply and an output terminal of the first sense transistor, wherein the first switch is turned on when the first drive transistor is turned off and turned off when the first drive transistor is turned on. The current detection circuit outputs the first sense current as a detection current.

According to an embodiment, the current detecting circuit includes: a first sense transistor, a first amplifier, a first voltage control transistor, a second sense transistor, a second amplifier, a second voltage control transistor, a mirror transistor, a selecting circuit, and a switch group including a plurality of switch. When the operation mode is the high side driving mode, the current detecting circuit switches on/off of the switch group. Thus, the first sense transistor is supplied with the voltage of the first power supply together with the first drive transistor provided between the first power supply and the external output terminal to which the load is connected, and the first sense current proportional to the current flowing through the first drive transistor flows. The first amplifier is configured to amplify a potential difference between a voltage of the external output terminal and a voltage of the output terminal of the first sense transistor for outputting the first sense current. The first voltage control transistor is provided in series with the first sense transistor at an output terminal of the first sense transistor, and is configured such that an output voltage of the first amplifier is applied to a gate thereof. The first switch, which is a part of the switch group, is provided between the external output terminal and the output terminal of the first sensing transistor. The first switch, which is part of the switch group, is configured to turn on when the first drive transistor is turned off and to turn off when the first drive transistor is turned on. The second sense transistor is supplied with a voltage of the external output terminal together with a second drive transistor that switches on and off in a manner complementary to the first drive transistor provided between the external output terminal and the second power supply. The second sense transistor is configured such that a second sense current flows which is proportional to the current flowing through the second drive transistor. The second amplifier is configured to amplify a potential difference between a voltage of the second power supply and a voltage of an output terminal of the second sense transistor that outputs the second sense current. The second voltage-controlled transistor is provided in series with the second sense transistor at the output terminal of the second sense transistor. The second voltage control transistor is configured such that an output voltage of the second amplifier is applied to a gate of the second voltage control transistor. The second switch, which is a part of the switch group, is provided between the second power supply and the output terminal of the second sense transistor, and is configured to be turned on when the second drive transistor is turned off and to be turned off when the second drive transistor is turned on. The mirror transistor is configured to mirror the second sense current flowing with the second sense transistor to the second voltage control transistor. The selection circuit is configured to selectively output the first sense current and the second sense current mirrored by the mirror transistor as a detection current. When the operation mode is the low side driving mode, the current detecting circuit switches on/off of the switch group. Thus, the first sense transistor is supplied with the voltage of the external output terminal together with the first drive transistor, and the first sense current proportional to the voltage flowing through the first drive transistor flows. The first amplifier is configured to amplify a potential difference between a voltage of the first power supply and a voltage of an output terminal of the first sense transistor outputting the first sense current. The first voltage control transistor is provided in series with the first sense transistor on the output terminal side of the first sense transistor. The first voltage control transistor is configured such that an output voltage of the first amplifier is applied to the gate. The first switch is provided between the first power supply and the output terminal of the first sense transistor, and is configured to be turned on when the first drive transistor is turned off and to be turned off when the first drive transistor is turned on. The second sense transistor is supplied with a voltage of the second power supply together with a voltage of the second drive transistor, and a second sense current proportional to a current flowing through the second drive transistor flows through the second sense transistor. The second amplifier is configured to amplify a potential difference of a voltage of the external output terminal and a voltage of an output terminal of the second sense transistor for outputting the second sense current. The second voltage control transistor is provided in series with the second sense transistor at the output terminal of the second sense transistor, and is configured such that the output voltage of the second amplifier is applied to the gate. The second switch is provided between the external output terminal and the output terminal of the second sensing transistor. The second switch is configured to turn on when the second drive transistor is turned off and to turn off when the second drive transistor is turned on. The mirror transistor is configured to mirror the second sense current flowing with the second sense transistor to the second voltage control transistor. The selection circuit is configured to selectively output the first sense current and the second sense current mirrored by the mirror transistor as the detection current.

Effect of the Invention

Current detection circuit, semiconductor device, and a system suitable for improving current sensing accuracy can be provided.

BRIEF DESCRIPTION OF THE DRAWINGS

FIG. 6 is a diagram for explaining a flow of current of the current detection circuit shown in FIG. 4 when a high side driver is turned on.

FIG. 7 is a diagram for explaining a flow of current of the current detection circuit shown in FIG. 4 when a low side driver is turned on.

FIG. 9 is a diagram for explaining a flow of current of the current detection circuit shown in FIG. 8 when the high side driver is turned on.

FIG. 10 is a diagram for explaining a flow of current of the current detection circuit shown in FIG. 8 when the low side driver is turned on.

FIG. 18 is a diagram for explaining a flow of current of the current detection circuit shown in FIG. 16 when the high side driver is turned on.

FIG. 19 is a diagram for explaining a flow of current of the current detection circuit shown in FIG. 16 when the low side driver is turned on.

FIG. 20 is a diagram for explaining a flow of current of a concept according to a current detection circuit prior to the second embodiment when the high side driver is turned on.

FIG. 21 is a diagram for explaining a flow of current of a concept according to current detection circuit prior to the second embodiment when the low side driver is turned on.

FIG. 23 is a diagram for explaining a flow of current of the current detection circuit shown in FIG. 22 when the high side driver is turned on.

FIG. 24 is a diagram for explaining a flow of current of the current detection circuit shown in FIG. 22 when the low side driver is turned on.

FIG. 26 is a diagram for explaining a flow of current of the current detection circuit shown in FIG. 25 when the high side driver is turned on.

FIG. 27 is a diagram for explaining a flow of current of the current detection circuit shown in FIG. 25 when the low side driver is turned on.

DETAILED DESCRIPTION

Figure 1:
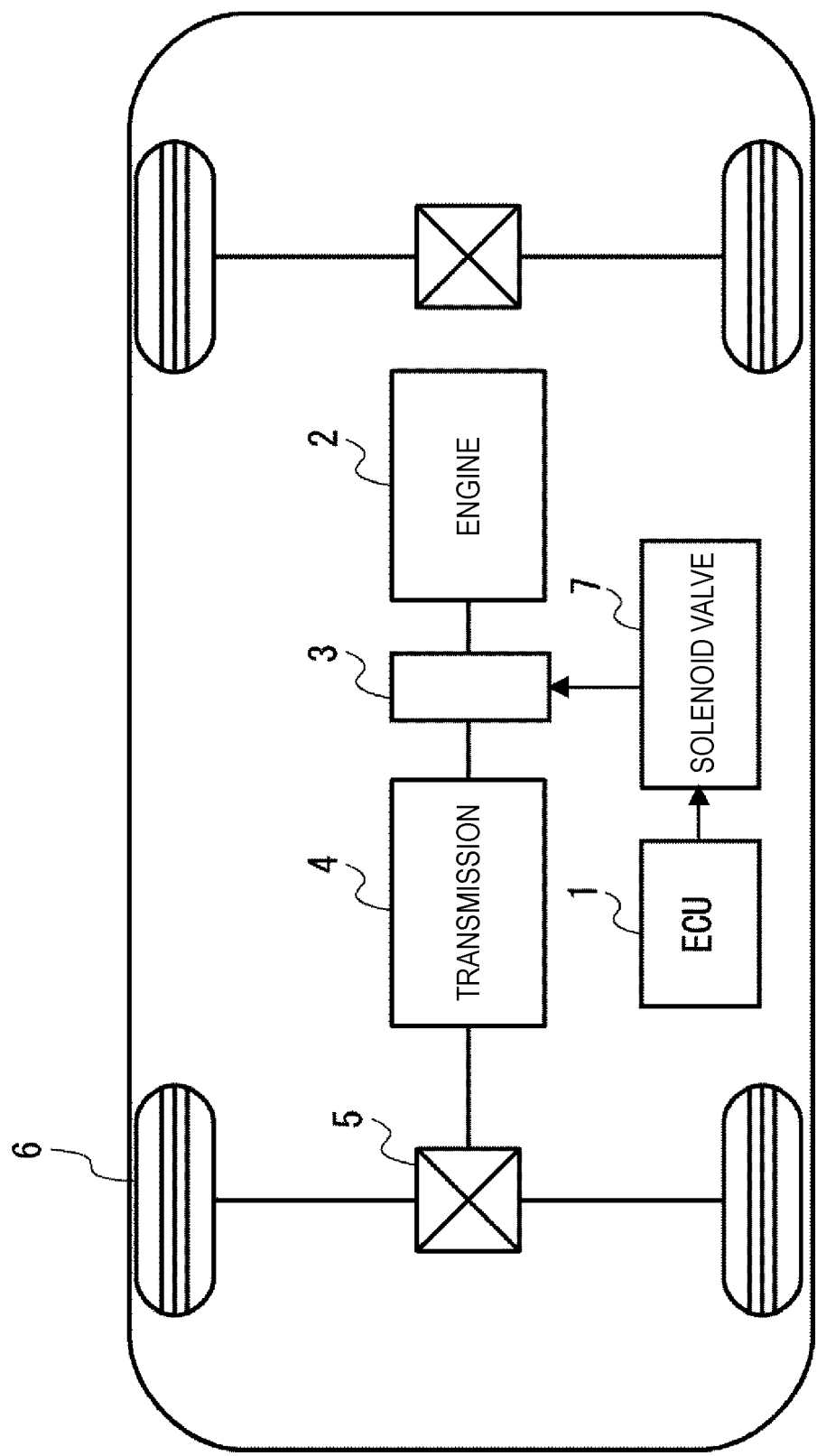
FIG. 1 is an external view of a vehicle on which an electronic control unit according to a first embodiment is mounted.

For clarity of explanation, the following description and drawings are appropriately omitted and simplified. In addition, the elements described in the drawings as functional blocks for performing various processes can be configured as a CPU (Central Processing Unit), a memory, and other circuits in terms of hardware, and are realized by a program loaded into a memory in terms of a software. Therefore, it is understood by those skilled in the art that these functional blocks can be realized in various forms by a hardware alone, a software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

First Embodiment

FIG. 1 is an external view of a vehicle on which an electronic control unit (ECU; Electronic Control Unit) according to a first embodiment is mounted.

As shown in FIG. 1, for example, an engine 2, a clutch 3, a transmission 4, a differential gear 5, tires 6, a solenoid valve (load) 7, and an electronic control unit 1 are mounted on a vehicle.

For example, the electronic control unit 1 controls a supply of current to the solenoid valve 7. The solenoid valve 7 converts the current supplied from the solenoid driver into an electromagnetic force by an inductor or the like, and then uses the electromagnetic force to control the opening and closing of the clutch 3. Thereby, the transmission of the driving force of the engine 2 to the transmission 4 at the time of starting, stopping, and shifting of the vehicle is controlled. The transmission 4 changes the driving force of the engine 2 to a rotational speed and a torque corresponding to a running condition, and then transmits the torque to a differential gear 5 to rotate tires 6.

Figure 2:
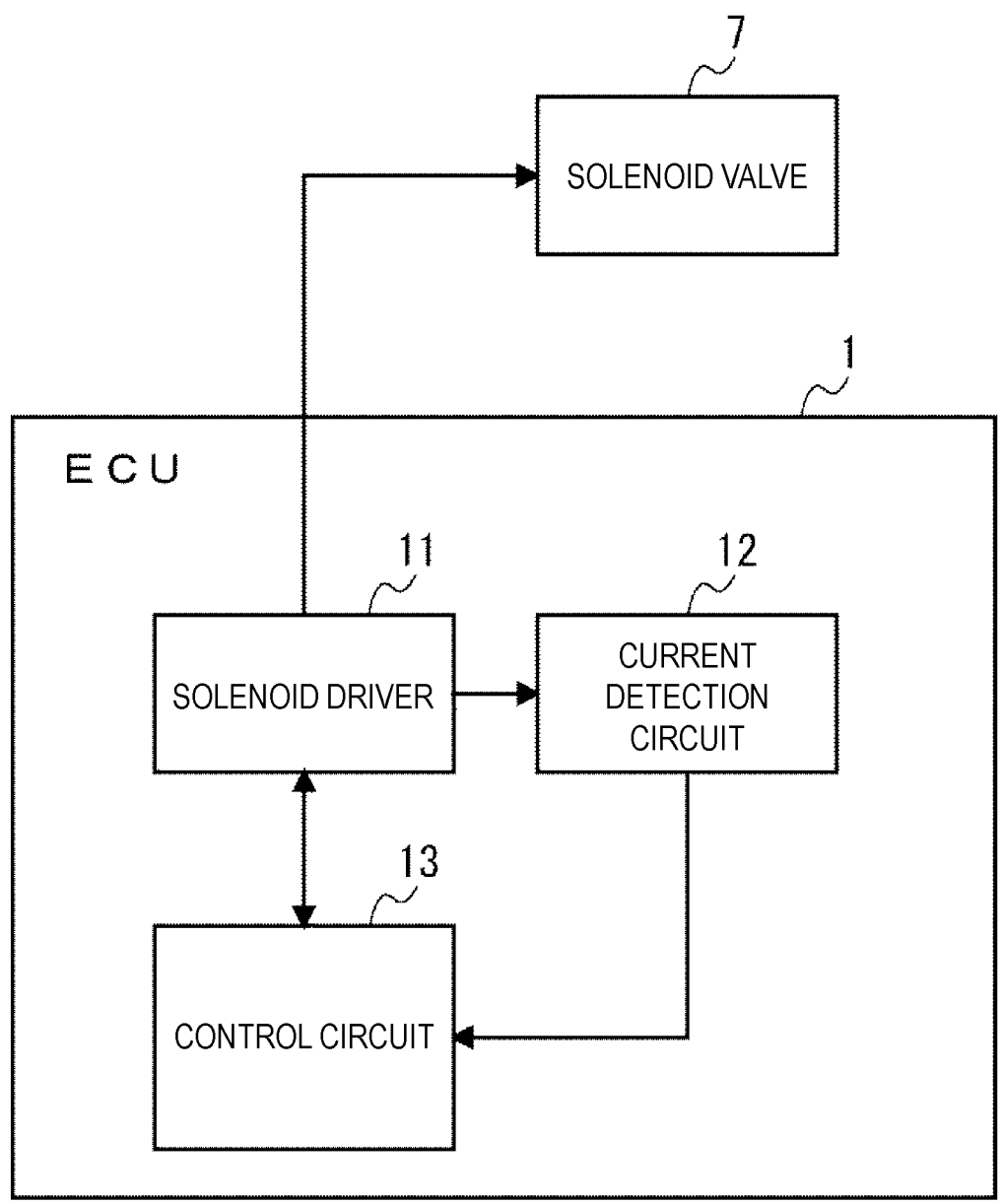
FIG. 2 is a block diagram showing an exemplary configuration of the electronic control unit shown in FIG. 1.

FIG. 2 is a block diagram showing an exemplary configuration of the electronic control unit 1. As shown in FIG. 2, the electronic control unit 1 includes a solenoid driver 11, a current detection circuit 12, and a control unit 13.

The solenoid driver 11 outputs a current to the solenoid valve 7. The current detection circuit 12 detects values of currents outputted from the solenoid driver 11. The control circuit 13 is, for example, a MCU (Micro Control Unit), and controls the output current of the solenoid driver 11 by controlling a duty ratio of a pulse signal, which is, for example, a control signal, so that the value of the output current of the solenoid driver 11 falls within a normal value based on the value of the current detected by the current detection circuit 12.

Here, the electronic control unit 1 needs to accurately open and close the clutch 3 by accurately controlling the current supplied to the solenoid valve 7. Therefore, the current detection circuit 12 is required to detect a current with high accuracy.

Figure 3:
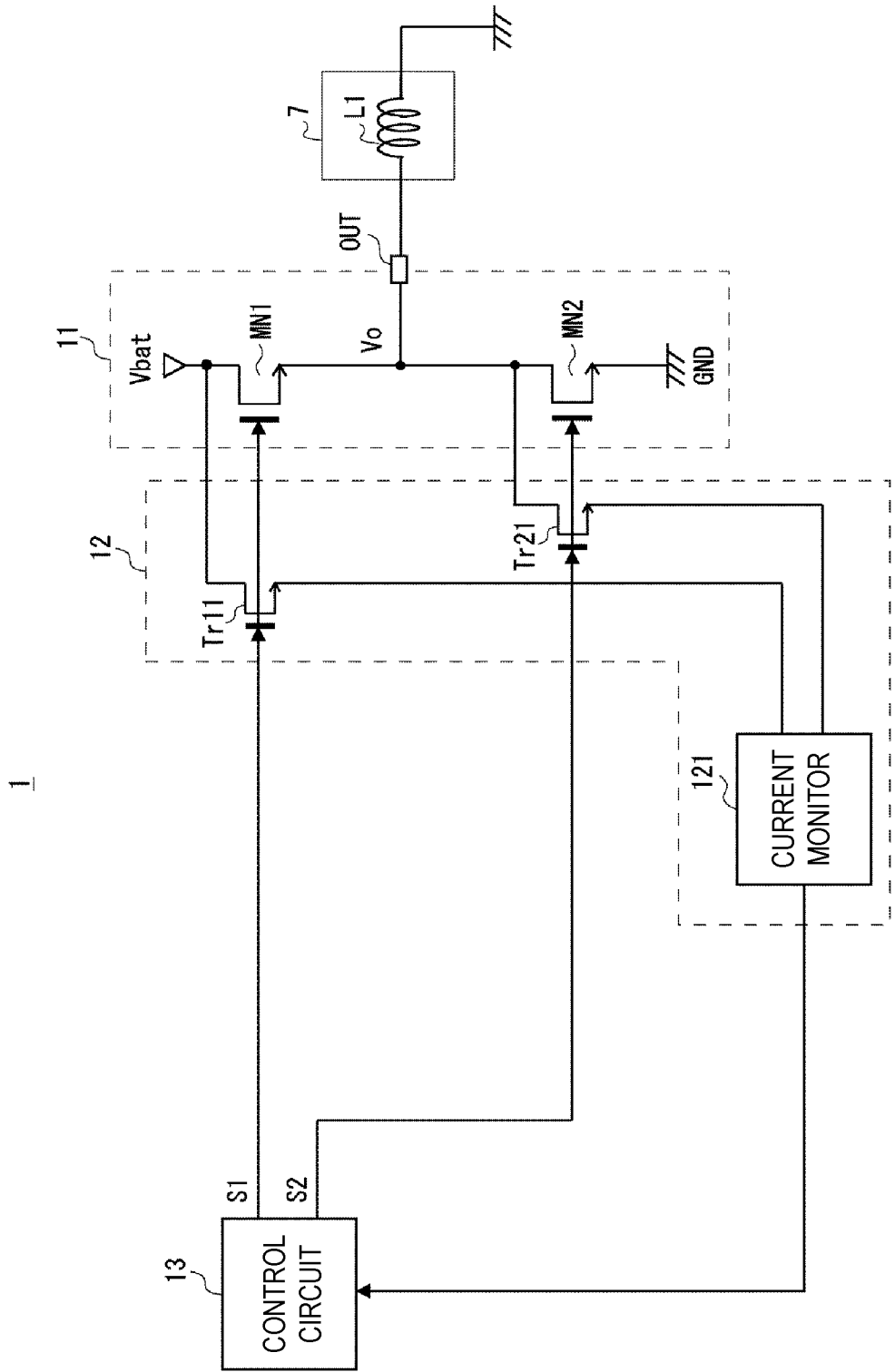
FIG. 3 is a diagram showing a specific configuration example of the electronic control unit 1 shown in FIG. 2.

FIG. 3 is a diagram showing a specific configuration of the electronic control unit 1 shown in FIG. 2. As shown in FIG. 3, in the electronic control unit 1, the solenoid driver 11 includes a drive transistor MN1 and a drive transistor MN2, and the current detection circuit 12 includes a sense transistor Tr11, a sense transistor Tr21, and a current monitor 121.

The drive transistor MN1 is, for example, an N-channel MOS transistor having a high withstand voltage, and is used as a high side driver of the solenoid driver 11. Specifically, the drive transistor MN1 is provided between a voltage supply terminal to which a battery voltage Vbat is supplied (hereinafter, referred to as voltage supply terminal Vbat) and an external output terminal OUT to which the solenoid valve 7 serving as a load is connected, and switches ON/OFF based on a pulse signal S1 serving as a control signal from a control circuit 13.

The drive transistor MN2 is, for example, an N-channel MOS transistor having a high withstand voltage, and is used as a low side driver of the solenoid driver 11. Specifically, the drive transistor MN2 is provided between an external output terminal OUT and a reference voltage terminal (hereinafter, referred to as a reference voltage terminal GND) to which a reference voltage GND such as a grounding voltage is supplied, and switches ON/OFF based on a pulse signal S2 which is a control signal from the control circuit 13.

The solenoid valve 7 has an inductor L1, and converts a current supplied from the solenoid driver 11 into an electromagnetic force. The solenoid valve 7 controls the hydraulic pressure by using the electro-magnetic force, thereby controlling the opening and closing of the clutch 3.

In the embodiment of FIG. 3, the solenoid valve 7, which is a load, is provided between the external output terminal OUT of the electronic control unit 1 and the reference voltage GND. Therefore, in the case of FIG. 3, the drive transistor MN1 as the high side driver is used for driving the solenoid valve 7, and the drive transistor MN2 as the low side driver is used as a regenerative current path of the solenoid valve 7. Hereinafter, the fact that the high side driver (drive transistor MN1) is used for driving the load (solenoid valve 7) is also referred to as a high side driving.

The solenoid valve 7 may be provided between the external output terminal OUT of the electronic control unit 1 and the voltage source of the battery voltage Vbat. In this instance, the drive transistor MN2 as the low side driver is used for driving the solenoid valve 7, and the drive transistor MN1 as the high side driver is used as the regenerative current path of the solenoid valve 7. Hereinafter, the fact that the low side driver (drive transistor MN2) is used for driving the load (solenoid valve 7) is also referred to as low side driving.

For example, first, the drive transistor MN1 is turned on and the drive transistor MN2 is turned off. As a result, a current flows from the voltage supply terminal Vbat to the inductor L1 of the solenoid valve 7 via the drive transistor MN1. At this time, current energy is stored in the inductor L1. Thereafter, the drive transistor MN1 is turned off and the drive transistor MN2 is turned on. As a result, the current flowing from the voltage supply terminal Vbat to the inductor L1 of the solenoid valve 7 through the drive transistor MN1 is cut off. The inductor L1 releases the stored current energies in an attempt to maintain the current value of the current that was flowing just before. As a result, a current flows from the reference voltage terminal GND to the inductor L1 of the solenoid valve 7 via the drive transistor MN2. This operation is repeated.

Like the drive transistor MN1, the sense transistor Tr11 is formed of an N-channel MOS transistor having a high withstand voltage. For example, the transistor size of the sense transistor Tr11 is 1/1000 times the transistor size of the drive transistor MN1.

Specifically, in the sense transistor Tr11, the drain is connected to the voltage supply terminal Vbat, the source is connected to the current monitor 121, and the pulse signal S1 is supplied to the gate. Therefore, a current proportional to the current flowing between the source and the drain of the drive transistor MN1 (i.e., 1/1000 times the current) flows between the source-drain of the sense transistor Tr11.

Like the drive transistor MN2, the sense transistor Tr21 is formed of an N-channel MOS transistor having a high withstand voltage. For example, the transistor size of the sense transistor Tr21 is 1/1000 times the transistor size of the drive transistor MN2.

Specifically, in the sense transistor Tr21, the drain is connected to the external output terminal OUT, the source is connected to the current monitor 121, and the pulse signal S2 is supplied to the gate. Therefore, a current proportional to the current flowing between the source and the drain of the drive transistor MN2 flows between the source-drain of the sense transistor Tr21 (i.e., 1/1000 times the current) flows.

The current monitor 121 monitors currents flowing through the sense transistor Tr11 and the Tr21, respectively. The result of monitoring by the current monitor 121 is outputted as a result of detecting by the current detection circuit 12.

The control circuit 13 alternately drives the drive transistor MN1 and MN2 using the pulse signals S1 and S2. Here, the control circuit 13 controls the duty ratio of the pulse signals S1 and S2 based on the result detected by the current detection circuit 12. As a result, the drive periods of the drive transistor MN1 and MN2 can be adjusted with high accuracy. As a result, for example, in a vehicle on which the electronic control unit 1 is mounted, vibration at the time of switching gears in the transmission 4 can be suppressed, so that a comfortable ride comfort with less vibration can be realized.

<<Investigation by inventors in advance>> Before the current detection circuit 12 mounted on the electronic control unit 1 described above is described in detail, first, the current detection circuit 52 which the present inventors have investigated in advance will be described.

Figure 8:
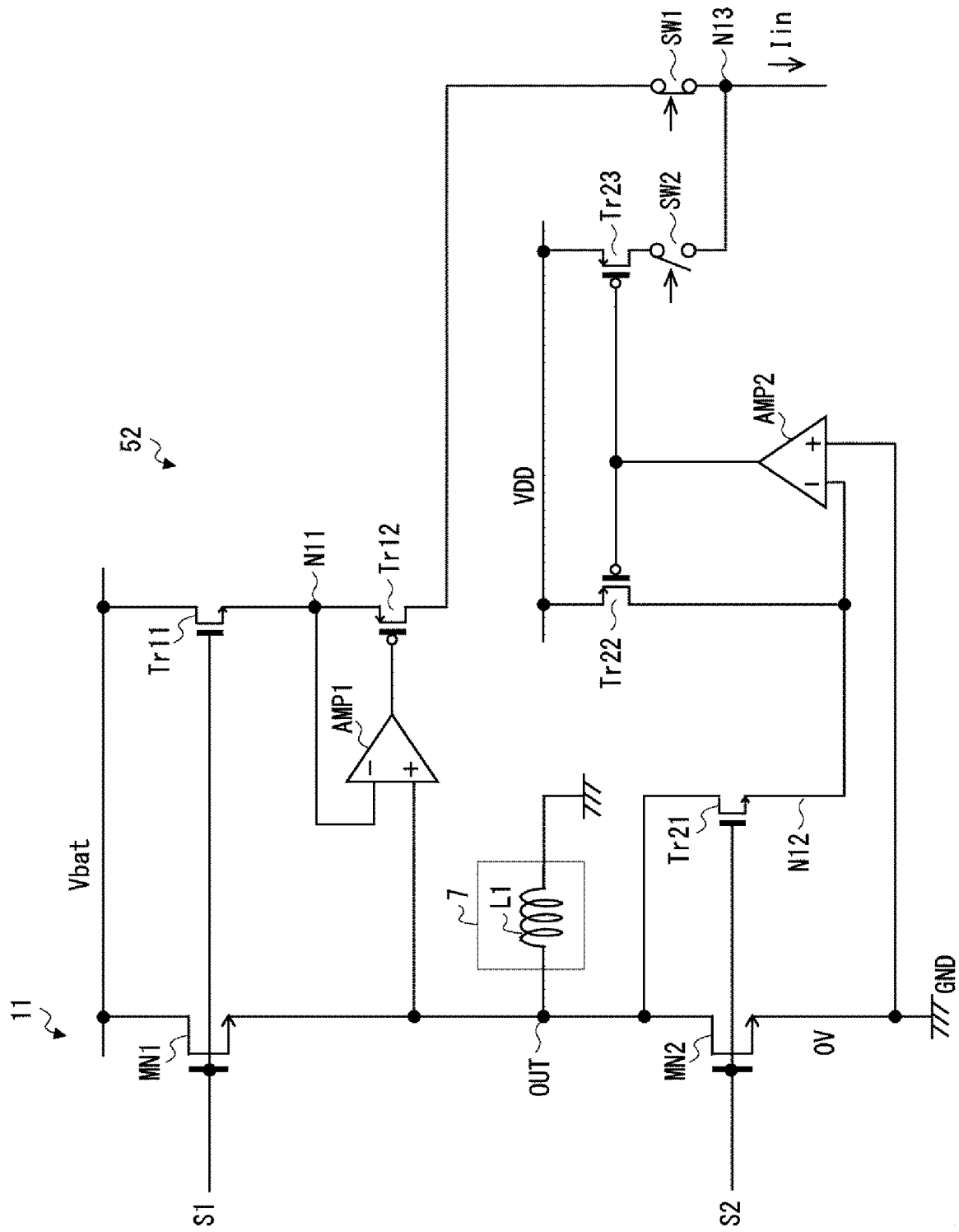
FIG. 8 is a diagram showing a specific configuration of a concept according to a current detection circuit prior to leading to the first embodiment.

<<Configuration of the current detection circuit 52>> FIG. 8 is a diagram showing a configuration example of a concept according to current detection circuit 52 prior to the first embodiment. FIG. 8 also shows the solenoid driver 11 as a driving circuit and the solenoid valve 7 as a load circuit. In FIG. 8, high side driving of the solenoid valve 7 is performed by the solenoid driver 11.

The current detection circuit 52 includes sense transistors Tr11 and Tr21, transistors (voltage control transistor) Tr12 and Tr22, a transistor (mirror transistor) Tr23, operational amplifiers AMP1 and AMP2, and switches SW1 and SW2. Among the constituent elements of the current detection circuit 52, the current monitor 121 is composed of constituent elements other than the sense transistors Tr11 and Tr21. The switches SW1 and SW2 constitute a selection circuit.

Here, a case where the transistors Tr12, Tr22, and Tr23 are P-channel MOS transistors will be described. As described above, the transistors Tr11, Tr21 are N-channel MOS transistors having a high withstand voltage, similarly to the drive transistors MN1 and MN2, respectively.

The sense transistor Tr11 is provided between the voltage supply terminal Vbat and the node N11, and switches on and off based on the pulse signal S1. The operational amplifier AMP1 amplifies the potential difference between the source voltage of the drive transistor MN1 (the voltage of the external output terminal OUT) and the source voltage of the sense transistor Tr11 (the voltage of the node N11). The transistor Tr12 is provided between the node N11 and the switch SW1, and controls a current flowing between the source and the drain based on the output voltage of the operational amplifier AMP1. As a result, the source voltage of the drive transistor MN1 and the source voltage of the sense transistor Tr11 (the voltage of the node N11) are maintained at substantially the same values. The battery voltages Vbat is supplied to the drain of the drive transistor MN1 and the sense transistor Tr11, respectively. As a result, the ratio of the current flowing through the drive transistor MN1 to the ratio of the current flowing through the sense transistor Tr11 (and the transistor Tr12) is kept constant (for example, 1000:1).

The sense transistor Tr21 is provided between the external output terminal OUT and the node N12, and switches on and off based on the pulse signal S2. The operational amplifier AMP 2 amplifies the potential difference between the source voltage (reference voltage GND) of the drive transistor MN2 and the source voltage (voltage of the node N12) of the sense transistor Tr21. The transistor Tr22 is provided between the power supply voltage terminal to which the power supply voltage VDD is supplied (hereinafter referred to as power supply voltage terminal VDD) and the node N12, and controls the current flowing between the source and the drain based on the output voltage of the operational amplifier AMP2. As a result, the source voltage of the drive transistor MN2 and the source voltage of the sense transistor Tr21 (the voltage of the node N12) are maintained at substantially the same values. Here, the voltage of the external output terminal OUT is supplied to the respective drain of the drive transistor MN2 and the sense transistor Tr21. As a result, the ratio of the current flowing through the drive transistor MN2 to the ratio of the current flowing through the sense transistor Tr21 (and the transistor Tr22) is kept constant (for example, 1000:1).

The transistor Tr23 is provided between the power supply voltage terminal VDD and the switch SW2, and controls the current flowing between the source and the drain based on the output voltage of the operational amplifier AMP2 together with the transistor Tr22. In this embodiment, the same current as the current flowing through the transistor Tr22 flows through the transistor Tr23. That is, the transistor Tr23 mirrors the current flowing through the transistor Tr22 and outputs the mirrored current.

The switches SW 1 and SW2 constitute a selection circuit, and selectively outputs a current flowing in the sense transistor Tr11 and a current flowing in the sense transistor Tr21 (more detail, a current obtained by mirroring a current flowing in the sense transistor Tr21) as a detection current Iin of the current detection circuit 52. The switches SW1 and SW2 switch on and off complementarily to each other in accordance with switching on and off of the drive transistor MN1 and MN2, respectively.

Figure 9:
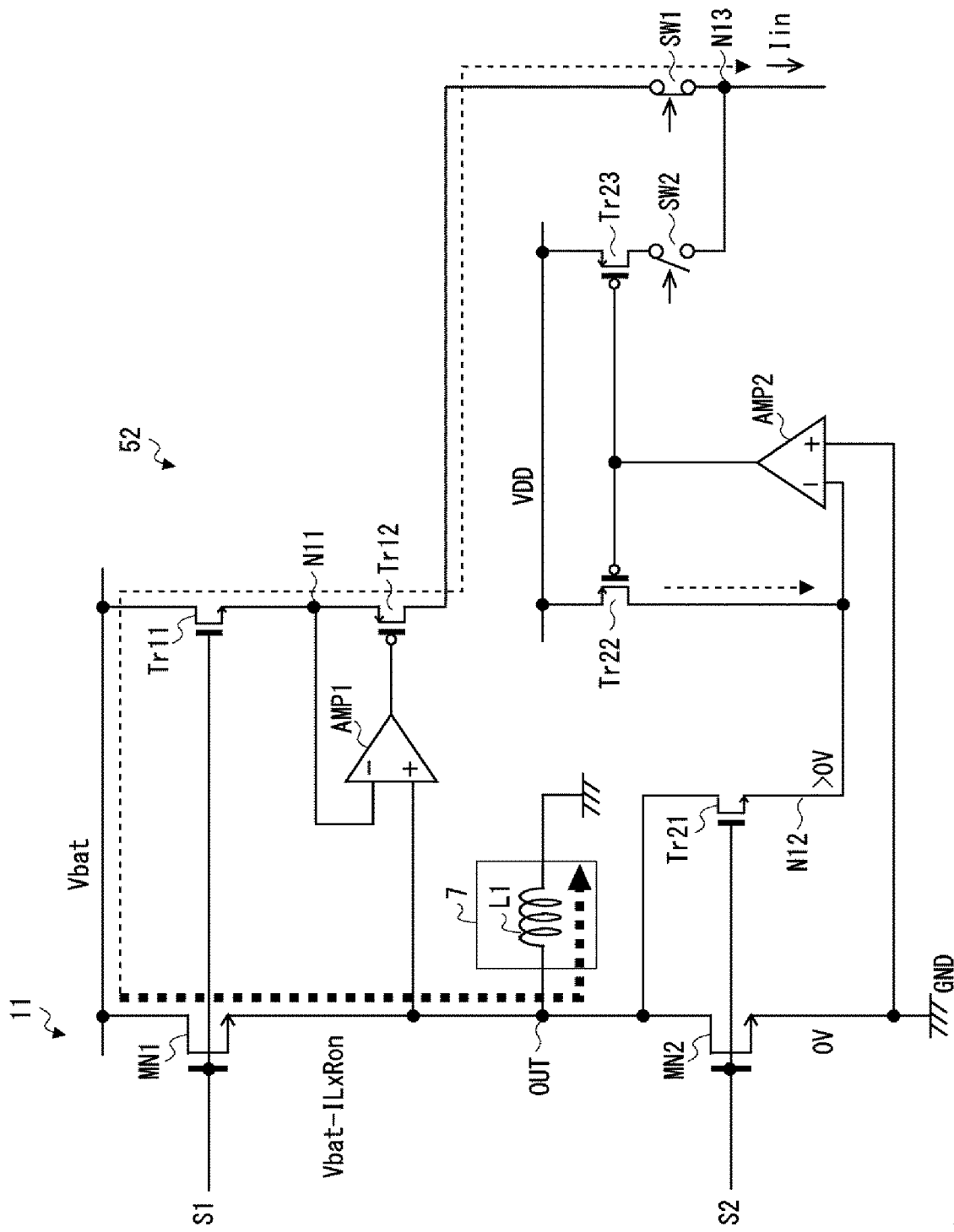

FIG. 9 is a diagram for explaining a current flow of the current detection circuit 52 when the drive transistor MN1, which is a high side driver, is turned on. As shown in FIG. 9, when the drive transistor MN1 is turned on and the drive transistor MN2 is turned off, the switch SW1 is turned on and the switch SW2 is turned off. As a result, the current flowing through the transistor Tr11, Tr12 in proportion to the current flowing through the drive transistor MN1 is outputted as the detection current Iin of the current detection circuit 52 through the switch SW1.

Figure 10:
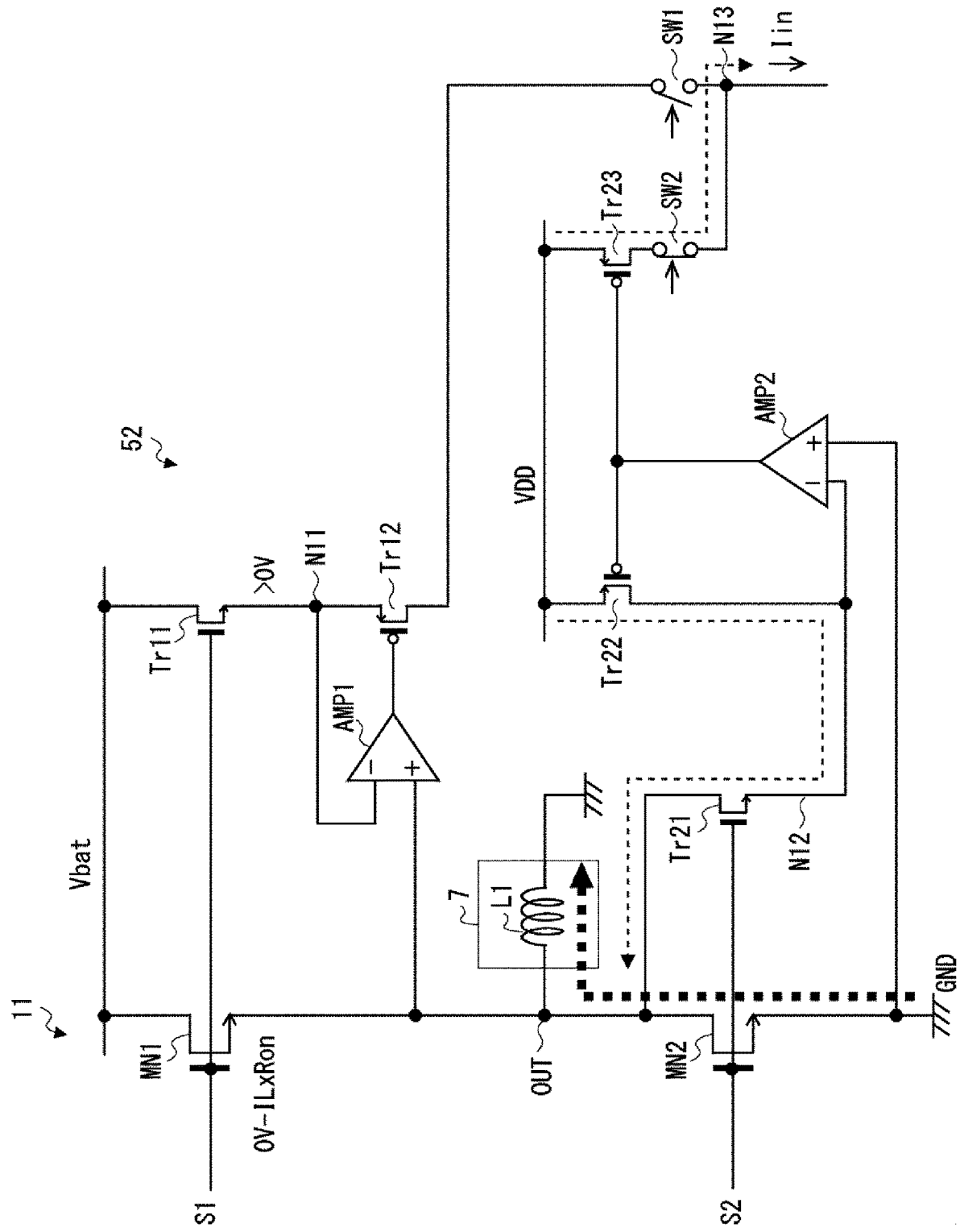

FIG. 10 is a diagram for explaining a current flow of the current detection circuit 52 when the drive transistor MN2, which is a low side driver, is turned on. As shown in FIG. 10, when the drive transistor MN1 is turned off and the drive transistor MN2 is turned on, the switch SW1 is turned off and the switch SW2 is turned on. As a result, the current flowing in the transistors Tr21 and Tr22 in proportion to the current flowing in the drive transistor MN2 is mirrored by the transistor Tr23 and outputted as the detection current Iin of the current detection circuit 52 via the switch SW2.

However, in the configuration of the current detection circuit 52, since the source-drain voltage of the drive transistor MN2 of the off state and the source-drain voltage of the sense transistor Tr21 of the off state are different, the degree of deterioration of each of the drive transistor MN2 and the sense transistor Tr21 caused by the leakage current is different. As a result, in the configuration of the current detection circuit 52, the ratio of the currents flowing through the drive transistor MN2 and the sense transistor Tr21 of the on state varies from a constant value (for example, 1000:1), and therefore, the current flowing through the drive transistor MN2 cannot be accurately detected. Similarly, in the configuration of the current detection circuit 52, since the ratio of the currents flowing through the drive transistor MN1 and the sense transistor Tr11 of the on state varies from a constant value (for example, 1000:1), the ratio of the currents flowing through the drive transistor MN1 cannot be accurately detected. Hereafter, a concrete description on this problem will be given.

Figure 11:
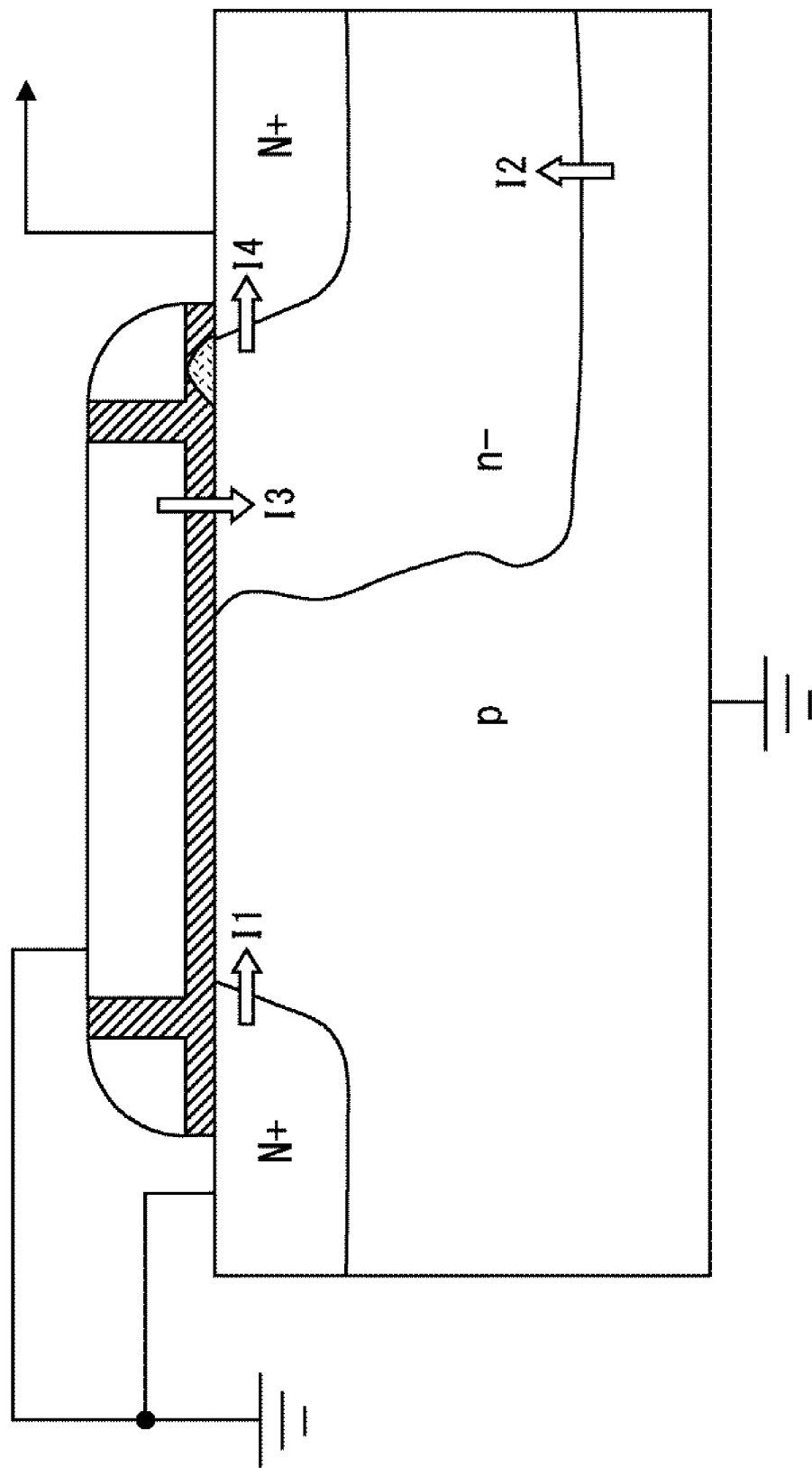
FIG. 11 is a schematic cross-sectional view of a transistor for explaining a deterioration of a transistor caused by a leakage current.

FIG. 11 is a schematic cross-sectional view of a transistor for explaining deterioration of the transistor caused by a leakage current. FIG. 11 shows a schematic cross-sectional view of the N-channel MOS transistor.

As shown in FIG. 11, four leakage currents are mainly generated in the N-channel MOS transistor of the off state. First, a first leakage current I1 is generated from one N-type diffused region constituting the source electrode to a P-well. A second leakage current I2 is generated from the P-well to the N-region formed on the other N-type diffused region forming the drain electrode. A third leakage current I3 is generated from the gate electrode through a gate oxide film to the N-region. A fourth leakage current I4 is generated from the N-region to the other N-type diffused region constituting the drain electrodes.

Here, the fourth leakage current I4 is accelerated by a strong electric field between the drain and source, thereby generating hot carriers. The hot carriers are trapped at the interface between the N-region and the gate oxide film. As a result, an on-resistance of the N-channel MOS transistor increases. That is, the characteristics of the N-channel MOS transistor are deteriorated. Such property degradation is also referred to as an Off-State Degradation, for example.

Figure 12:
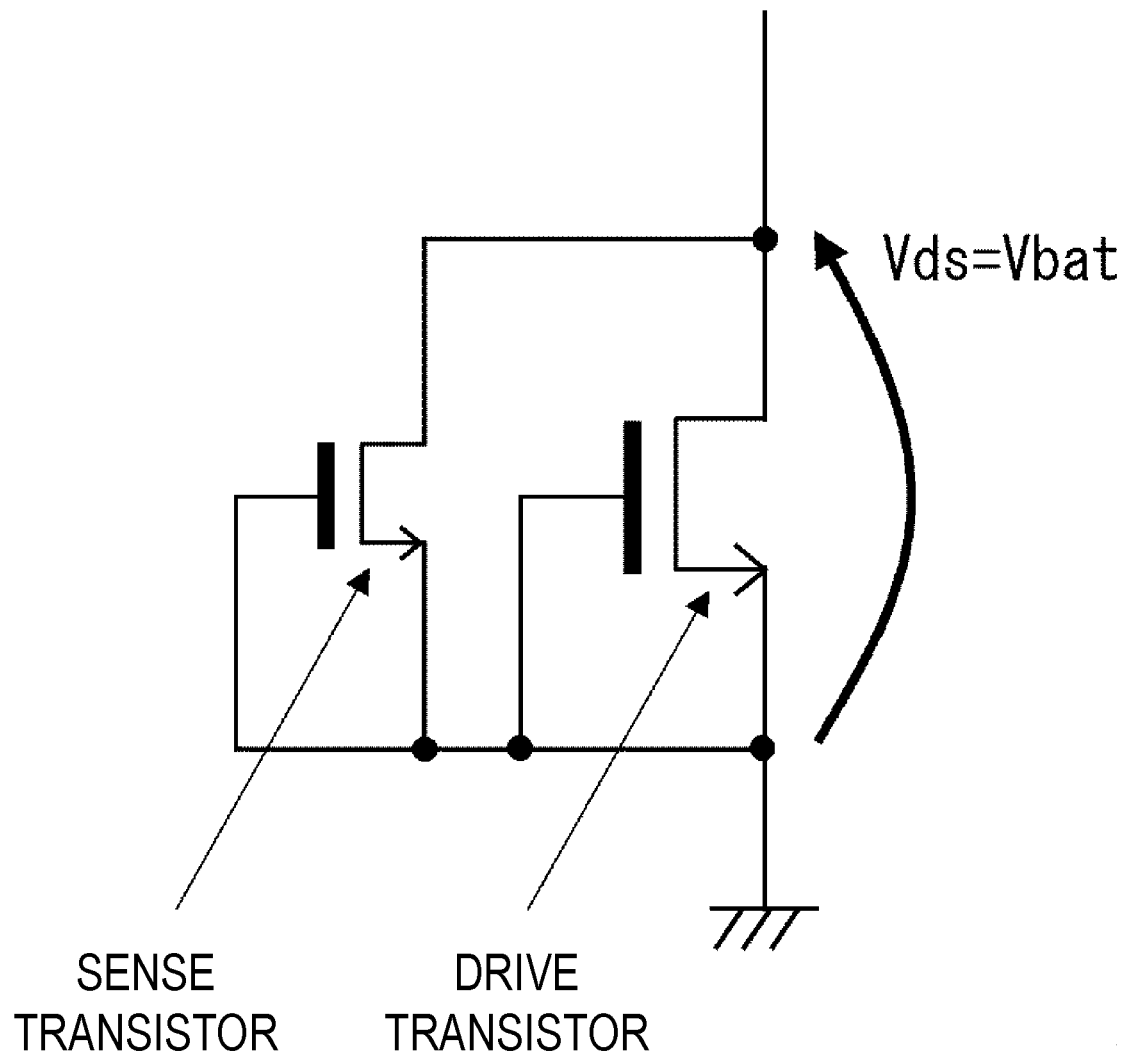
FIG. 12 is a diagram showing a configuration example of a drive transistor and a sense transistor in which a gain degradation does not occur even when an Off-State Degradation occurs.
Figure 13:
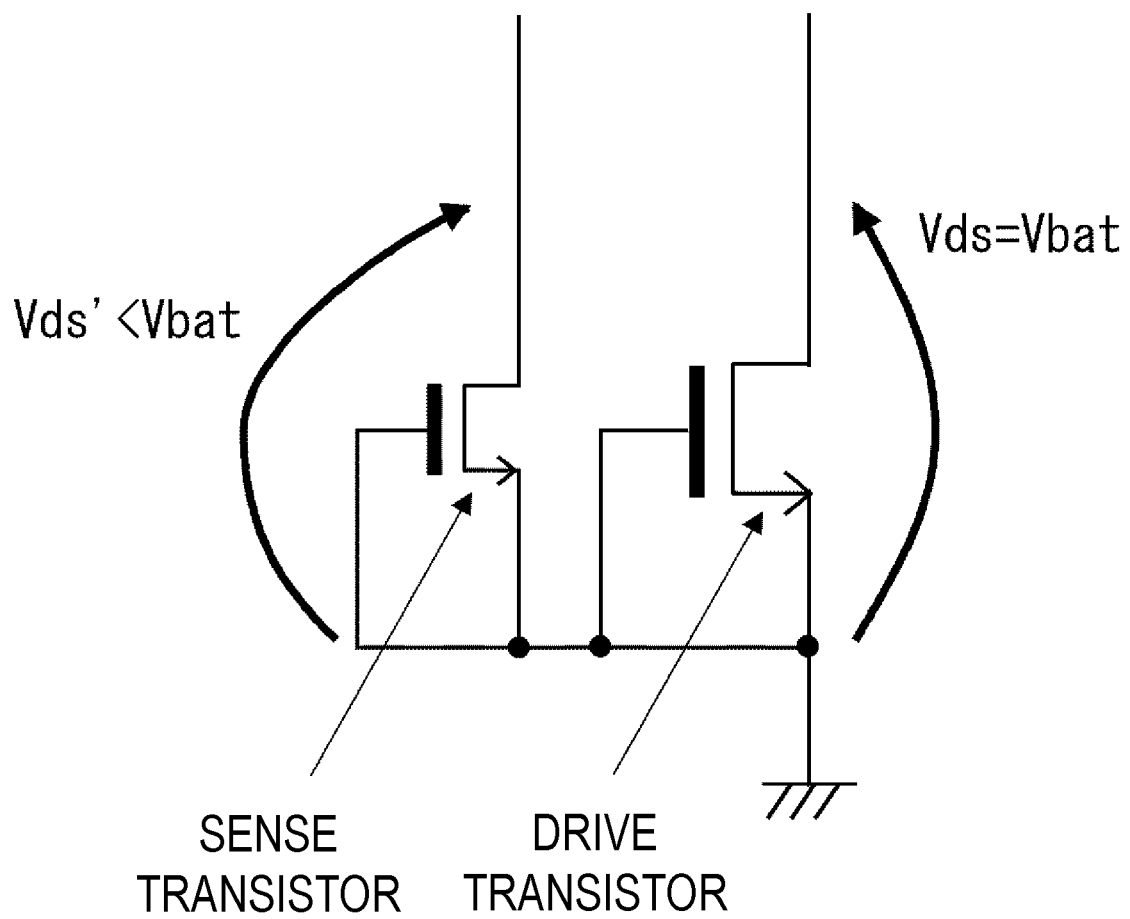
FIG. 13 is a diagram showing a configuration example of a drive transistor and a sense transistor in which a gain degradation occurs when an Off-State Degradation occurs.
Figure 14:
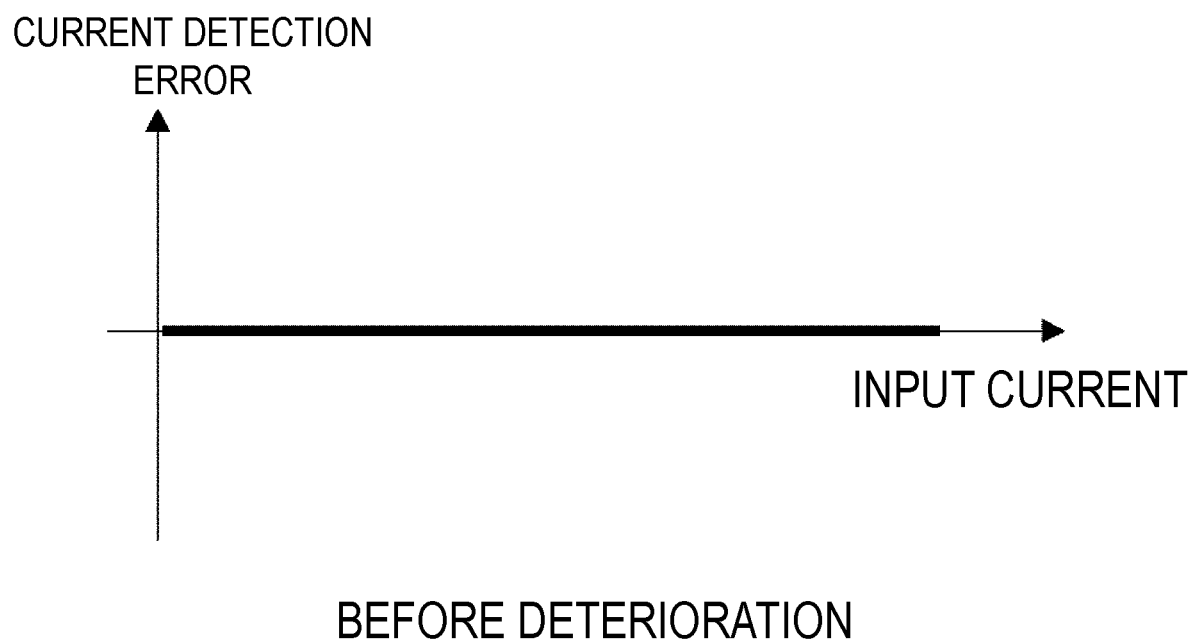
FIG. 14 is a diagram showing an input current and a current detection error of the configuration example shown in FIG. 12.
Figure 15:
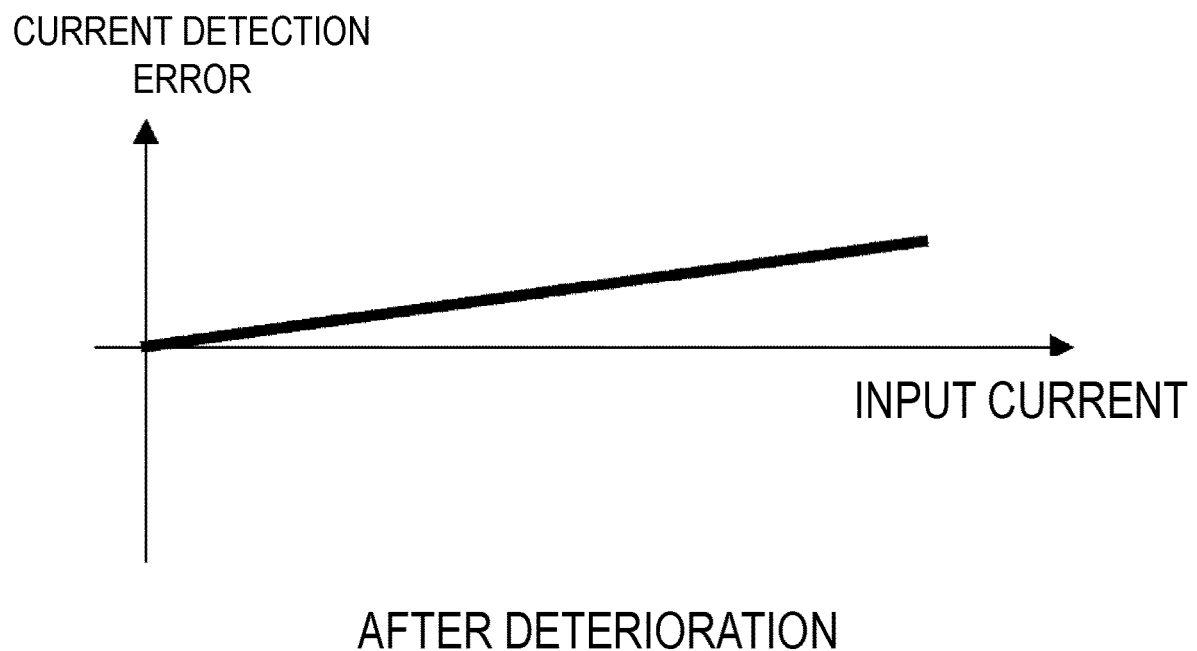
FIG. 15 is a diagram showing an input current and a current detection error of the configuration example shown in FIG. 13.

FIG. 12 is a diagram showing an exemplary configuration of a drive transistor and a sense transistor in which a gain degradation does not occur even when the Off-State Degradation occurs. FIG. 13 is a diagram showing an exemplary configuration of a drive transistor and a sense transistor in which the gain degradation occurs when the Off-State Degradation occurs. FIG. 14 is a diagram showing relationships between an input current and a current detection error in the exemplary configuration shown in FIG. 12. FIG. 15 is a diagram showing relationships between the input current and the current detection error in the exemplary configuration shown in FIG. 13.

First, in the configuration of FIG. 12, each source-drain voltage of the drive transistor and the sense transistor of the off state has the same values. As a result, when Off-State Deterioration occurs, the degree of degradation of each of the drive transistor and the sense transistor becomes the same, so that the ratio of the current flowing through each of the drive transistor and the sense transistor of the on state is maintained at a constant value (for example, 1000:1) (see FIG. 14). As a result, in the configuration of FIG. 12, the current flowing through the drive transistor can be detected with high accuracy.

On the other hand, in the configuration of FIG. 13, the source-drain voltage of each of the drive transistor and the sense transistor of the off state differs. As a result, when the Off-State Deterioration occurs, the degrees of degradation of the drive transistor and the sense transistor are different from each other, so that the ratio of the current flowing through each of the drive transistor and the sense transistor of the on state are changed from constant values (as shown in FIG. 15). As a result, in the configuration of FIG. 13, the current flowing through the drive transistor cannot be accurately detected.

Here, in the configuration of the current detection circuit 52, when the drive transistor MN2 is turned off, the sense transistor Tr21 is turned off and the current flowing through the transistor Tr22 is reduced to the vicinity of the 0 A, so that the gain of the loop composed of the transistor Tr22 and the operational amplifier AMP2 is reduced and the feedback by the loop becomes ineffective. As a result, the transistor Tr22 is not completely turned off, so that the source voltage of the sense transistor Tr21 of the off state is higher than the voltage 0V. That is, the source-drain voltage of the drive transistor MN2 of the off state and the source-drain voltage of the sense transistor Tr21 of the off state differ from each other.

In the configuration of the current detection circuit 52, when the drive transistor MN1 is turned off, the feedback loop composed of the transistor Tr12 and the feedback loop composed of the operational amplifier AMP1 do not operate before the source voltage of the sense transistor Tr11 drops to a voltage near 0V. Therefore, the source voltage of the sense transistor Tr11 of the off state is higher than the voltage 0V. That is, the source-drain voltage of the drive transistor MN1 of the off state and the source-drain voltage of the sense transistor Tr11 of the off state differ from each other.

Therefore, in the configuration of the current detection circuit 52, the currents flowing through the drive transistor MN1 and MN2 cannot be accurately detected using the sense transistor Tr11 and Tr21.

Therefore, the inventors of the present invention have found a current detection circuit, semiconductor device and a semiconductor system capable of accuracy detecting currents flowing through the drive transistor MN1 and MN2 even when the Off-State Degradation occurs.

Figure 4:
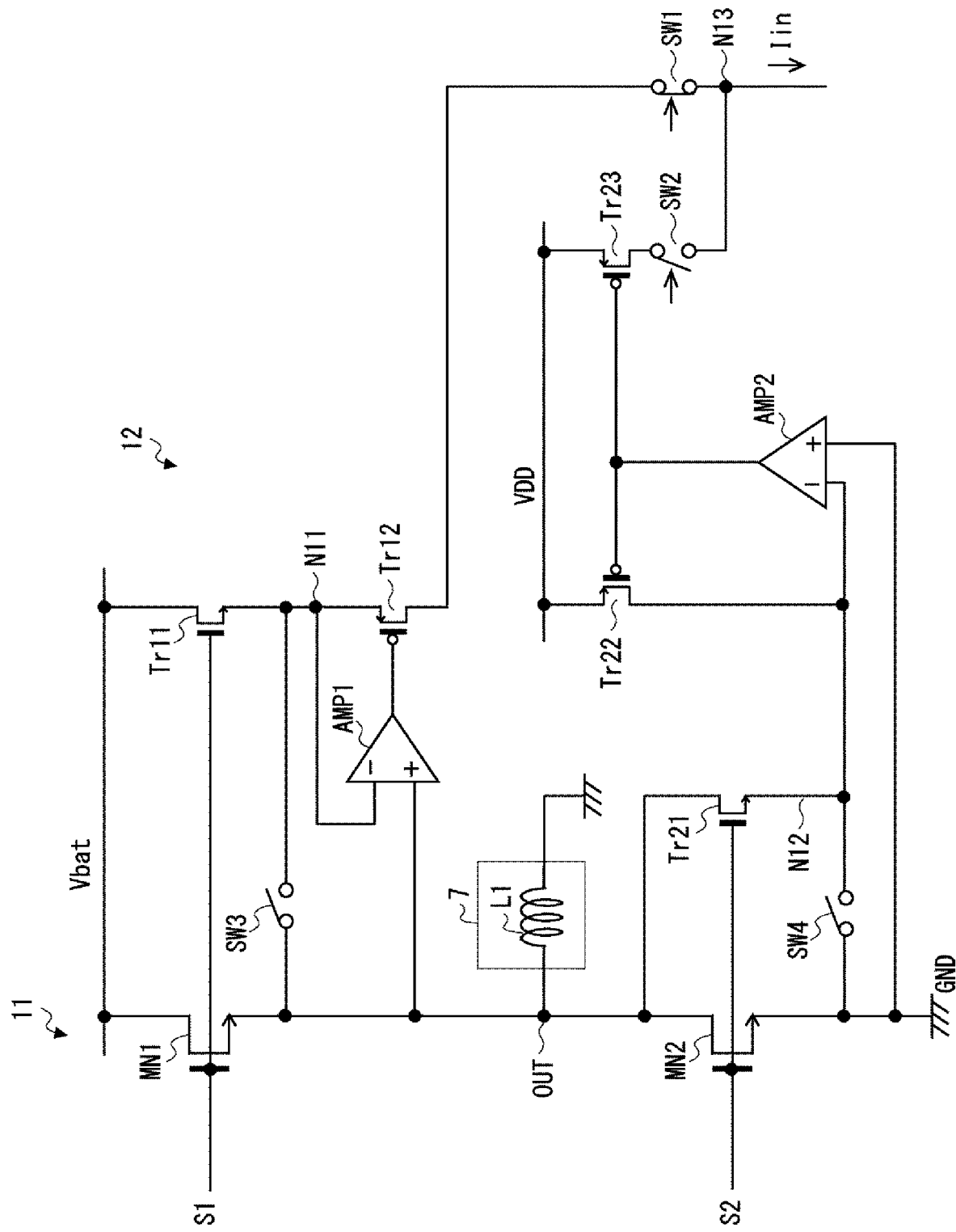
FIG. 4 is a diagram showing a specific configuration example of a current detection circuit according to the first embodiment.

<<Exemplary configuration of the current detection circuit 12 according to the first embodiment>> FIG. 4 is a diagram showing an exemplary configuration of the current detection circuit 12 according to the first embodiment. FIG. 4 also shows the solenoid driver 11 as a driving circuit and the solenoid valve 7 as a load circuit. In FIG. 4, a high side driving of the solenoid valve 7 is performed by the solenoid driver 11.

As shown in FIG. 4, the current detection circuit 12 further includes switch SW3 and SW4 as compared with the current detection circuit 52. The switch SW3 is provided between the source (external output terminal OUT) of the drive transistor MN1 and the source (node N11) of the sense transistor Tr11. The switch SW4 is provided between the source (reference voltage terminal GND) of the drive transistor MN2 and the source (node N12) of the sense transistor Tr21. The switches SW3 and SW4 are complementarily switched on and off in accordance with the switching of the on and off states of the drive transistors MN1 and MN2, respectively.

Since the rest of the configuration of the current detection circuit 12 is the same as that of the current detection circuit 52, its explanation is omitted.

Figure 5:
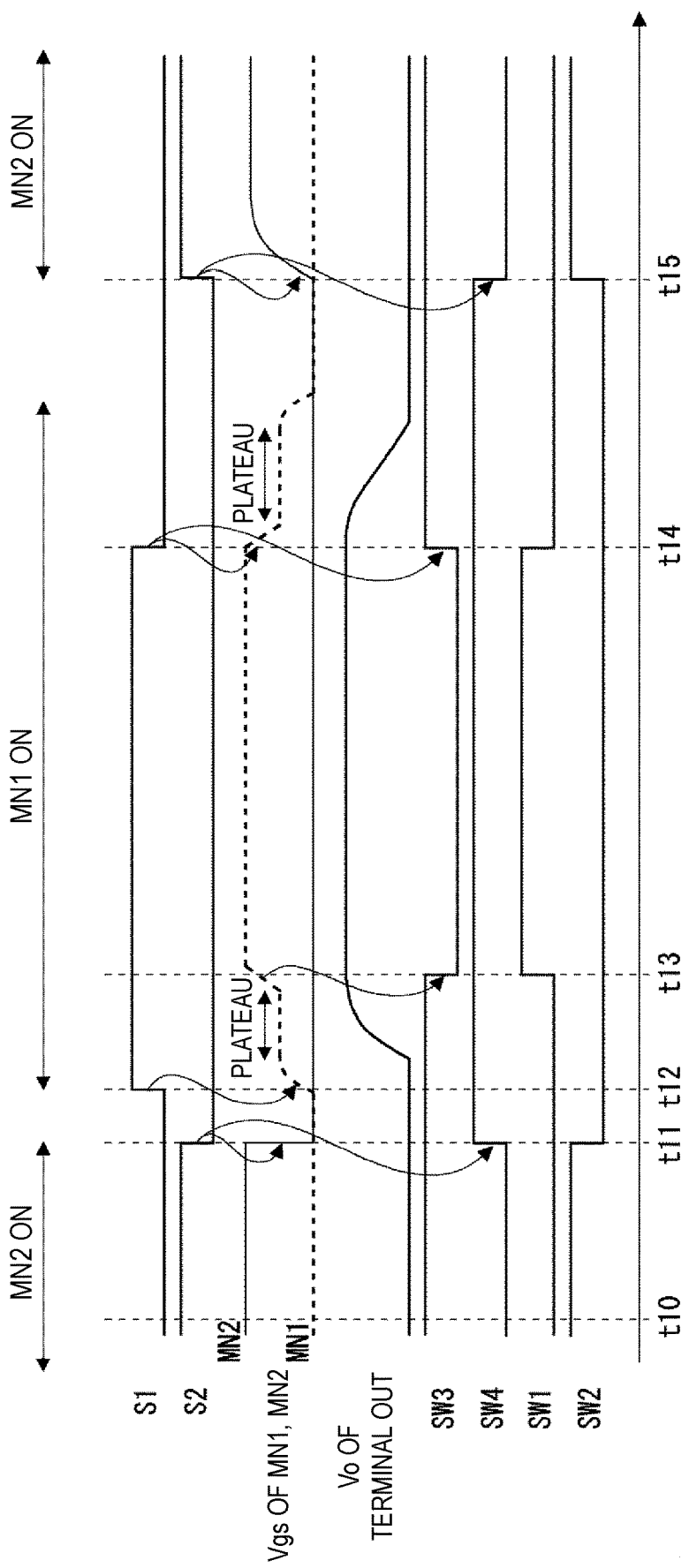
FIG. 5 is a timing chart showing an operation of the current detection circuit shown in FIG. 4

<<Timing chart>> FIG. 5 is a timing chart showing the operation of the current detection circuit 12. In FIG. 5, first, since the pulse signal S1 indicates an L level and the pulse signal S2 indicates an H level, the drive transistor MN1 is turned off and the drive transistor MN2 is turned on. As a result, the regenerative current of the solenoid valve 7 flows through the current path through the drive transistor MN2 of the on state (time t10 to t11).

At this time, in order to detect the current flowing through the drive transistor MN2 of the on state, the switch SW4 is controlled to be turned off. On the other hand, in order to short-circuit the source of each of the drive transistor MN1 and the sense transistor Tr11 of the off state, the switch SW3 is controlled to be on. The switch SW1 is controlled to be off, and the switch SW2 is controlled to be on.

Thereafter, when the pulse signal S2 is switched from the H level to the L level, the drive transistor MN2 is switched from the on state to the off state in response to the pulse signal S2 (time t11). At this time, in order to short-circuit the source of each of the drive transistor MN2 and the sense transistor Tr21 which are turned off state, the switch SW4 is switched from off to on (time t11). The switch SW2 is switched from on to off (time t11).

Thereafter, when the pulse signal S1 is switched from the L level to the H level, the gate-source voltage Vgs of the drive transistor MN1 starts to rise (time t12). When the gate-source voltage Vgs of the drive transistor MN1 reaches a threshold voltage, a current flows through the drive transistor MN1, so that the voltage Vo of the external output terminal OUT starts to rise. Since the current flowing through the drive transistor MN1 is constant while the voltage Vo is rising, the gate-source voltage Vgs of the drive transistor MN1 is substantially constant. The gate-source voltage Vgs during this time is called a plateau voltage. Here, until the voltage Vo reaches the battery voltage Vbat, the source of each of the drive transistor MN1 and the sense transistor Tr11, which are not fully turned on, needs to be short-circuited, so that the switch SW3 is kept on.

Thereafter, when the voltage Vo reaches the battery voltage Vbat and the gate-source voltage Vgs of the drive transistor MN1 becomes higher than the plateau voltage, the switch SW3 is switched from on to off (time t13). As a result, the short-circuiting of the source of each of the drive transistor MN1 and the sense transistor Tr11, which are turned on state, is released. The switch SW1 is switched from off to on (time t13).

Thereafter, when the pulse signal S1 is switched from the H level to the L level, the gate-source voltage Vgs of the drive transistor MN1 starts to decrease (time t14). Accordingly, the voltage Vo starts to decrease. At this time, in order to short-circuit the source of each of the drive transistor MN1 and the sense transistor Tr11 which are turned off state, the switch SW3 is switched from off to on (time t14). The switch SW1 is switched from on to off (time t14).

Thereafter, when the pulse signal S2 is switched from the L level to the H level, the drive transistor MN2 is switched from the off state to the on state in response to the pulse signal S2 (time t15). At this time, the switch SW4 is switched from on to off (time t15). As a result, the short-circuiting of the source of each of the drive transistor MN2 and the sense transistor Tr21, which are turned on state, is released. The switch SW2 is switched from off to on (time t15).

Next, with reference to FIGS. 6 and 7, a flow of the current of the current detection circuit 12 and the switching states of the switch SW3 and SW4 in the respective operation mode will be described in more detail.

Figure 6:
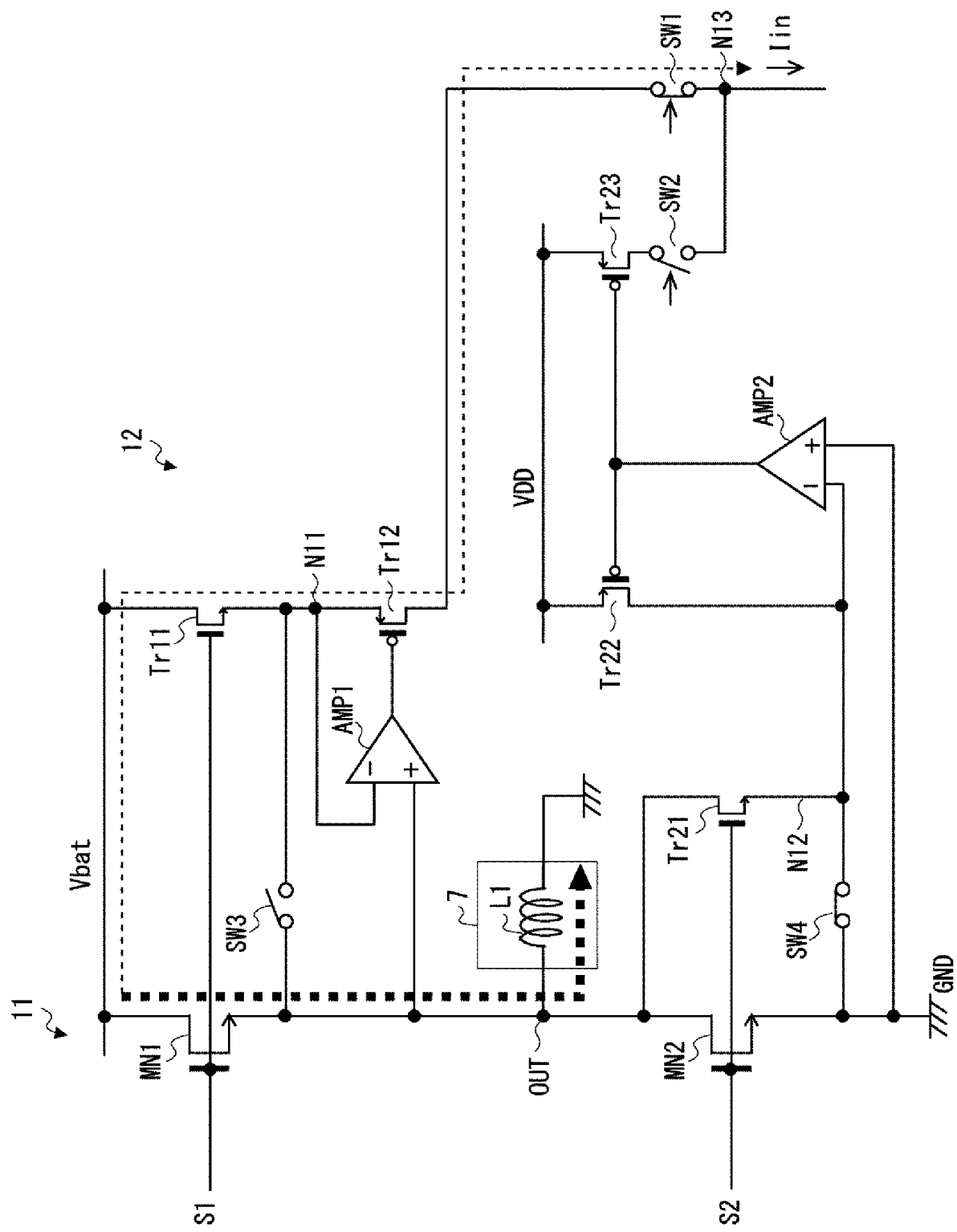

FIG. 6 is a diagram for explaining a current flow of the current detection circuit 12 when the drive transistor MN1, which is a high side driver, is turned on.

As shown in FIG. 6, when the drive transistor MN1 is turned on and the drive transistor MN2 is turned off, the switch SW1 is turned on and the switch SW2 is turned off.

As a result, the current flowing through the transistor Tr11, Tr12 in proportion to the current flowing through the drive transistor MN1 is outputted as the detection current Iin of the current detection circuit 12 through the switch SW1.

At this time, the switch SW3 is turned off and the switch SW4 is turned on. As a result, the source of each of the drive transistor MN2 and the sense transistor Tr21 of the off state is short-circuited. Here, the voltage of the external output terminal OUT is supplied to the drain of each of the drive transistor MN2 and the sense transistor Tr21. Therefore, the source-drain voltage of each of the drive transistor MN2 and the sense transistor Tr21 of the off state exhibits the same value. As a result, when the Off-State Deterioration occurs, the degree of degradation of each of the drive transistor MN2 and the sense transistor Tr21 becomes the same, so that the ratio of the currents flowing through each of the drive transistor MN2 and the sense transistor Tr21 of the on state is maintained at a constant value (for example, 1000:1). Therefore, the current detection circuit 12 can accurately detect the current flowing through the drive transistor MN2 by using the sense transistor Tr21.

Figure 7:
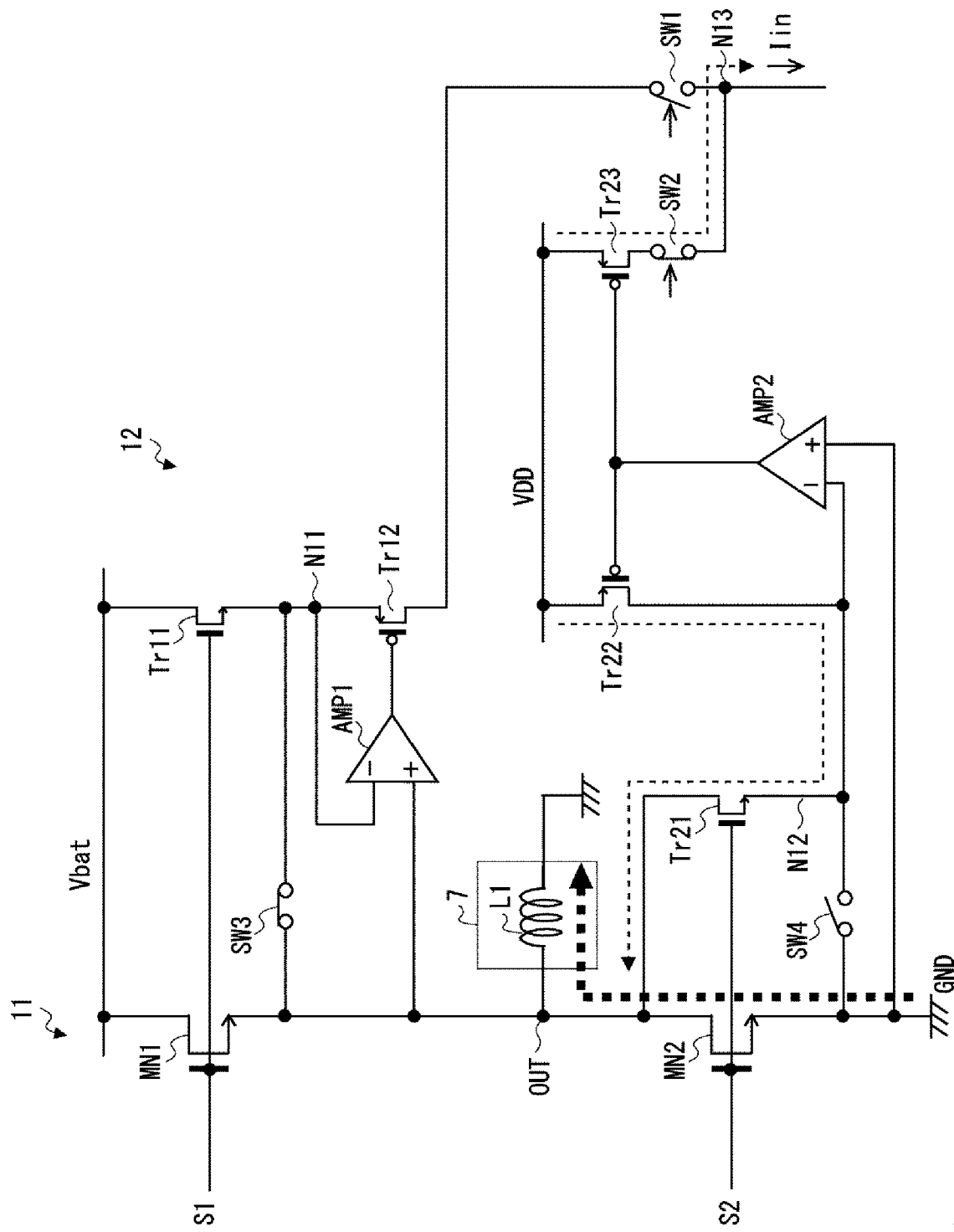

FIG. 7 is a diagram for explaining a current flow of the current detection circuit 12 when the drive transistor MN2, which is a low side driver, is turned on.

As shown in FIG. 7, when the drive transistor MN1 is turned off and the drive transistor MN2 is turned on, the switch SW1 is turned off and the switch SW2 is turned on. As a result, the current flowing in the transistor Tr21,Tr22 in proportion to the current flowing in the drive transistor MN2 is mirrored by the transistor Tr23 and outputted as the detection current Iin of the current detection circuit 12 via the switch SW2.

At this time, the switch SW3 is turned on and the switch SW4 is turned off. As a result, the sources of each of the drive transistor MN1 and the sense transistor Tr11 of the off state are short-circuited. The battery voltage Vbat is supplied to the drain of the drive transistor MN1 and the sense transistor Tr11, respectively. Therefore, the source-drain voltage of each of the drive transistor MN1 and the sense transistor Tr11 of the off state exhibits the same value. As a result, when the Off-State Deterioration occurs, the degree of degradation of each of the drive transistor MN1 and the sense transistor Tr11 becomes the same, so that the ratio of the currents flowing through each of the drive transistor MN1 and the sense transistor Tr11 of the on state is maintained at a constant value (for example, 1000:1). Therefore, the current detection circuit 12 can accurately detect the current flowing through the drive transistor MN1 using the sense transistor Tr11.

For example, when the operation of the solenoid driver 11 is stopped, the drive transistor MN1 and the MN2 are both turned off, so that the switch SW3 and the SW4 are both turned on. In this case, even when Off-State Degradation occurs, the degrees of deterioration of the drive transistor MN1 and the sense transistor Tr11 are the same, and the degrees of deterioration of the drive transistor MN2 and the sense transistor Tr21 are the same. Therefore, the current detection circuit 12 can suppress the deterioration of the detecting accuracy of the currents flowing through the drive transistor MN1 and MN2.

As described above, the current detection circuit 12 according to the present embodiment includes the switch SW3 for short-circuiting the source of each of the drive transistor MN1 and the sense transistor Tr11 of the off state, and the switch SW4 for shorting the source of each of the drive transistor MN2 and the sense transistor Tr21 of the off state. As a result, when the Off-State Deterioration occurs, the degrees of degradation of the drive transistor MN1 and the sense transistor Tr11 become the same, so that the ratio of the currents flowing through the drive transistor MN1 and the sense transistor Tr11 of the on state is maintained at a constant value. Similarly, when the Off-State Deterioration occurs, the degree of degradation of each of the drive transistor MN2 and the sense transistor Tr21 becomes the same, so that the ratio of the currents flowing through each of the drive transistor MN2 and the sense transistor Tr21 of the on state is maintained at a constant value. Therefore, the current detection circuit 12 applied to the present embodiment can accurately detect the current flowing in the drive transistor MN1 and MN2 by using the sense transistor Tr11 and Tr21.

In the present embodiment, the current detection circuit 12 detects currents flowing through the drive transistor MN1 and the MN2, but the present invention is not limited thereto. The current detection circuit 12 can be appropriately changed to a configuration for detecting only a current flowing in one of the drive transistors MN1 and the MN2.

Second Embodiment

Figure 16:
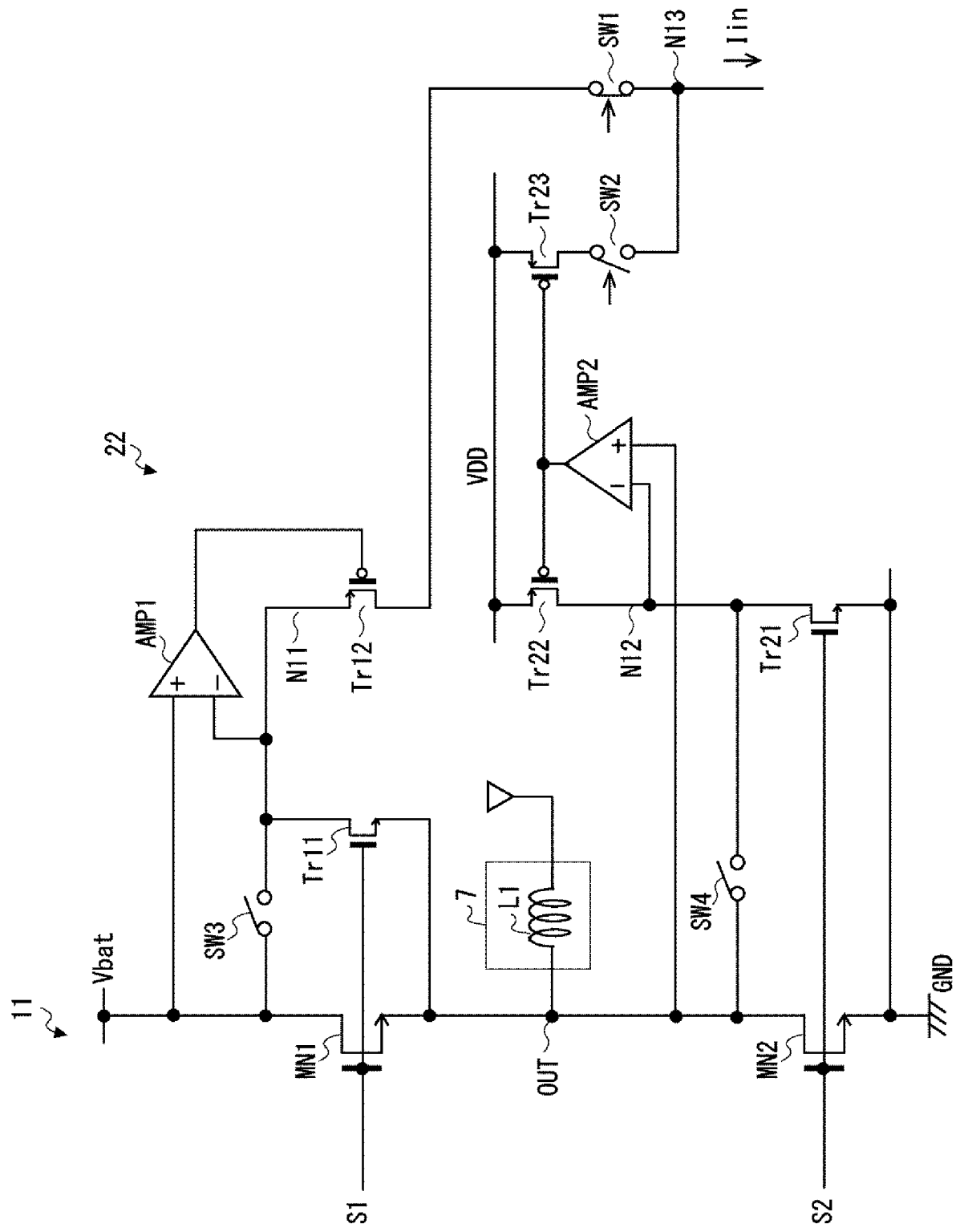
FIG. 16 is a diagram showing a specific configuration example of a current detection circuit according to the second embodiment.

FIG. 16 is a diagram showing an exemplary configuration of the current detection circuit 22 according to the second embodiment. FIG. 16 also shows the solenoid driver 11 as a driving circuit and the solenoid valve 7 as a load circuit. In FIG. 16, the solenoid driver 11 performs the low side driving of the solenoid valve 7.

As shown in FIG. 16, like the current detection circuit 12, the current detection circuit 22 includes sense transistors Tr11, Tr21, transistors (voltage control transistor) Tr12, Tr22, a transistor (mirror transistor) Tr23, operational amplifiers AMP1 and AMP2, and switches SW1 to SW4. However, the current detection circuit 22 and the current detection circuit 12 differ from each other in the connecting relation of the circuits. Hereafter, a concrete description will be given.

The sense transistor Tr11 is provided between the external output terminal OUT and the node N11, and switches on/off based on the pulse signal S1. The operational amplifier AMP1 amplifies a potential difference between the drain voltage (battery voltage Vbat) of the drive transistor MN1 and the drain voltage (voltage of the node N11) of the sense transistor Tr11. The transistor Tr12 is provided between the node N11 and the switch SW1, and controls a current flowing between the source and the drain based on the output voltage of the operational amplifier AMP1. As a result, the drain voltage of the drive transistor MN1 and the drain voltage of the sense transistor Tr11 (the voltage of the node N11) are maintained at substantially the same value. Here, the voltage of the external output terminal OUT is supplied to the sources of each of the drive transistor MN1 and the sense transistor Tr11. Therefore, the ratio of the current flowing through the drive transistor MN1 to the ratio of the current flowing through the sense transistor Tr11 (and the transistor Tr12) is kept constant (for example, 1000:1).

The sense transistor Tr21 is provided between the reference voltage terminal GND and the node N12, and switches on and off based on the pulse signal S2. The operational amplifier AMP 2 amplifies the potential difference between the drain voltage of the drive transistor MN2 (the voltage of the external output terminal OUT) and the drain voltage of the sense transistor Tr21 (the voltage of the node N12). The transistor Tr22 is provided between the power supply voltage terminal VDD and the node N12, and controls the current flowing between the source and the drain based on the output voltage of the operational amplifier AMP2. As a result, the drain voltage of the drive transistor MN2 and the drain voltage of the sense transistor Tr21 are maintained at substantially the same values. Reference voltage GND is supplied to the source voltages of the drive transistor MN2 and the sense transistor Tr21. Therefore, the ratio of the current flowing through the drive transistor MN2 to the ratio of the current flowing through the sense transistor Tr21 (and the transistor Tr22) is kept constant (for example, 1000:1).

The transistor Tr23 is provided between the power supply voltage terminal VDD and the switch SW2, and controls the current flowing between the source and the drain based on the output voltage of the operational amplifier AMP2 together with the transistor Tr22. In this embodiment, the same current as the current flowing through the transistor Tr22 flows through the transistor Tr23. That is, the transistor Tr23 mirrors the current flowing through the transistor Tr22 and outputs the mirrored current.

The switch SW1 and SW2 constitute a selection circuit, and selectively outputs a current flowing in the sense transistor Tr11 and a current flowing in the sense transistor Tr21 (more detail, a current obtained by mirroring a current flowing in the sense transistor Tr21) as detection current Iin of the current detection circuit 22. The switch SW1 and SW2 switch on and off complementarily to each other in accordance with switching on and off of the drive transistor MN1 and MN2, respectively.

The switch SW 3 is provided between the drain (voltage supply terminal Vbat) of the drive transistor MN1 and the drain (node N11) of the sense transistor Tr11. The switch SW 4 is provided between the drain (external output terminal OUT) of the drive transistor MN2 and the drain (node N12) of the sense transistor Tr21. The switch SWs 3 and SW4 are complementarily switched on and off in accordance with the switching of the on and off states of the drive transistor MNs 1 and MN2, respectively.

Figure 17:
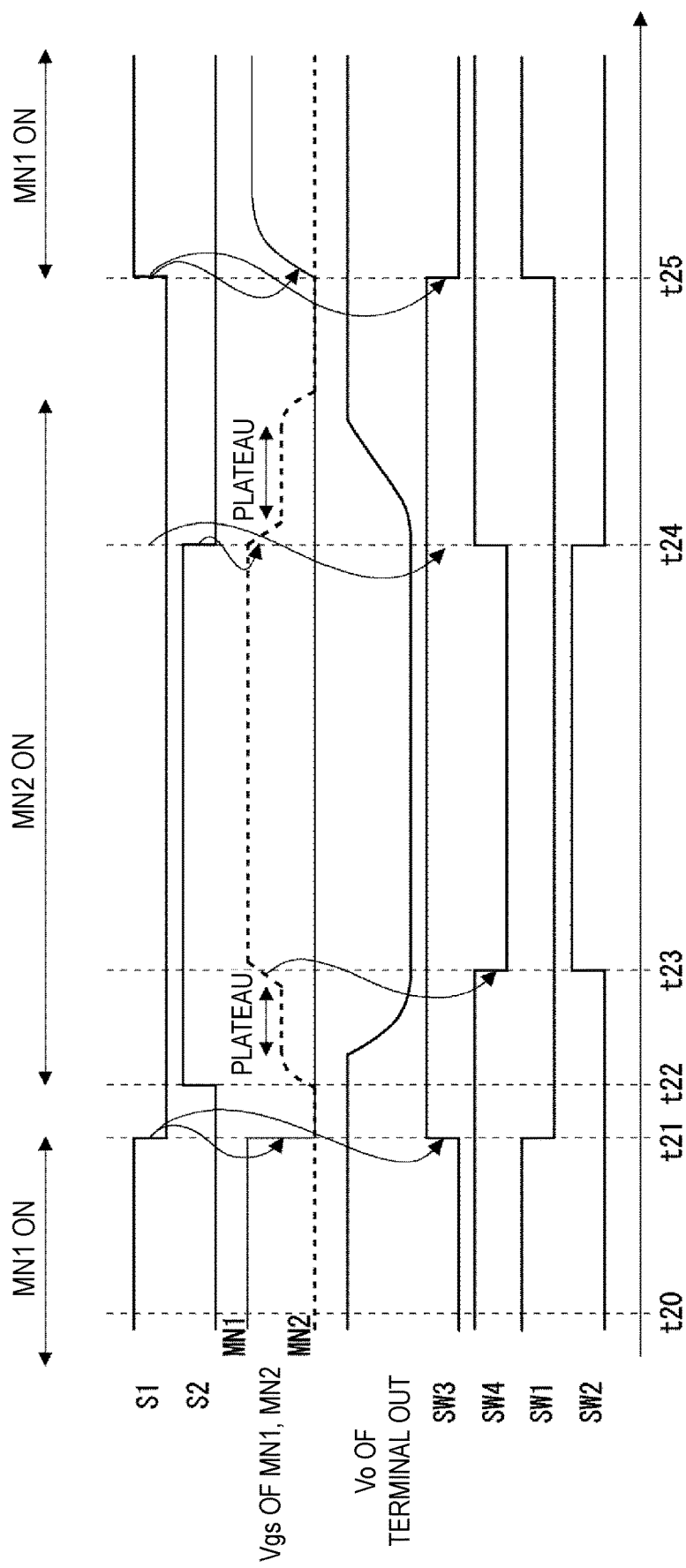
FIG. 17 is a timing chart showing an operation of the current detection circuit shown in FIG. 16.

<<Timing chart>> FIG. 17 is a timing chart showing the operation of the current detection circuit 22. In the case of FIG. 17, first, since the pulse signal S1 indicates the H level and the pulse signal S2 indicates the L level, the drive transistor MN1 is turned on and the drive transistor MN2 is turned off. As a result, the regenerative current of the solenoid valve 7 flows through the current path through the drive transistor MN1 of the on state (time t20 to t21).

At this time, in order to detect the current flowing through the drive transistor MN1 of the on state, the switch SW3 is controlled to be turned off. On the other hand, in order to short-circuit the drain of each of the drive transistor MN2 and the sense transistor Tr21 of the off state, the switch SW4 is controlled to be on. The switch SW1 is controlled to be on, and the switch SW2 is controlled to be off.

Thereafter, when the pulse signal S1 is switched from the H level to the L level, the drive transistor MN1 is switched from the on state to the off state in response to the pulse signal S1 (time t21). At this time, in order to short-circuit the drain of each of the drive transistor MN1 and the sense transistor Tr11 which are turned off state, the switch SW3 is switched from off to on (time t21). The switch SW1 is switched from on to off (time t21).

Thereafter, when the pulse signal S2 is switched from the L level to the H level, the gate-source voltage Vgs of the drive transistor MN2 starts to rise (time t22). When the gate-source voltage Vgs of the drive transistor MN2 reaches a threshold voltage, a current flows through the drive transistor MN2, so that the voltage Vo of the external output terminal OUT starts to drop. Since the current flowing through the drive transistor MN2 is constant while the voltage Vo is decreasing, the gate-source voltage Vgs of the drive transistor MN2 is substantially constant. The gate-source voltage Vgs during this time is called the plateau voltage. Here, until the voltage Vo reaches the reference voltage GND, the drain of each of the drive transistor MN2 and the sense transistor Tr21, which are not completely turned on, needs to be short-circuited, so that the switch SW4 is kept on.

Thereafter, when the voltage Vo reaches the reference voltage GND and the gate-source voltage Vgs of the drive transistor MN2 becomes higher than the plateau voltage, the switch SW4 is switched from on to off (time t23). As a result, the short-circuiting of the drain of each of the drive transistor MN2 and the sense transistor Tr21, which are turned on state, is released. The switch SW2 is switched from off to on (time t23).

Thereafter, when the pulse signal S2 is switched from the H level to the L level, the gate-source voltage Vgs of the drive transistor MN2 starts to decrease (time t24). As a result, the voltage Vo starts to rise. At this time, in order to short-circuit the drain of each of the drive transistor MN2 and the sense transistor Tr21 which are turned off, the switch SW4 is switched from off to on (time t24). The switch SW2 is switched from on to off (time t24).

Thereafter, when the pulse signal S1 is switched from the L level to the H level, the drive transistor MN1 is switched from off to on (time t25). At this time, the switch SW3 is switched from on to off (time t25). As a result, the short-circuiting of the drain of each of the drive transistor MN1 and the sense transistor Tr11, which are turned on state, is released. The switch SW1 is switched from off to on (time t25).

Next, the flow of the current of the current detection circuit 22 and the switching states of the switches SW3 and SW4 in the respective operation mode will be described in more detail with reference to FIGS. 18 and 19.

Figure 18:
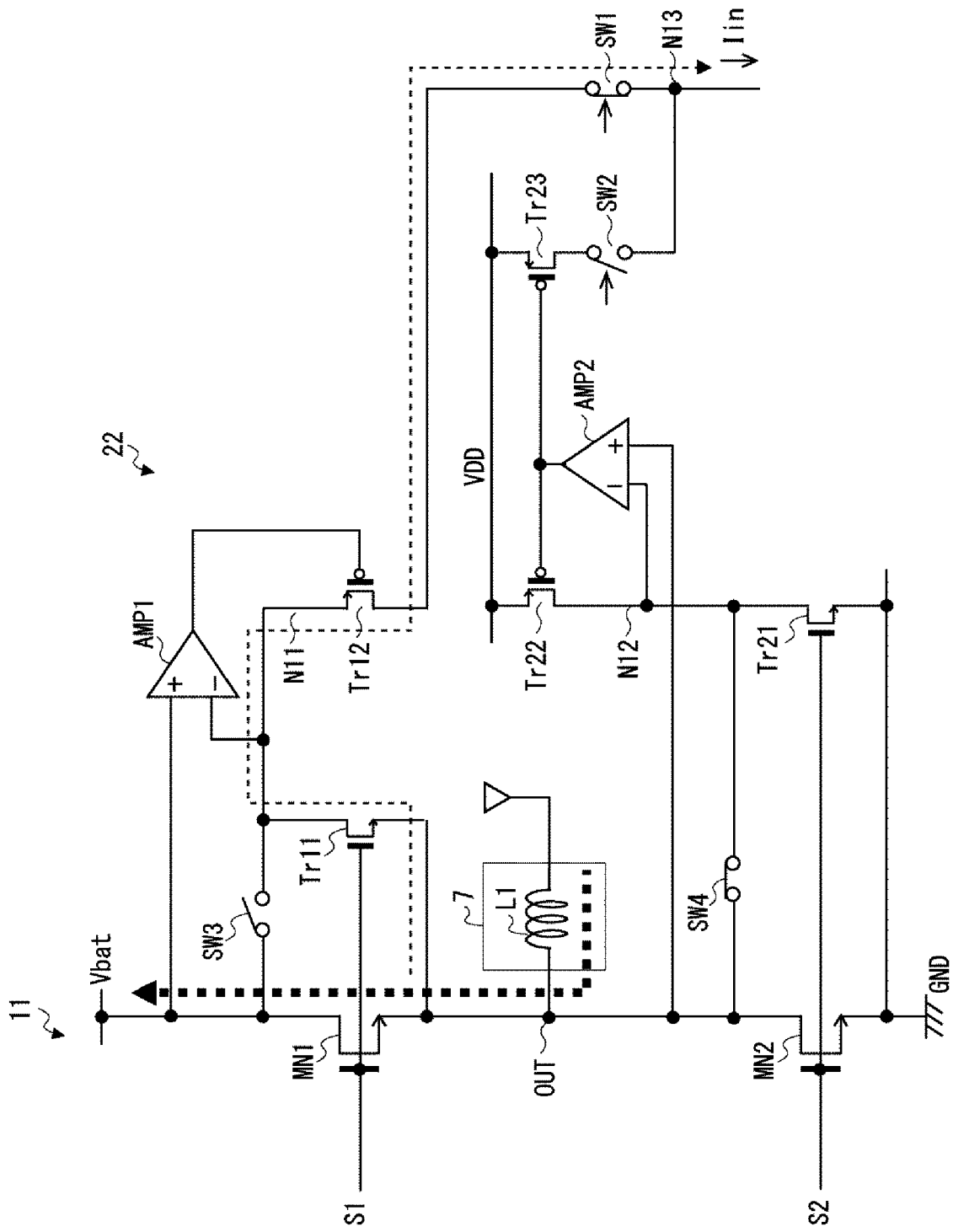

FIG. 18 is a diagram for explaining a current flow of the current detection circuit 22 when the drive transistor MN1, which is a high side driver, is turned on.

As shown in FIG. 18, when the drive transistor MN1 is turned on and the drive transistor MN2 is turned off, the switch SW1 is turned on and the switch SW2 is turned off. As a result, the current flowing through the transistors Tr11,Tr12 in proportion to the current flowing through the drive transistor MN1 is outputted as the detection current Iin of the current detection circuit 22 through the switch SW1.

At this time, the switch SW3 is turned off and the switch SW4 is turned on. As a result, the drain of each of the drive transistor MN2 and the sense transistor Tr21 of the off state is short-circuited. Here, reference voltage GND is supplied to the source of each of the drive transistor MN2 and the sense transistor Tr21. Therefore, the source-drain voltage of each of the drive transistor MN2 and the sense transistor Tr21 of the off state exhibit the same value. As a result, when the Off-State Deterioration occurs, the degree of degradation of each of the drive transistor MN2 and the sense transistor Tr21 becomes the same, so that the ratio of the currents flowing through each of the drive transistor MN2 and the sense transistor Tr21 of the on state is maintained at a constant value (for example, 1000:1). Therefore, the current detection circuit 22 can accurately detect the current flowing through the drive transistor MN2 by using the sense transistor Tr21.

Figure 19:
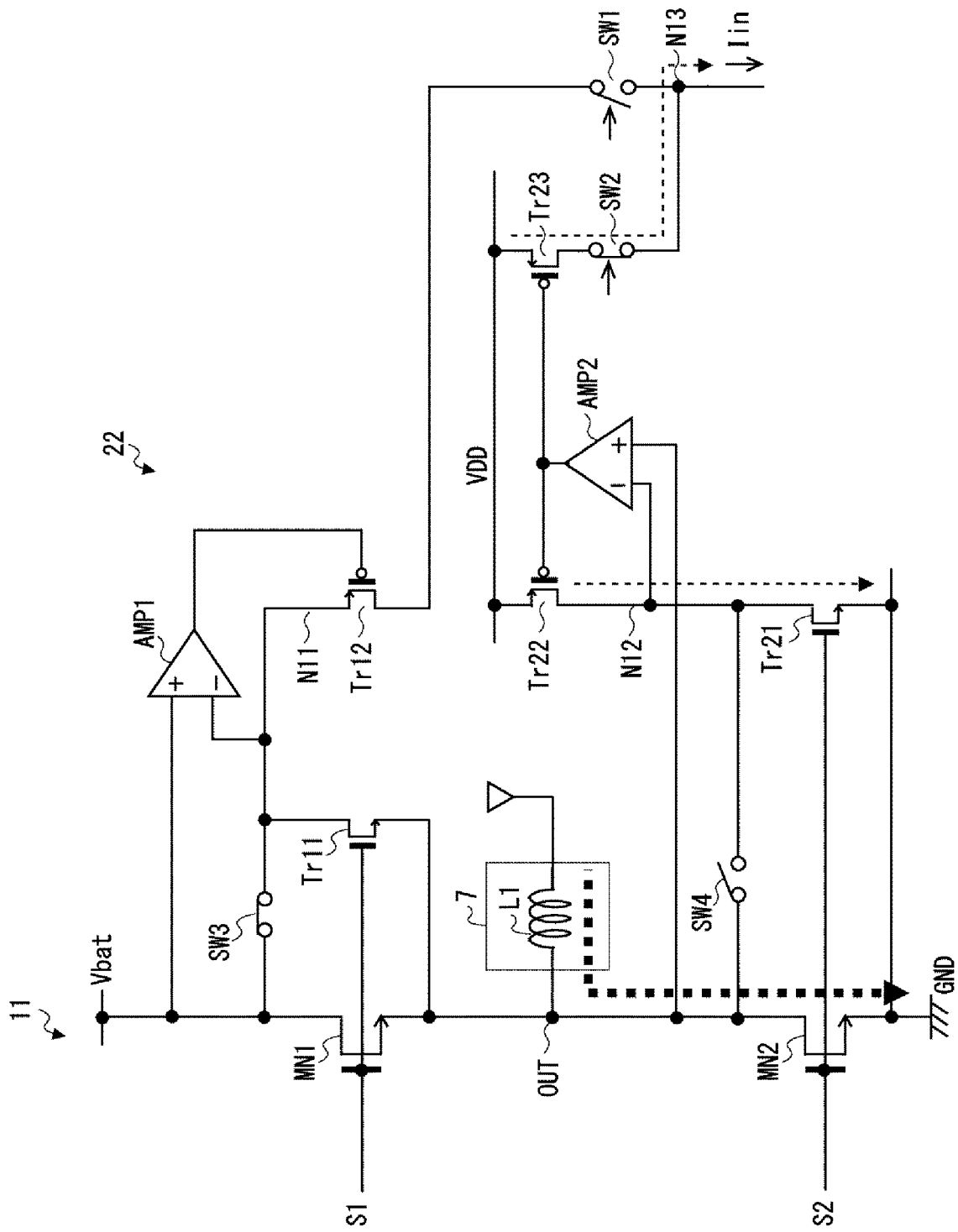

FIG. 19 is a diagram for explaining a current flow of the current detection circuit 22 when the drive transistor MN2, which is a low side driver, is turned on.

As shown in FIG. 19, when the drive transistor MN1 is turned off and the drive transistor MN2 is turned on, the switch SW1 is turned off and the switch SW2 is turned on. As a result, the current flowing in the transistors Tr21,Tr22 in proportion to the current flowing in the drive transistor MN2 is mirrored by the transistor Tr23 and outputted as the detection current Iin of the current detection circuit 22 via the switch SW2.

At this time, the switch SW3 is turned on and the switch SW4 is turned off. As a result, the drain of each of the drive transistor MN1 and the sense transistor Tr11 of the off state is short-circuited. Here, the voltage of the external output terminal OUT is supplied to the source of each of the drive transistor MN1 and the sense transistor Tr11. Therefore, the source-drain voltage of each of the drive transistor MN1 and the sense transistor Tr11 of the off state exhibit the same value.

As a result, when the Off-State Deterioration occurs, the degree of degradation of each of the drive transistor MN1 and the sense transistor Tr11 becomes the same, so that the ratio of the currents flowing through each of the drive transistor MN1 and the sense transistor Tr11 of the on state is maintained at a constant value (for example, 1000:1). Therefore, the current detection circuit 22 can accurately detect the current flowing through the drive transistor MN1 using the sense transistor Tr11.

For example, when the operation of the solenoid driver 11 is stopped, the drive transistors MN1 and the MN2 are both turned off, so that the switch SW3 and the SW4 are both turned on. In this case, when Off-State Degradation occurs, the degrees of deterioration of the drive transistor MN1 and the sense transistor Tr11 are the same, and the degrees of deterioration of the drive transistor MN2 and the sense transistor Tr21 are the same. Therefore, the current detection circuit 22 can suppress the deterioration of the detecting accuracy of the currents flowing through the drive transistors MN1 and MN2.

As described above, the current detection circuit 22 according to the present embodiment includes the switch SW3 for short-circuiting the drain of each of the drive transistor MN1 and the sense transistor Tr11 of the off state, and the switch SW4 for short-circuiting the drain of each of the drive transistor MN2 and the sense transistor Tr21 of the off state. As a result, the current detection circuit 22 on the present embodiment can accurately detect the currents flowing through the drive transistors MN1 and MN2 by using the sense transistors Tr11 and Tr21, similarly to the current detection circuit 12.

In the present embodiment, the current detection circuit 22 detects currents flowing through the drive transistors MN1 and the MN2, but the present invention is not limited thereto. The current detection circuit 22 can be appropriately changed to a configuration for detecting only a current flowing in one of the drive transistor MN1 and the MN2.

<<Current detection circuit 62 according to a comparative example>> With reference to FIGS. 20 and 21, a current detection circuit 62 according to the comparative example of the current detection circuit 22 will be described. The current detection circuit 62 does not include the switches SW3 and SW4 as compared with the current detection circuit 22.

Figure 20:
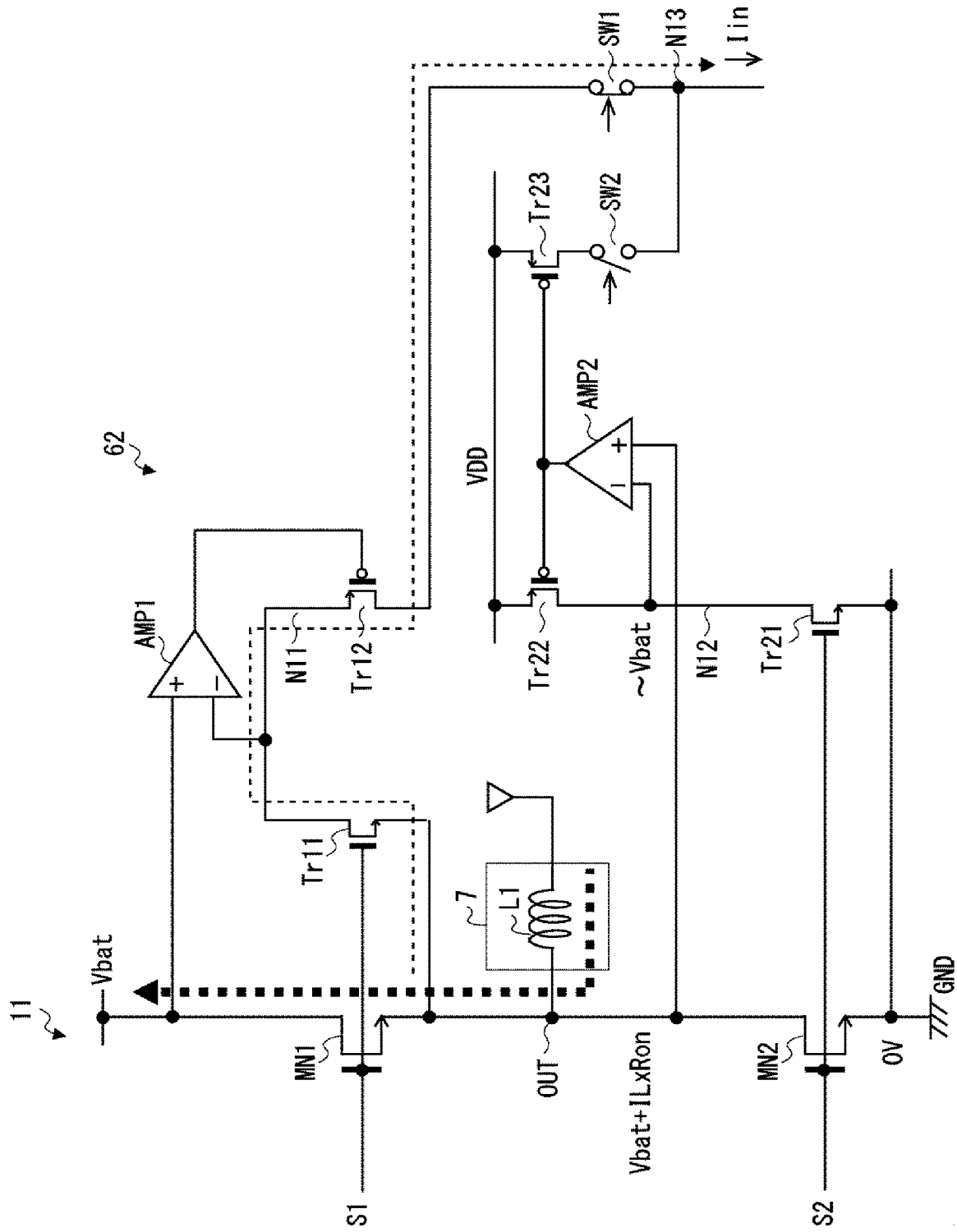

FIG. 20 is a diagram for explaining a current flow of the current detection circuit 62 when the drive transistor MN1, which is a high side driver, is turned on. As shown in FIG. 20, when the drive transistor MN1 is turned on and the drive transistor MN2 is turned off, the switch SW1 is turned on and the switch SW2 is turned off. As a result, the current flowing through the transistors Tr11,Tr12 in proportion to the current flowing through the drive transistor MN1 is outputted as the detection current Iin of the current detection circuit 52 through the switch SW1.

However, in the configuration of the current detection circuit 62 at this time, when the drive transistor MN2 is turned off, the sense transistor Tr21 is turned off and the current flowing through the transistor Tr22 is reduced to the vicinity of the 0 A, so that the gain of the loop composed of the transistor Tr22 and the operational amplifier AMP2 is reduced and the feedback by the loop becomes ineffective. As a result, the transistor Tr22 is not completely turned off, so that the drain voltage of the sense transistor Tr21 of the off state increases to the vicinity of the power supply voltage VDD. Here, when the power supply voltage VDD exhibits a value equivalent to the battery voltage Vbat, since it takes time for the drain voltage of the sense transistor Tr21 to reach the vicinity of the battery voltage Vbat, the source-drain voltage of the drive transistor MN2 of the off state and the source-drain voltage of the sense transistor Tr21 of the off state exhibit different values during this period.

As a result, when the Off-State Deterioration occurs, the degrees of degradation of each of the drive transistor MN2 and the sense transistor Tr21 are different, so that the ratio of the currents flowing through each of the drive transistor MN2 and the sense transistor Tr21 of the on state vary from a constant value.

Figure 21:
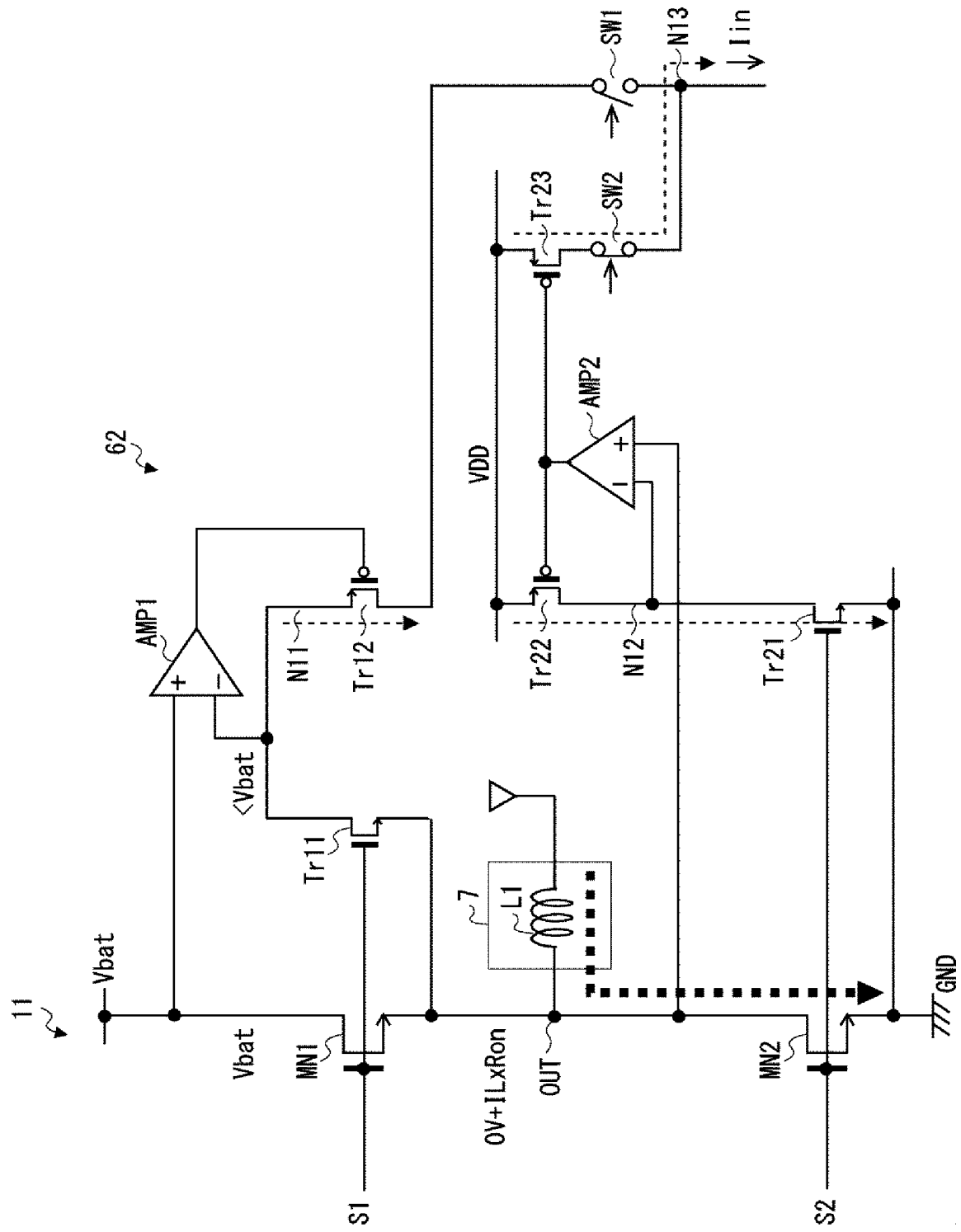

FIG. 21 is a diagram for explaining a current flow of the current detection circuit 62 when the drive transistor MN2, which is a low side driver, is turned on. As shown in FIG. 21, when the drive transistor MN1 is turned off and the drive transistor MN2 is turned on, the switch SW1 is turned off and the switch SW2 is turned on. As a result, the current flowing in the transistors Tr21,Tr22 in proportion to the current flowing in the drive transistor MN2 is mirrored by the transistor Tr23 and outputted as the detection current Iin of the current detection circuit 52 via the switch SW2.

However, in the configuration of the current detection circuit 62 at this time, when the drive transistor MN1 is turned off, the sense transistor Tr11 is turned off and the current flowing through the transistor Tr12 is reduced to the vicinity of the 0 A, so that the gain of the loop composed of the transistor Tr12 and the operational amplifier AMP1 is reduced and the feedback by the loop becomes ineffective. As a result, the transistor Tr12 is not completely turned off, so that the drain voltage of the sense transistor Tr11 of the off state becomes smaller than the battery voltage Vbat. That is, the source-drain voltage of the drive transistor MN1 of the off state and the source-drain voltage of the sense transistor Tr11 of the off state differ from each other.

As a result, when the Off-State Deterioration occurs, the degrees of degradation of each of the drive transistor MN1 and the sense transistor Tr11 are different, so that the ratio of the currents flowing through each of the drive transistor MN1 and the sense transistor Tr11 of the on state varies from a constant value.

Therefore, the current detection circuit 62 cannot accuracy detect the currents flowing through the drive transistors MN1 and MN2 using the sense transistors Tr11 and Tr21. On the other hand, the current detection circuit 22 according to the present embodiment can solve the problem occurring in the current detection circuit 62 by providing the switches SW3 and SW4.

Third Embodiment

Figure 22:
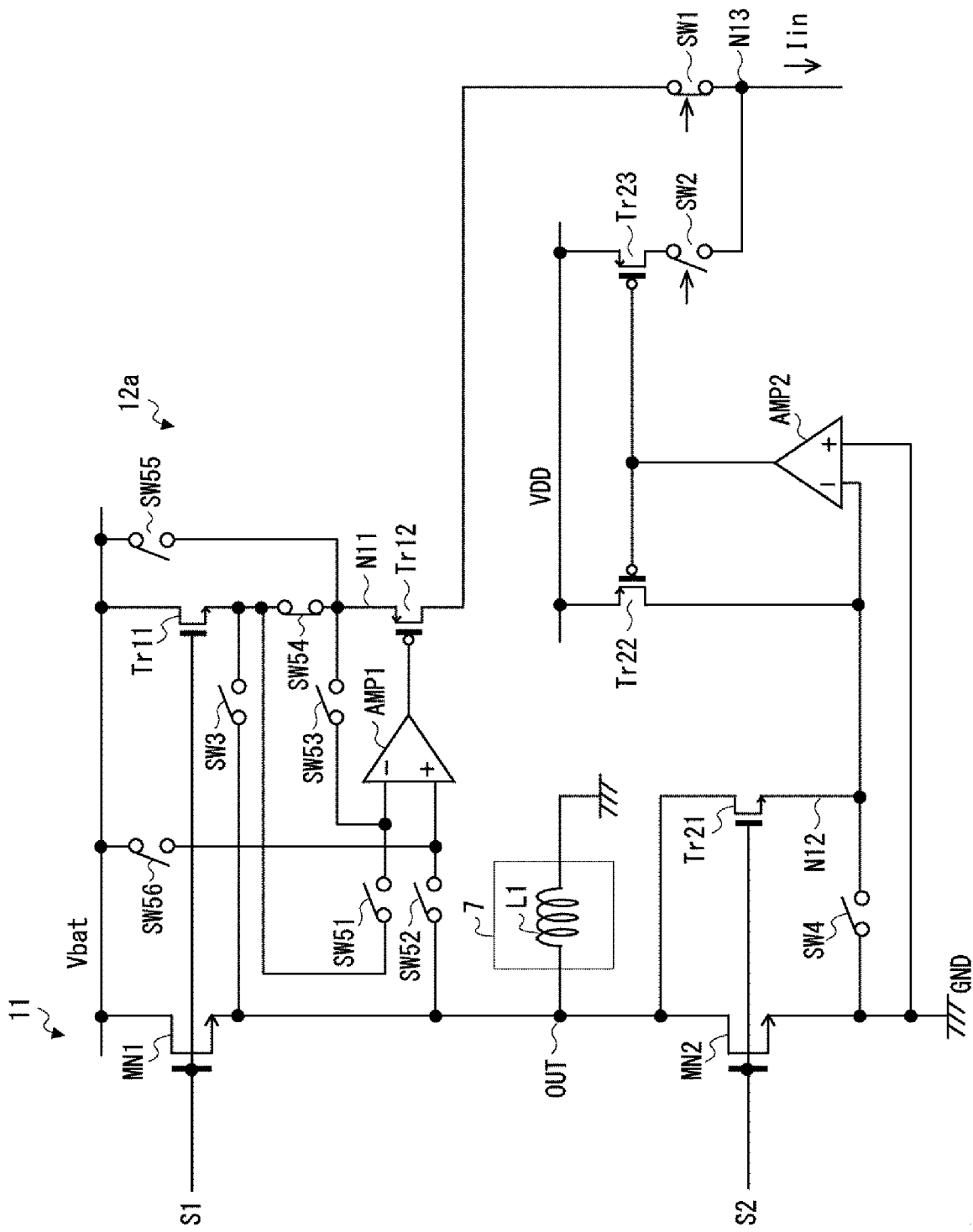
FIG. 22 is a diagram showing a specific configuration example of a current detection circuit according to a third embodiment.

FIG. 22 is a diagram illustrating a specific configuration of the current detection circuit 12a according to a third embodiment. FIG. 22 also shows the solenoid driver 11 as the driving circuit and the solenoid valve 7 as the load circuit. In FIG. 22, high side driving of the solenoid valve 7 by the solenoid driver 11 is performed.

The current detection circuit 12a further includes a switching circuit SW5 as compared with the current detection circuit 12. The switching circuit SW5 is configured to disconnect the external output terminal OUT and the source of the sense transistor Tr11 from the two input terminal of the operational amplifier AMP1 when the drive transistor MN1 is turned off.

Specifically, the switching circuit SW5 includes switches SW51 to SW56. The switch SW51 is provided between the inverting terminal of the operational amplifier AMP1 and the source of the sense transistor Tr11. The switch SW52 is provided between the non-inverting terminal of the operational amplifier AMP1 and the source (external output terminal OUT) of the drive transistor MN1. The switch SW53 is provided between the inverting terminal of the operational amplifier AMP1 and the source of the transistor Tr12. The switch SW54 is provided between the source of the transistor Tr12 and the source of the sense transistor Tr11. The switch SW55 is provided between the source of the transistor Tr12 and the voltage supply terminal Vbat. The switch SW56 is provided between the non-inverting terminal of the operational amplifier AMP1 and the voltage supply terminal Vbat.

Figure 23:
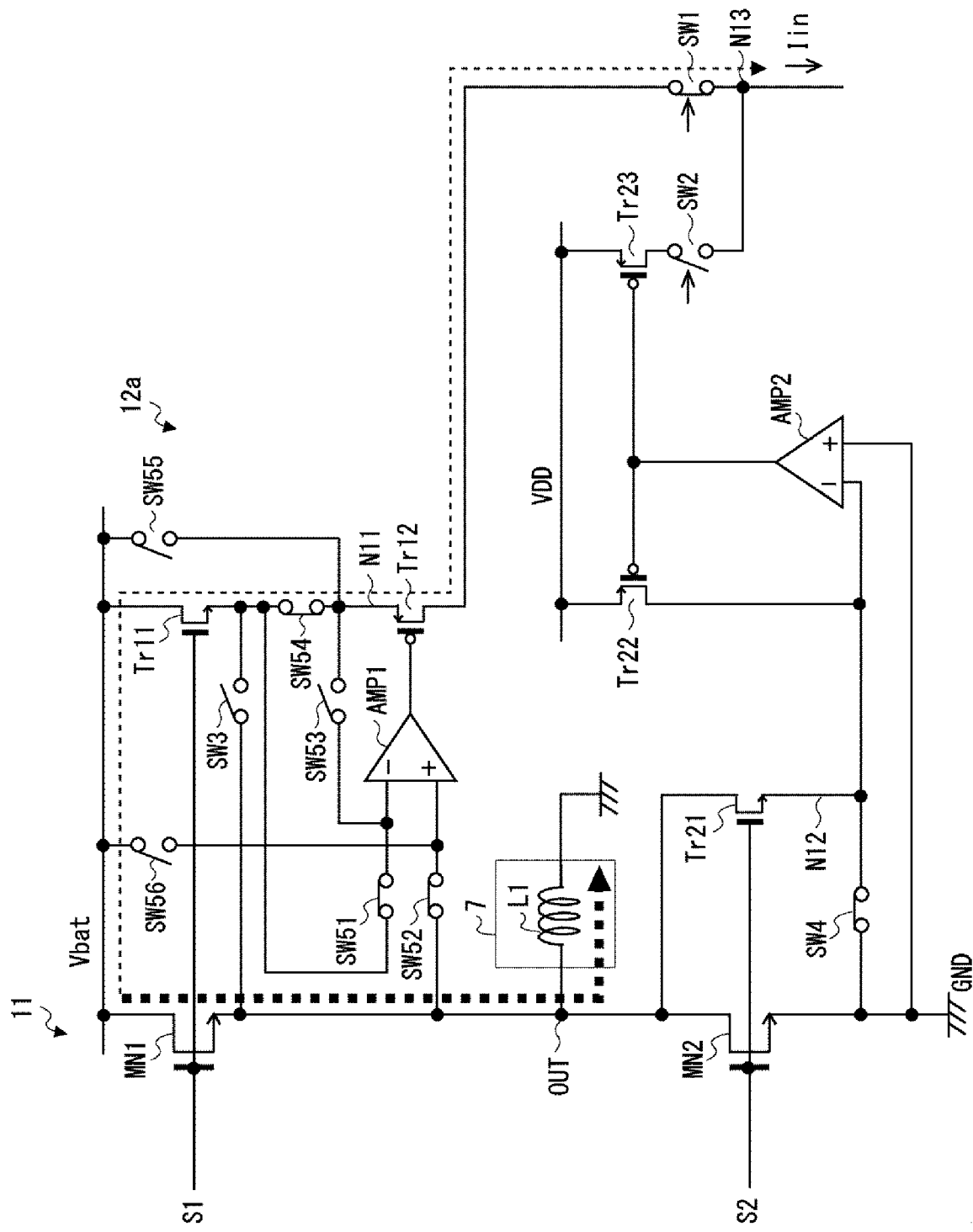

FIG. 23 is a diagram for explaining a current flow of the current detection circuit 12a when the drive transistor MN1, which is a high side driver, is turned on.

As shown in FIG. 23, when the drive transistor MN1 is turned on and the drive transistor MN2 is turned off, the switch SW1 is turned on and the switch SW2 is turned off. At this time, the switches SW51, SW52, and SW54 are turned on, and the switches SW53, SW55, and SW56 are turned off. Therefore, the source (external output terminal OUT) of the drive transistor MN1 is connected to the non-inverting terminal of the operational amplifier AMP1, and the source of the sense transistor Tr11 is connected to the inverting terminal of the operational amplifier AMP1. As a result, in the current detection circuit 12a, the current flowing in the transistors Tr11 and Tr12 in proportion to the current flowing in the drive transistor MN1 is outputted as the detection current Iin via the switch SW1, as in the current detection circuit 12.

The switching on/off of the switches SW3 and the SW4 and the operation of the current detection circuit 12a thereby are the same as those of the current detection circuit 12, and therefore descriptions thereof are omitted.

Figure 24:
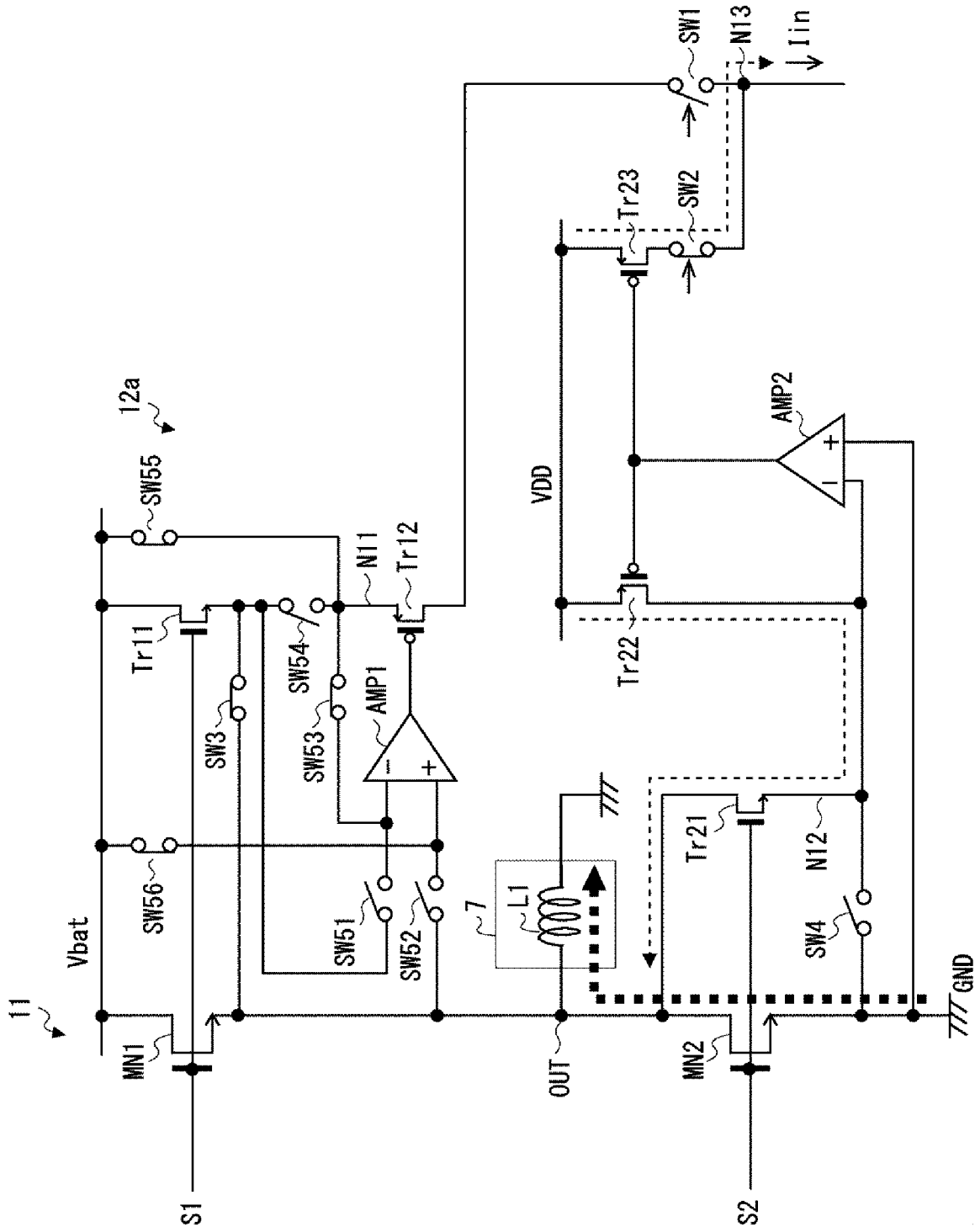

FIG. 24 is a diagram for explaining a current flow of the current detection circuit 12a when the drive transistor MN2 as the low side driver is turned on.

As shown in FIG. 24, when the drive transistor MN1 is turned off and the drive transistor MN2 is turned on, the switch SW1 is turned off and the switch SW2 is turned on. Accordingly, in the current detection circuit 12a, as in the current detection circuit 12, the current flowing in the transistors Tr21 and Tr22 in proportion to the current flowing in the drive transistor MN2 is mirrored by the transistor Tr23 and outputted as the detection current Iin via the switch SW2.

The switching on/off of the switches SW3 and SW4 and the operation of the current detection circuit 12a thereby are the same as those of the current detection circuit 12, and therefore descriptions thereof are omitted.

At this time, the switches SW51, SW52, and SW54 are turned off, and the switches SW53, SW55, and SW56 are turned on. Therefore, the voltage supply terminal Vbat is connected to both the non-inverting terminal and the inverting terminal of the operational amplifier AMP1. Thereby, the operational amplifier AMP1 is disconnected from the external output terminal OUT whose voltage changes in a wide range from the reference voltage GND to the battery voltage Vbat, so that the AMP1 can be configured by a circuit operating in a low voltage range around the battery voltage Vbat. This suppresses an increase in the circuit scale.

As described above, the current detection circuit 12a applied to the present embodiment can exhibit effects equivalent to those of the current detection circuit 12. Further, the current detection circuit 12a according to the present embodiment is configured to disconnect the source (external output terminal OUT) of the drive transistor MN1 and the source of the sense transistor Tr11 from the two input terminals of the operational amplifier AMP1 when the drive transistor MN1 is turned off. Thereby, the operational amplifier AMP1 is disconnected from the external output terminal OUT whose voltage changes in a wide range from the reference voltage GND to the battery voltage Vbat, so that the AMP1 can be configured by a circuit operating in a low voltage range around the battery voltage Vbat. This suppresses an increase in the circuit scale.

Fourth Embodiment

Figure 25:
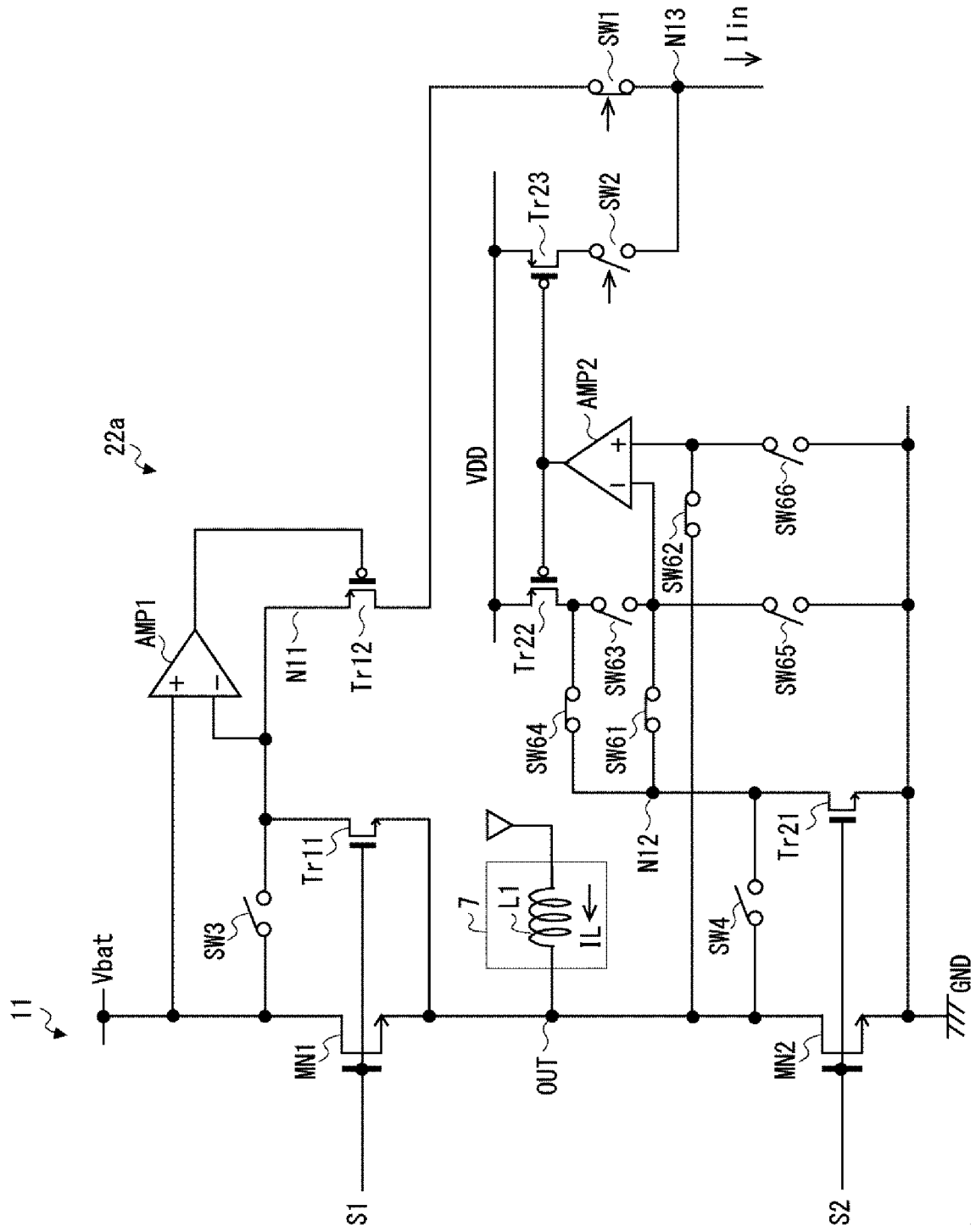
FIG. 25 is a diagram showing a specific configuration example of a current detection circuit according to a fourth embodiment.

FIG. 25 is a diagram showing a specific configuration of a current detection circuit 22a according to a fourth embodiment. FIG. 25 also shows the solenoid driver 11 as the driving circuit and the solenoid valve 7 as the load circuit. In FIG. 25, the solenoid driver 11 performs the low side driving of the solenoid valve 7.

The current detection circuit 22a further includes a switching circuit SW6 as compared with the current detection circuit 22. The switching circuit SW 6 is configured to disconnect the drain of the external output terminal OUT and the sense transistor Tr21 from the two input terminals of the operational amplifier AMP2 when the drive transistor MN2 is turned off.

Specifically, the switching circuit SW6 includes switches SW61 to SW66. The switch SW61 is provided between the inverting terminal of the operational amplifier AMP2 and the drain of the sense transistor Tr21. The switch SW62 is provided between the non-inverting terminal of the operational amplifier AMP2 and the drain (external output terminal OUT) of the drive transistor MN2. The switch SW63 is provided between the inverting terminal of the operational amplifier AMP2 and the drain of the transistor Tr22. The switch SW64 is provided between the drain of the transistor Tr22 and the drain of the sense transistor Tr21. The switch SW65 is provided between the inverting terminal of the operational amplifier AMP2 and the reference voltage terminal GND. The switch SW66 is provided between the non-inverting terminal of the operational amplifier AMP2 and the reference voltage terminal GND.

Figure 26:
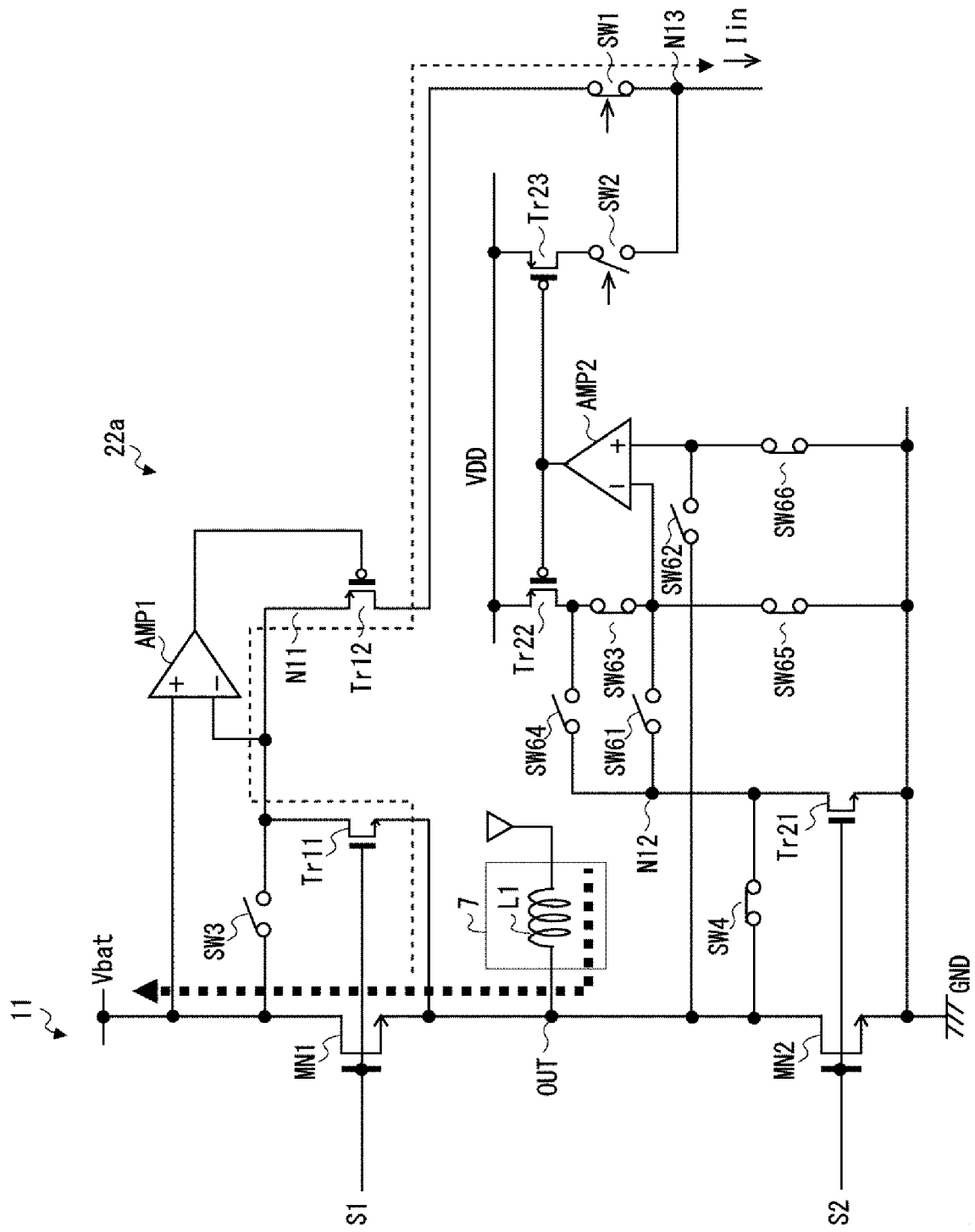

FIG. 26 is a diagram for explaining a current flow of the current detection circuit 22a when the drive transistor MN1, which is a high side driver, is turned on.

As shown in FIG. 26, when the drive transistor MN1 is turned on and the drive transistor MN2 is turned off, the switch SW1 is turned on and the switch SW2 is turned off. As a result, in the current detection circuit 22a, the current flowing in the transistor Tr11,Tr12 in proportion to the current flowing in the drive transistor MN1 is outputted as the detection current Iin via the switch SW1 in the same manner as in the current detection circuit 22.

The switching on/off of the switches SW3 and SW4 and the operation of the current detection circuit 22a thereby are the same as those of the current detection circuit 22, and therefore descriptions thereof are omitted.

At this time, the switches SW61, SW62, and SW64 are turned off, and the switches SW63, SW65, and SW66 are turned on. Therefore, the reference voltage terminal GND is connected to both the non-inverting terminal and the inverting terminal of the operational amplifier AMP2. As a result, the operational amplifier AMP2 is disconnected from the external output terminal OUT whose voltage changes in a wide range from the reference voltage GND to the battery voltage Vbat, and therefore, the AMP2 can be configured by a circuit that operates in a low voltage range. This suppresses an increase in the circuit scale.

Figure 27:
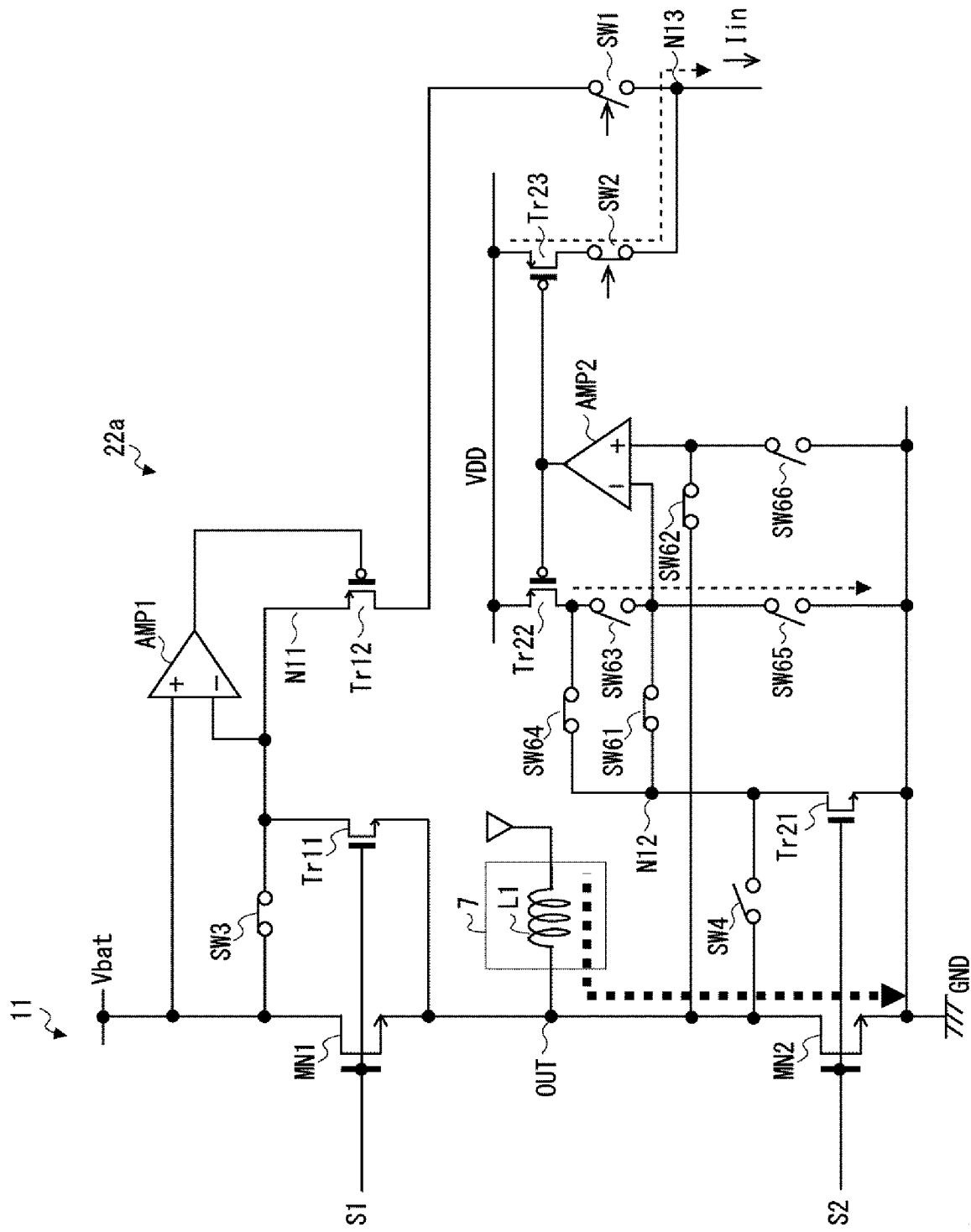

FIG. 27 is a diagram for explaining a current flow of the current detection circuit 22a when the drive transistor MN2, which is a low side driver, is turned on.

As shown in FIG. 27, when the drive transistor MN1 is turned off and the drive transistor MN2 is turned on, the switch SW1 is turned off and the switch SW2 is turned on. At this time, the switches SW61, SW62, and SW64 are turned on, and the switches SW63, SW65, and SW66 are turned off. Therefore, the drain (external output terminal OUT) of the drive transistor MN2 is connected to the non-inverting terminal of the operational amplifier AMP2, and the drain of the sense transistor Tr21 is connected to the inverting terminal of the operational amplifier AMP2. As a result, in the current detection circuit 22a, the current flowing in the transistors Tr21 and Tr22 in proportion to the current flowing in the drive transistor MN2 is mirrored by the transistor Tr23 and outputted as the detection current Iin via the switch SW2, as in the current detection circuit 22.

The switching on/off of the switches SW3 and SW4 and the operation of the current detection circuit 22a thereby are the same as those of the current detection circuit 12, and therefore descriptions thereof are omitted.

As described above, the current detection circuit 22a applied to the present embodiment can exhibit the same degree of effects as those of the current detection circuit 22. Further, the current detection circuit 22a according to the present embodiment is configured to disconnect the drain (external output terminal OUT) of the drive transistor MN2 and the drain of the sense transistor Tr21 from the two input terminal of the operational amplifier AMP2 when the drive transistor MN2 is turned off. As a result, the operational amplifier AMP2 is disconnected from the external output terminal OUT whose voltage changes in a wide range from the reference voltage GND to the battery voltage Vbat, and therefore, the operational amplifier AMP2 can be configured by a circuit that operates in a low voltage range. This suppresses an increase in the circuit scale.

Fifth Embodiment

Figure 28:
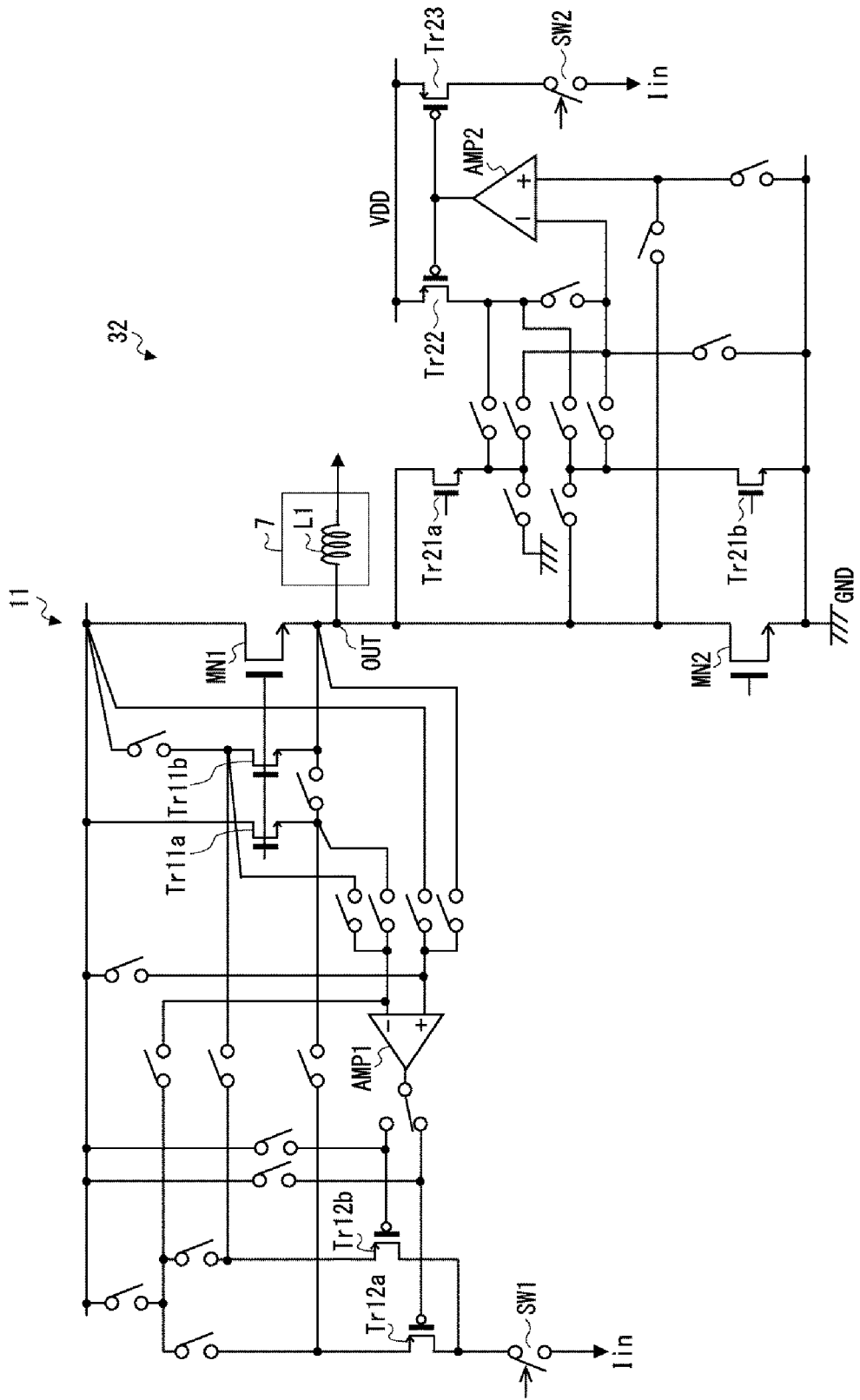
FIG. 28 is a diagram showing a specific configuration example of a current detection circuit according to a fifth embodiment.

FIG. 28 is a diagram showing a specific configuration example of a current detection circuit 32 according to the fifth embodiment. The current detection circuit 32 according to the present embodiment can detect the current flowing through the solenoid driver 11 when the solenoid valve 7 is driven by the solenoid driver 11 in either of the high side driving and the low side driving by switching the connecting relation of the components. Hereafter, a concrete description will be given.

As shown in FIG. 28, the current detection circuit 32 includes sense transistors Tr11 and Tr21, transistors Tr12, Tr22, operational amplifiers AMP1 and AMP2, a transistor Tr23, switches SW1 to SW4, and current detection circuits SW5 and SW6, similarly to the switching circuit 12a and 22a, for example. The current detection circuit 32 further includes a switch group (hereinafter referred to as a switch group SWG) for switching the connections of these components. Hereinafter, the switch group SWG includes switches SW1 to SW4 and a plurality of switches constituting switching circuits SW5 and SW6.

In FIG. 28, the sense transistor Tr11a is provided as the sense transistor Tr11 used at the time of high side driving, and the sense transistor Tr11b is provided as the sense transistor Tr11 used at the time of low side driving. In addition, in the embodiment of FIG. 28, a transistor Tr12a is provided as the transistor Tr12 used at the time of high side driving, and a transistor Tr12b is provided as the transistor Tr12 used at the time of low side driving. Further, in the embodiment of FIG. 28, the sense transistor Tr21a is provided as the sense transistor Tr21 used at the time of high side driving, and the sense transistor Tr21b is provided as the sense transistor Tr21 used at the time of low side driving.

Figure 29:
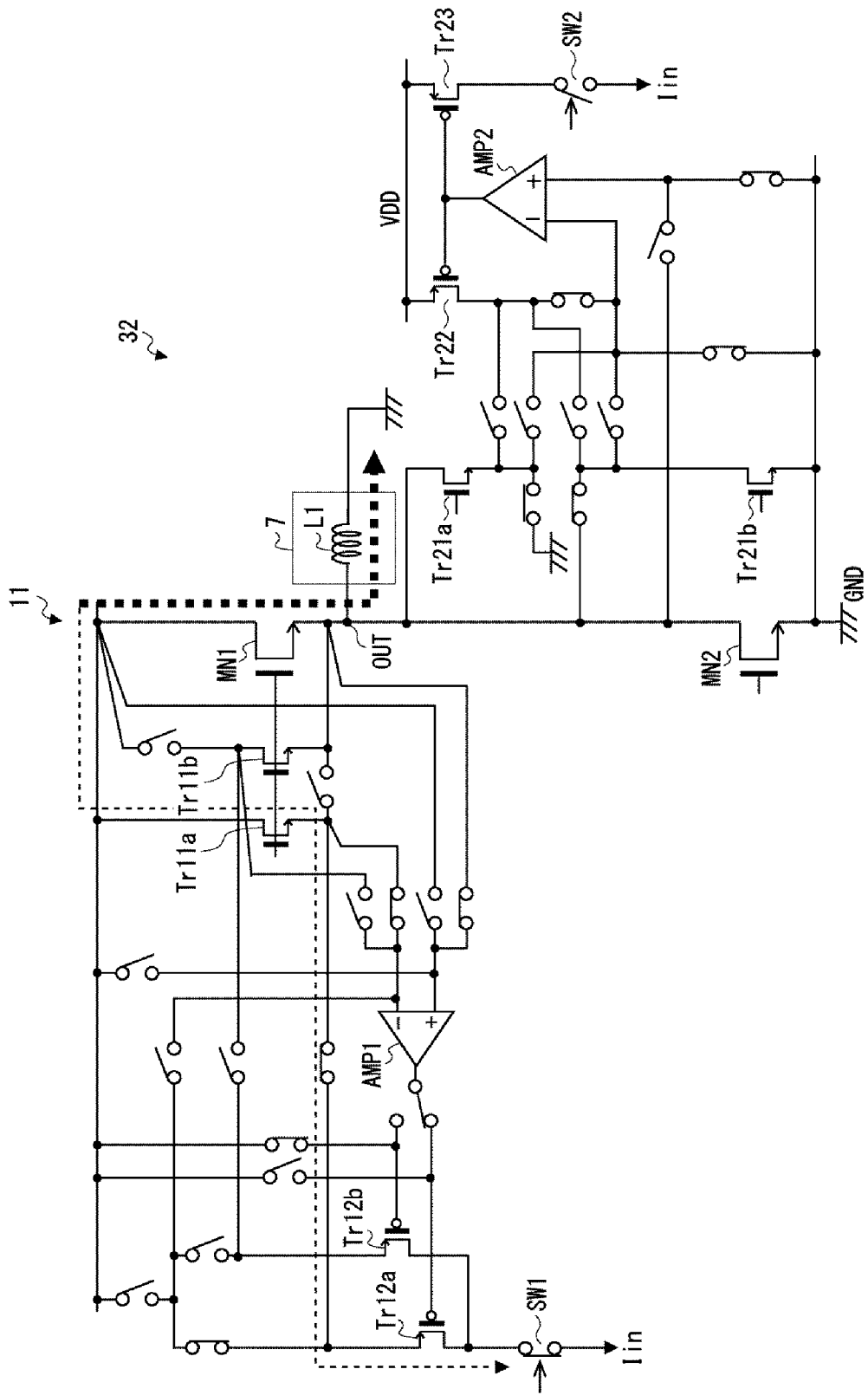
FIG. 29 is a diagram for explaining a connecting relation and a current flow of components of the current detection circuit shown in FIG. 28 when the high side driver is turned on at the time of a high side drive.

FIG. 29 is a diagram for explaining the connections of the components of the current detection circuit 32 and the flow of current when the drive transistor MN1, which is a high side driver, is turned on at the time of high side driving. In FIG. 29, a thick dotted arrow indicates a path through which the solenoidal current flows, and a thin dotted arrow indicates a path through which the detection current flows.

At this time, the current detection circuit 32 configures an equivalent circuit of the current detection circuit 12a shown in FIG. 23 by switching on and off the switch group SWG. In FIG. 29, the sense transistor Tr11a for the high side driving is used as the sense transistor Tr11, and the transistor Tr12a for high side driving is used as the transistor Tr12.

At this time, the sources of each of the drive transistor MN2 and the sense transistors Tr21a and Tr21b of the off state are short-circuited and each drain is short-circuited by switching on/off of the switch corresponding to the switch SW4 in the switch group SWG. As a result, when the Off-State Deterioration occurs, the degrees of degradation of each of the drive transistor MN2 and the sense transistor Tr21a and Tr21b become the same, so that the ratio of the currents flowing through each of the drive transistor MN2 and the sense transistor Tr21a and the Tr21b of the on state is maintained at a constant value. Therefore, the current detection circuit 32 can accurately detect the current flowing through the drive transistor MN2 using the sense transistors Tr21a and Tr2b.

Figure 30:
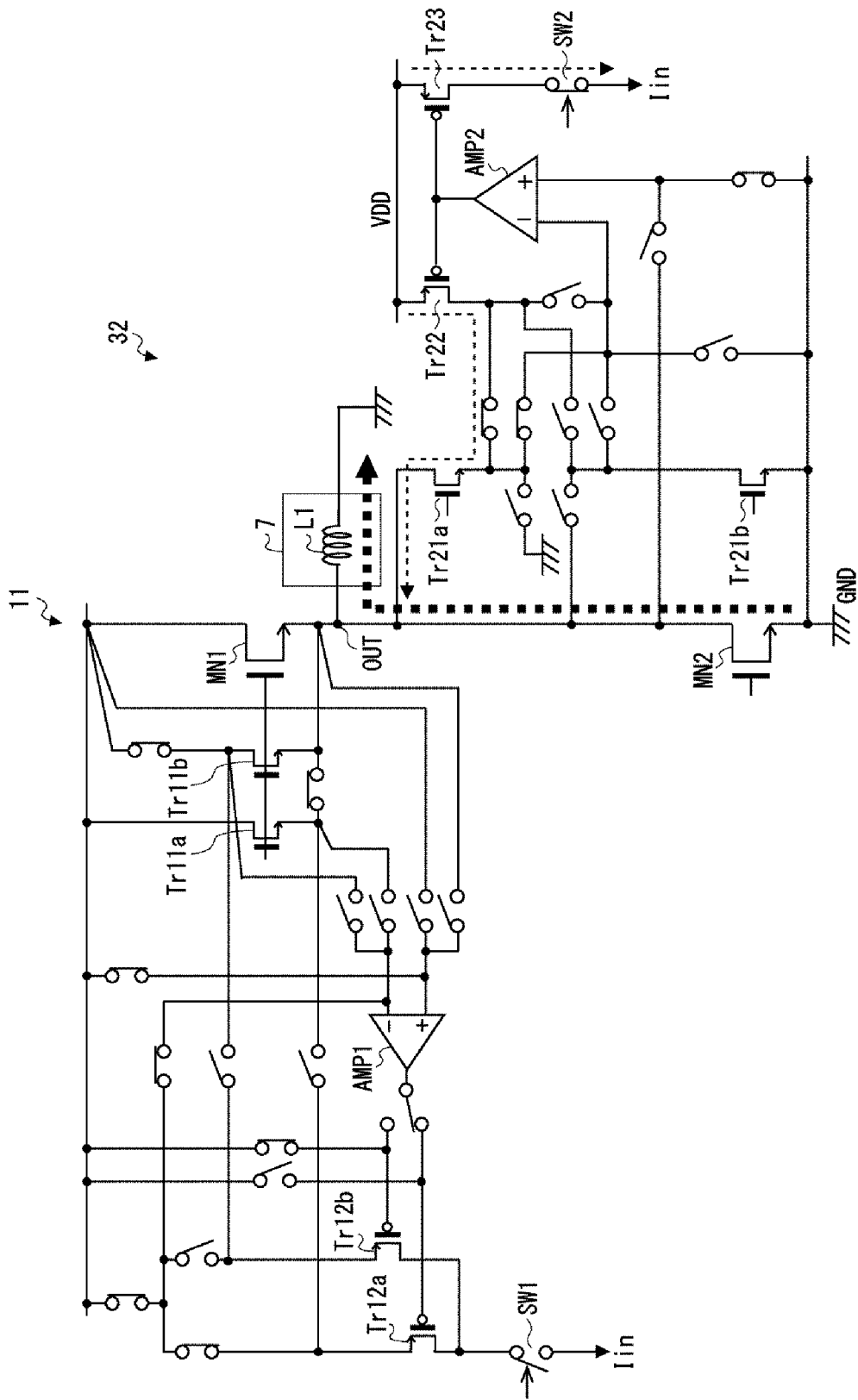
FIG. 30 is a diagram for explaining a connecting relation and a current flow of components of the current detection circuit shown in FIG. 28 when the low side driver is turned on at the time of high side drive.

FIG. 30 is a diagram for explaining the connections of the components of the current detection circuit 32 and the flow of current when the drive transistor MN2, which is a low side driver, is turned on at the time of high side driving. In FIG. 30, thick dotted arrows indicate a path through which the solenoidal current flows, and thin dotted arrows indicate paths through which the detection currents flow.

At this time, the current detection circuit 32 realizes the equivalent circuit of the current detection circuit 12a shown in FIG. 24 by switching on and off the switch group SWG. In FIG. 30, a sense transistor Tr21a for the high side driving is used as the sense transistor Tr21.

At this time, the source of each of the drive transistor MN1 and the sense transistors Tr11a and Tr11b of the off state is short-circuited by switching on and off the switch corresponding to the switch SW3 in the switch group SWG, and each drain is short-circuited. As a result, when the Off-State Deterioration occurs, the degrees of degradation of the drive transistor MN1, the sense transistor Tr11a, and the Tr11b become the same, so that the ratio of the current flowing through the drive transistor MN1, the sense transistor Tr11a, and the Tr11b of the on state is maintained at constant values. Therefore, the current detection circuit 32 can accurately detect the current flowing through the drive transistor MN1 using the sense transistors Tr11a and Tr11b.

Figure 31:
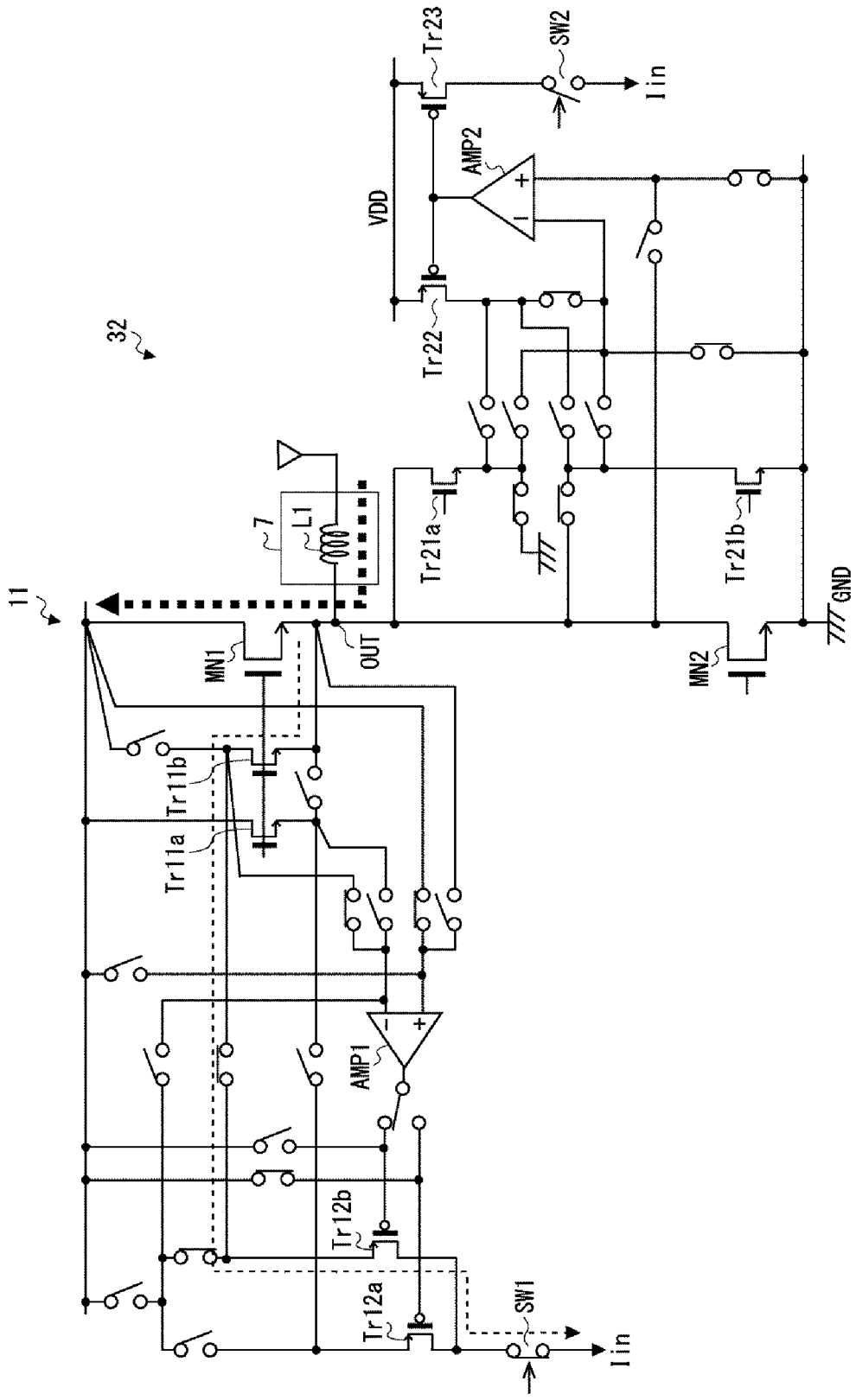
FIG. 31 is a diagram for explaining a connecting relation and a current flow of components of the current detection circuit shown in FIG. 28 when the high side driver is turned on at the time of low side driving.

FIG. 31 is a diagram for explaining the connections of the components of the current detection circuit 32 and the flow of the current when the drive transistor MN1, which is a high side driver, is turned on at the time of low side driving. In FIG. 31, a thick dotted arrow indicates a path through which the solenoidal current flows, and a thin dotted arrow indicates a path through which the detection current flows.

At this time, the current detection circuit 32 realizes an equivalent circuit of the current detection circuit 22a shown in FIG. 26 by switching on and off the switch group SWG. In FIG. 31, the sense transistor Tr11b for low side driving is used as the sense transistor Tr11, and the transistor Tr12b for low side driving is used as the transistor Tr12.

At this time, the sources of each of the drive transistor MN2 and the sense transistors Tr21a and Tr21b of the off state are short-circuited and each drain are short-circuited by switching on/off of the switch corresponding to the switch SW4 in the switch group SWG. As a result, when the Off-State Deterioration occurs, the degree of degradation of each of the drive transistor MN2 and the sense transistors Tr21a and Tr21b becomes the same, so that the ratio of the currents flowing through each of the drive transistor MN2 and the sense transistors Tr21a and the Tr21b of the on state is maintained at a constant value. Therefore, the current detection circuit 32 can accurately detect the current flowing through the drive transistor MN2 using the sense transistors Tr21a and Tr21b.

Figure 32:
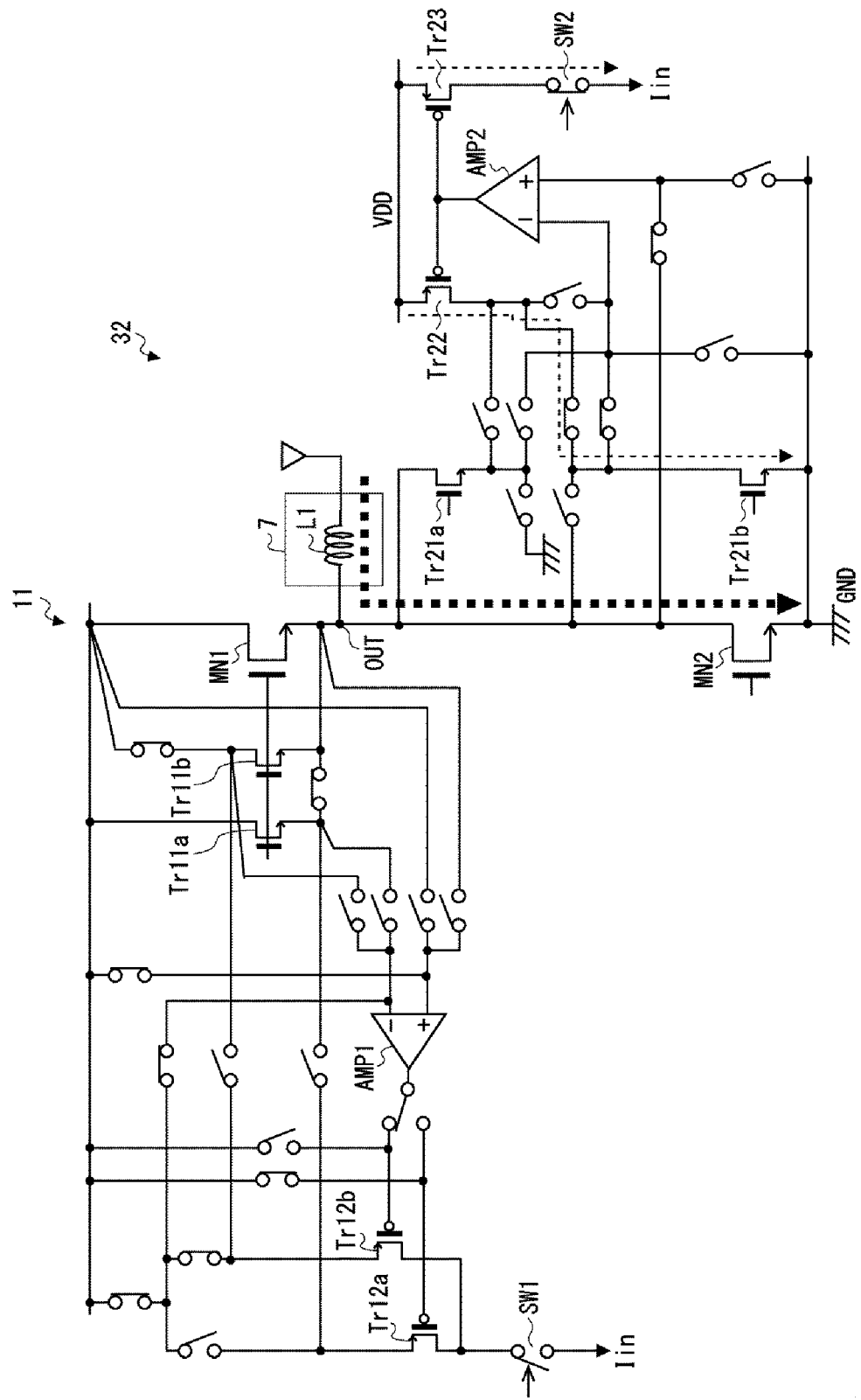
FIG. 32 is a diagram for explaining a connecting relation and a current flow of components of the current detection circuit shown in FIG. 28 when the low side driver is turned on at the time of the low side driving.

FIG. 32 is a diagram for explaining the connections of the components of the current detection circuit 32 and the flow of current when the drive transistor MN2, which is a low side driver, is turned on at the time of low side driving. In FIG. 32, a thick dotted arrow indicates a path through which the solenoidal current flows, and a thin dotted arrows indicate paths through which the detection currents flow.

At this time, the current detection circuit 32 realizes the equivalent circuit of the current detection circuit 22a shown in FIG. 27 by switching on and off the switch group SWG. In FIG. 32, a sense transistor Tr21b for the low side driving is used as the sense transistor Tr21.

At this time, the sources of each of the drive transistor MN1 and the sense transistors Tr11a and Tr11b of the off state are short-circuited by switching on and off the switch corresponding to the switch SW3 in the switch group SWG, and each drain is short-circuited. As a result, when the Off-State Deterioration occurs, the degrees of degradation of the drive transistor MN1, the sense transistors Tr11a and Tr11b become the same, so that the ratio of the currents flowing through the drive transistor MN1, the sense transistor Tr11a, and the Tr11b of the on state is maintained at constant value. Therefore, the current detection circuit 32 can accurately detect the current flowing through the drive transistor MN1 using the sense transistors Tr11a and Tr11b.

As described above, the current detection circuit 32 according to the present embodiment can detect the current flowing through the solenoid driver 11 when the solenoid valve 7 is driven by the solenoid driver 11 by either the high side driving or the low side driving by switching the connecting relation of the components using the switch group SWG.

In addition, the current detection circuit 32 according to the present embodiment causes the sources of each of the drive transistor MN1 and the sense transistors Tr11a and Tr11b of the off state to be short-circuited and causes each drain to be short-circuited by switching the connections of the components using the switch group SWG. As a result, when the Off-State Deterioration occurs, the degrees of degradation of the drive transistor MN1, the sense transistor Tr11a, and the Tr11b become the same, so that the ratio of the currents flowing through the drive transistor MN1, the sense transistor Tr11a, and the Tr11b of the on state is maintained at a constant value.

Similarly, the current detection circuit 32 connected to the present embodiment causes the sources of each of the drive transistor MN2 and the sense transistor Tr21a and Tr21b of the off state to be short-circuited and causes each drain to be short-circuited by switching the connections of the components using the switch group SWG. As a result, when the Off-State Deterioration occurs, the degree of degradation of each of the drive transistor MN2 and the sense transistors Tr21a and Tr21b becomes the same, so that the ratio of the currents flowing through each of the drive transistor MN2 and the sense transistor Tr21a and the Tr21b of the on state is maintained at a constant value.

Therefore, the current detection circuit 32 applied to the present embodiment can accurately detect the currents flowing through the drive transistors MN1 and MN2 by using the sense transistors Tr11a, Tr11b, Tr21a, and Tr21b.

In the present embodiment, the current detection circuit 32 realizes one of the equivalent circuits of the current detection circuit 12a and the current detection circuit 22a as operation mode, but the present invention is not limited thereto. For example, the current detection circuit 32 may be configured to implement equivalent circuits of either the current detection circuit 12 or the current detection circuit 22, corresponding to an operation mode.

Figure 33:
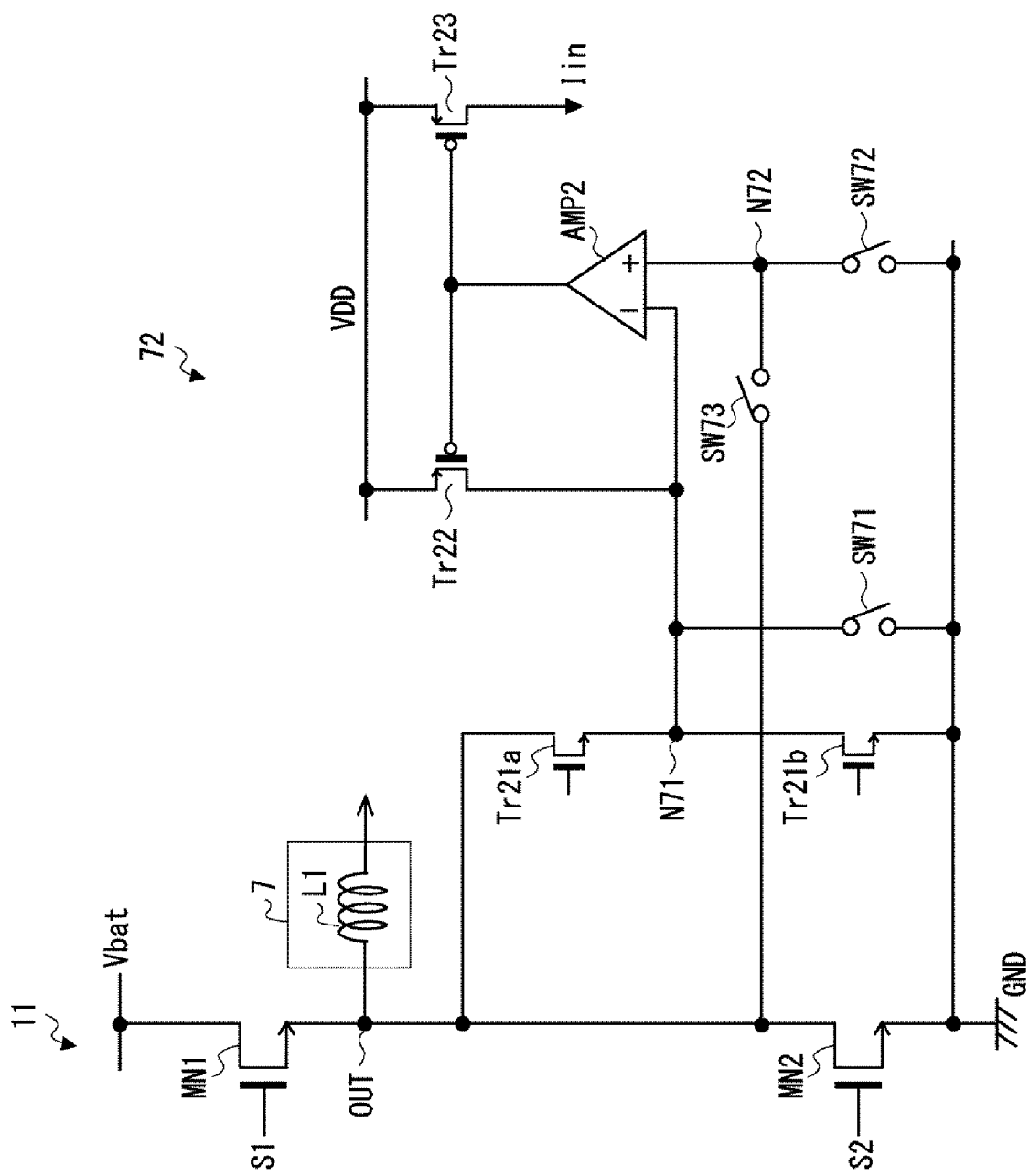
FIG. 33 is a diagram showing a configuration example of a current detection circuit according to a comparative example.

<<Current detection circuit 72 according to a comparative example>> Next, the current detection circuit 72 according to a comparative example in the current detection circuit 32 will be described. FIG. 33 is a diagram showing a configuration example of the current detection circuit 72 according to the comparative example. The current detection circuit 72 can detect the current flowing in the solenoid driver 11 when the solenoid valve 7 is driven by the solenoid driver 11 in either the high side driving or the low side driving.

As shown in FIG. 33, the current detection circuit 72 includes a sense transistor Tr21a used at the time of high side driving, a sense transistor Tr21b used at the time of low side driving, an operational amplifier AMP2, a transistor Tr22, a transistor Tr23, and switches SW71 to SW73.

The sense transistors Tr21a and Tr21b are provided in series between the external output terminal OUT and the reference voltage terminal GND. The switch SW71 is provided between the node N71, which is a node between the sense transistor Tr21a and the node Tr21b, and the reference voltage terminal GND. The switch SW72 is provided between the node N72 and the reference voltage terminal GND. The switch SW73 is provided between the node N72 and the external output terminal OUT. The operational amplifier AMP2 amplifies a potential difference between the voltage of the node N71 and the voltage of the node N72. The transistor Tr22 is provided between the power supply voltage terminal VDD and the node N71, and controls the current flowing between the source and the drain nodes based on the output voltage of the operational amplifier AMP2. The transistor Tr23 is provided between the power supply voltage terminal VDD and the detection current output terminal, and controls the current flowing through the transistor Tr22 and controls the current flowing between the source and drain based on the output voltage of the operational amplifier AMP2. In this embodiment, the same current as the current flowing through the transistor Tr22 flows through the transistor Tr23. That is, the transistor Tr23 mirrors the current flowing through the transistor Tr22 and outputs the mirrored current as the detection current Iin.

Figure 34:
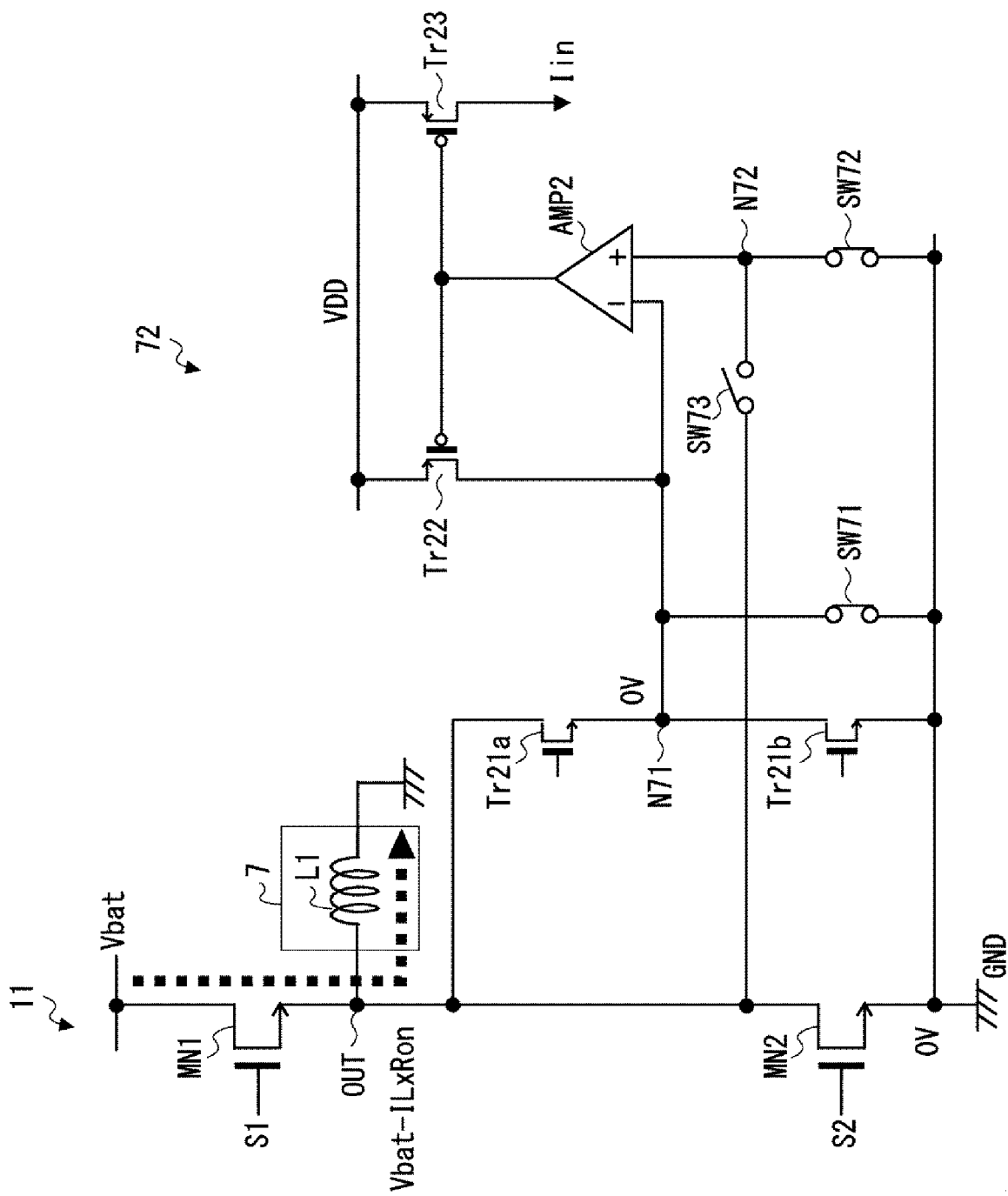
FIG. 34 is a diagram for explaining a flow of current of the current detection circuit shown in FIG. 33 when the high side driver is turned on at the time of high side driving.

FIG. 34 is a diagram for explaining a current flow of the current detection circuit 72 when the drive transistor MN1, which is a high side driver, is turned on at the time of the high side driving.

At this time, the switches SW71 and SW72 are turned on, and the switch SW73 is turned off. However, in the configuration of the current detection circuit 72 at this time, the source-drain voltage of the drive transistor MN2 of the off state and the source-drain voltage of the sense transistor Tr21a of the off state show the same value (Vbat), whereas the source-drain voltage of the sense transistor Tr21b of the off state shows a different value (0V).

As a result, when the Off-State Deterioration occurs, the degrees of degradation of each of the drive transistor MN2 and the sense transistor Tr21b are different, so that the ratio of the currents flowing through each of the drive transistor MN2 and the sense transistor Tr21b of the on state varies from a constant value.

Figure 35:
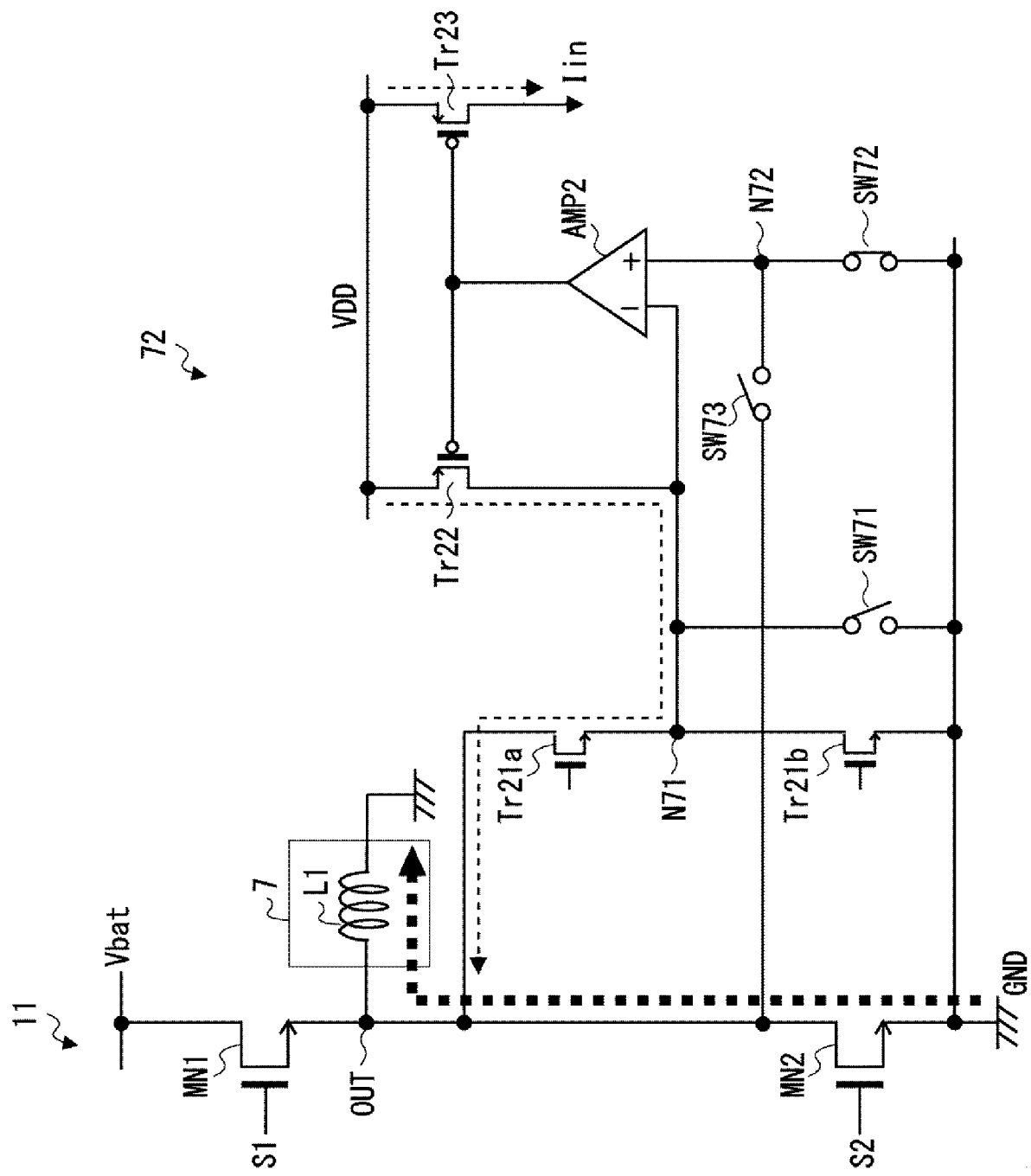
FIG. 35 is a diagram for explaining a flow of a current of the current detection circuit shown in FIG. 33 when the low side driver is turned on at the time of high side driving.

FIG. 35 is a diagram for explaining a current flow of the current detection circuit 72 when the drive transistor MN2, which is a low side driver, is turned on at the time of high side driving.

At this time, the switch SW71 is turned off, the switch SW72 is turned on, and the switch SW73 is turned off. As a result, the current flowing in the transistors Tr21a and Tr22 in proportion to the current flowing in the drive transistor MN2 is mirrored by the transistor Tr23 and outputted as the detection current Iin of the current detection circuit 72.

Figure 36:
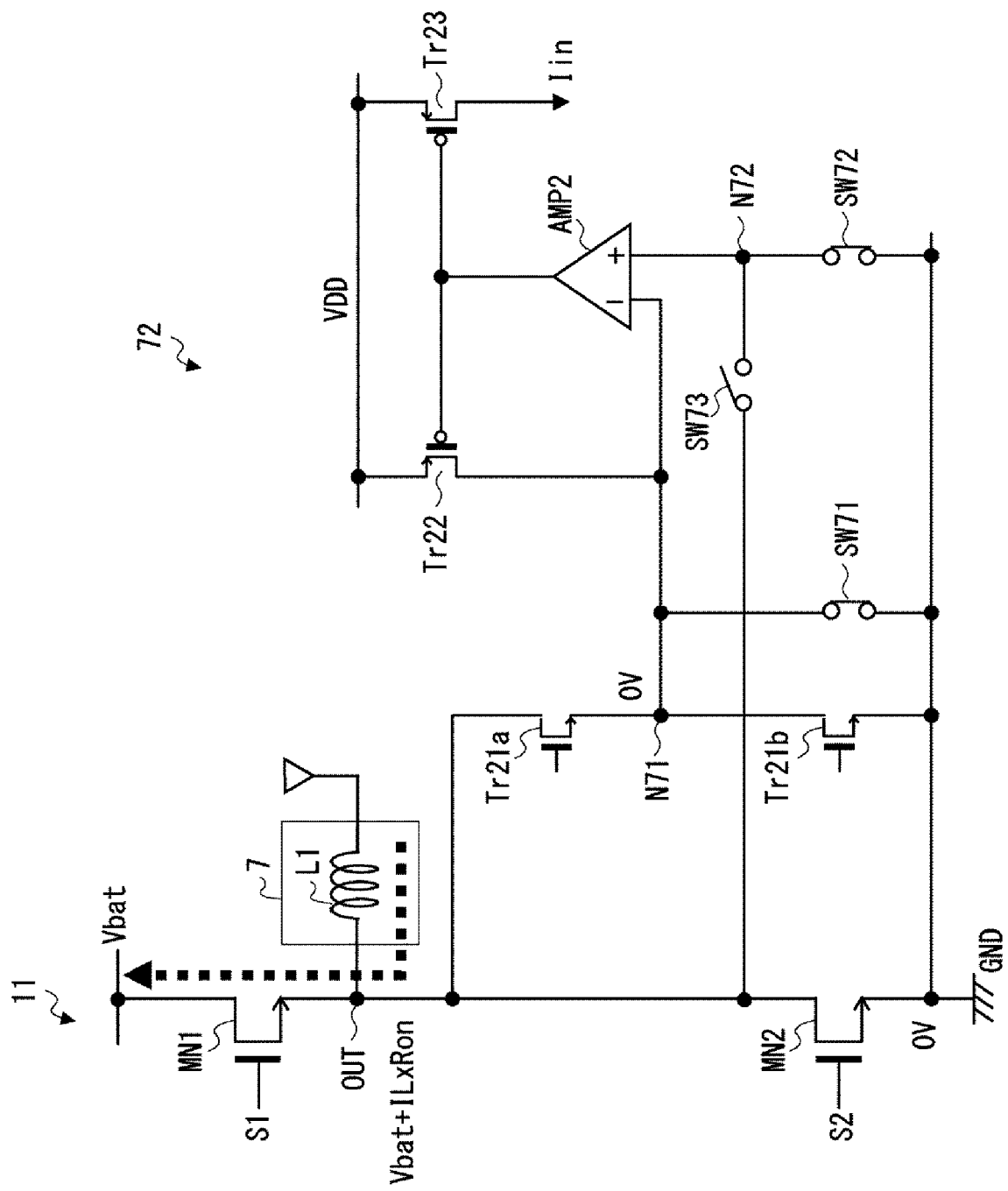
FIG. 36 is a diagram for explaining a flow of a current of the current detection circuit shown in FIG. 33 when the high side driver is turned on at the time of the low side driving.

FIG. 36 is a diagram for explaining a current flow of the current detection circuit 72 when the drive transistor MN1, which is a high side driver, is turned on at the time of low side driving.

At this time, the switches SW71 and SW72 are turned on, and the switch SW73 is turned off. However, in the configuration of the current detection circuit 72 at this time, the source-drain voltage of the drive transistor MN2 of the off state and the source-drain voltage of the sense transistor Tr21a of the off state show the same value (Vbat), whereas the source-drain voltage of the sense transistor Tr21b of the off state shows a different value (0V).

As a result, when the Off-State Deterioration occurs, the degrees of degradation of each of the drive transistor MN2 and the sense transistor Tr21b are different, so that the ratio of the currents flowing through each of the drive transistor MN2 and the sense transistor Tr21b of the on state varies from a constant value.

Figure 37:
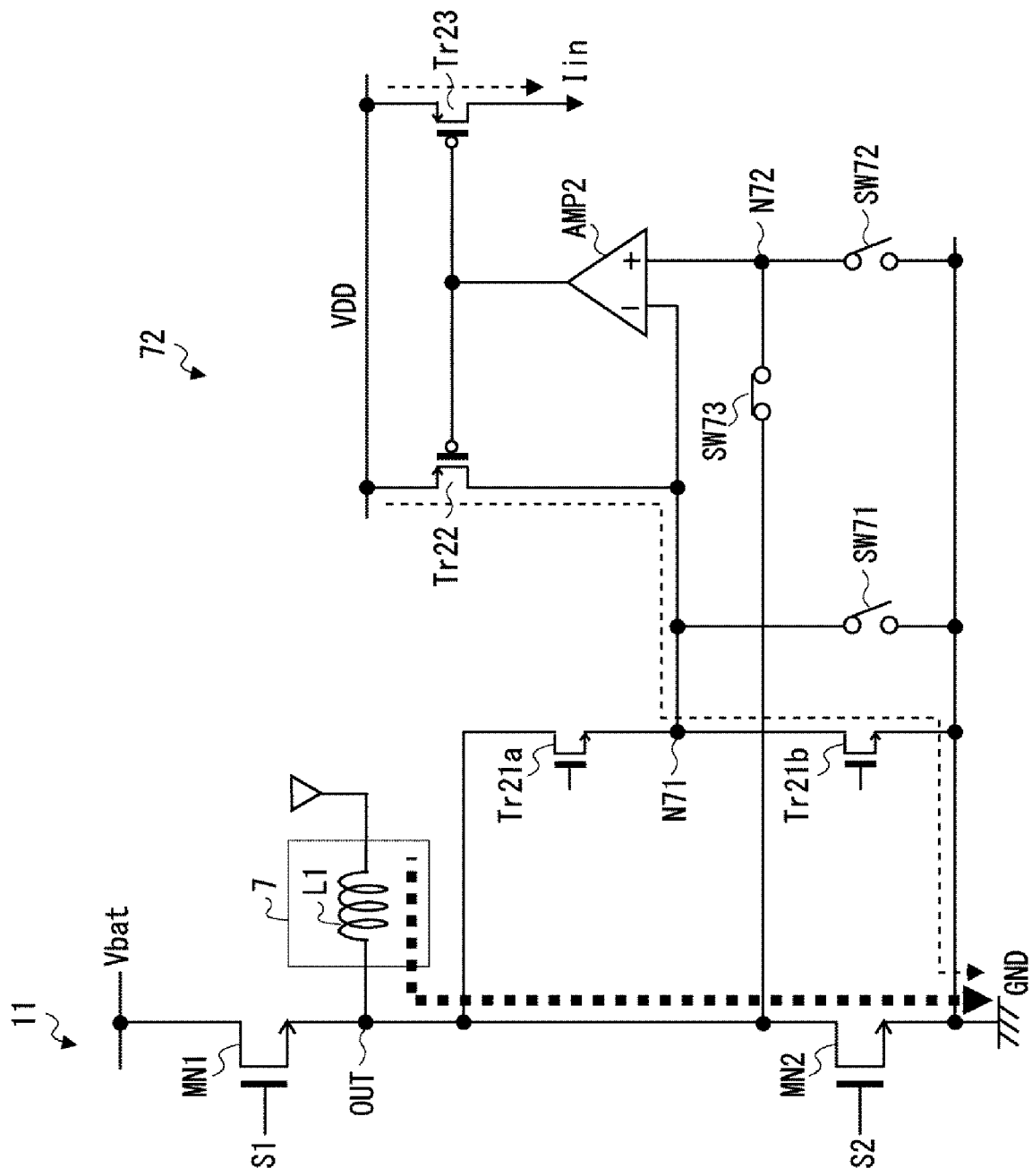
FIG. 37 is a diagram for explaining a flow of a current of the current detection circuit shown in FIG. 33 when the low side driver is turned on at the time of the low side driving.

FIG. 37 is a diagram for explaining a current flow of the current detection circuit 72 when the drive transistor MN2, which is a low side driver, is turned on at the time of the low side driving.

At this time, the switches SW71 and SW72 are turned off, and the switch SW73 is turned on. As a result, the current flowing in the transistors Tr21a and Tr22 in proportion to the current flowing in the drive transistor MN2 is mirrored by the transistor Tr23 and outputted as the detection current Iin of the current detection circuit 72.

As described above, the current detection circuit 72 cannot accurately detect the current flowing through the drive transistor MN2 by using the sense transistor Tr21b. On the other hand, the current detection circuit 32 according to the present embodiment can solve the problem occurring in the current detection circuit 72.

Sixth Embodiment

Figure 38:
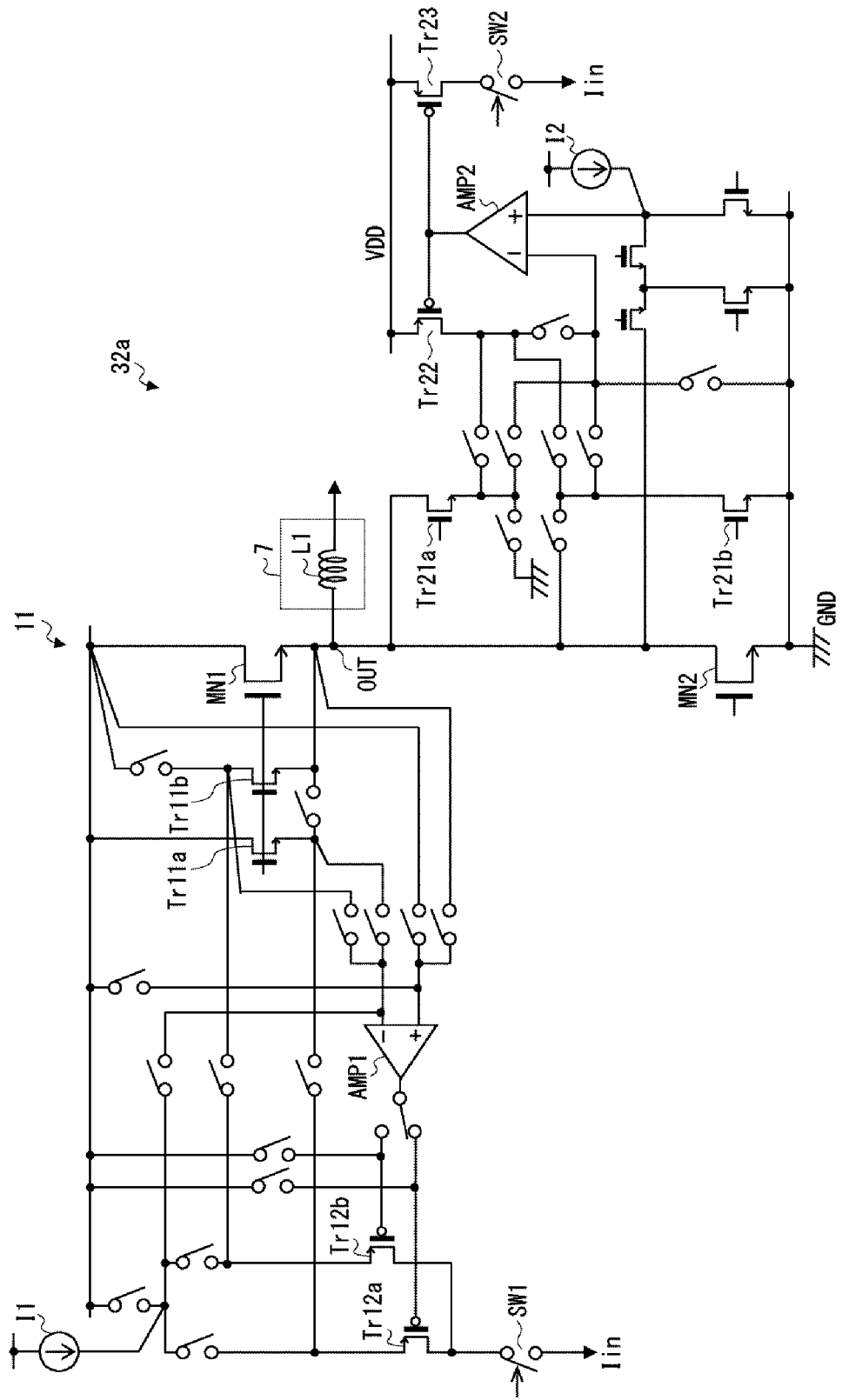
FIG. 38 is a diagram illustrating a specific configuration of a current detection circuit according to a sixth embodiment.

FIG. 38 is a diagram showing a specific configuration example of a current detection circuit 32a according to the sixth embodiment. The current detection circuit 32a further comprises constant current sources I1 and I2 compared to the current detection circuit 32.

Figure 39A:
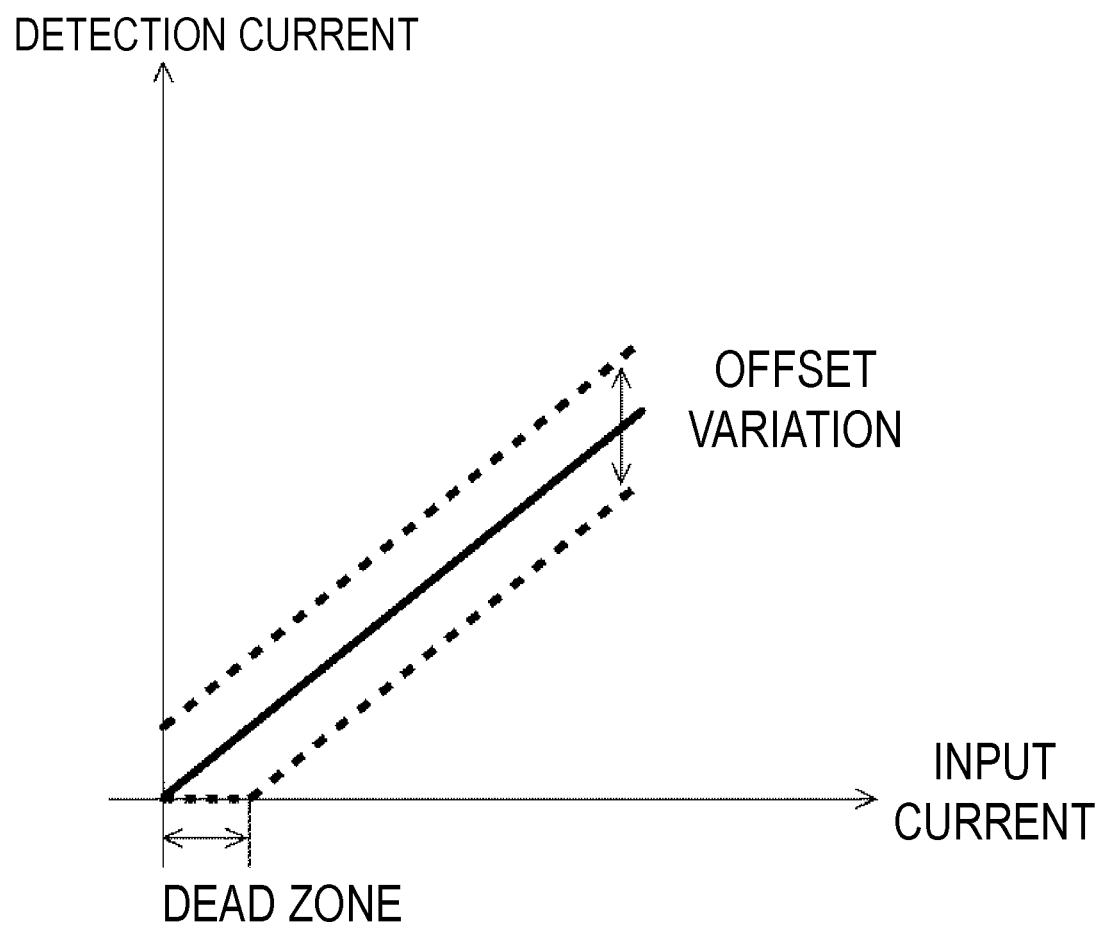
FIG. 39A and FIG. 39B are diagrams for explaining an improvement in a dead zone region.
Figure 39B:
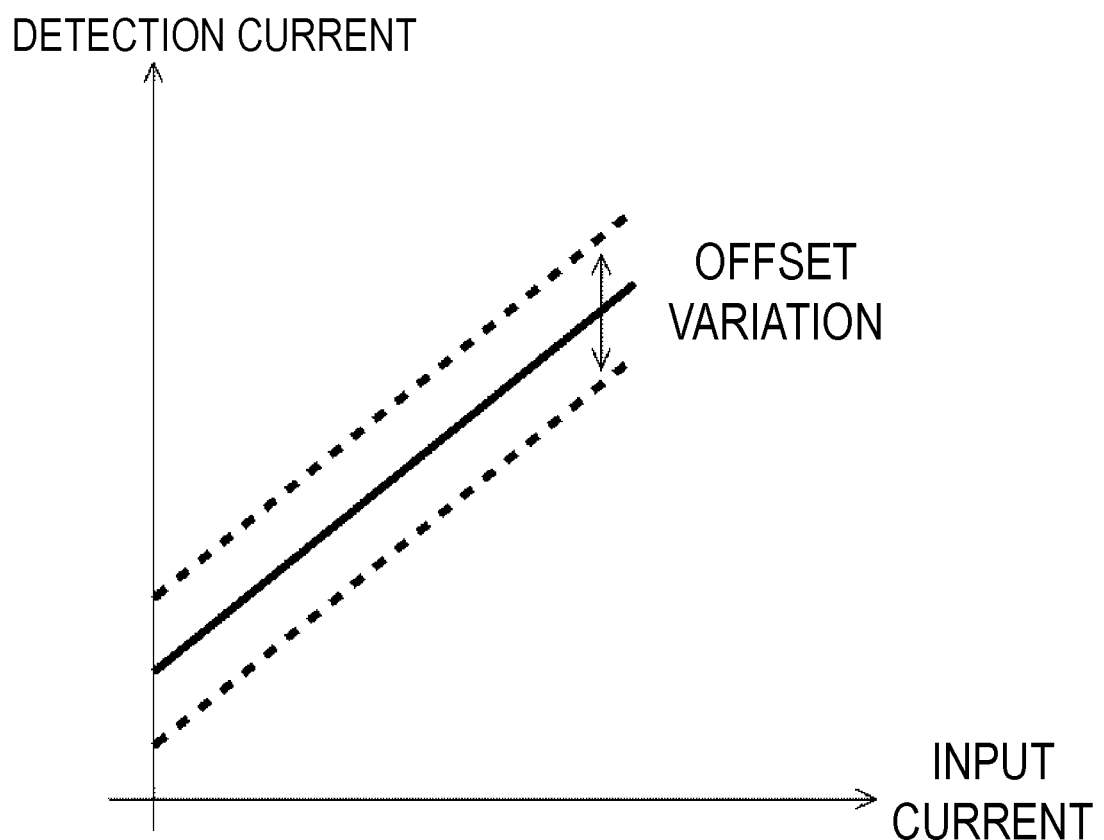

The constant current source I1 generates a constant current IshH which is an intentional offset current. The current obtained by adding the constant current IshH and the current flowing through the sense transistors Tr11a and Tr11b (first sense current) is outputted as the detection current Iin of the current detection circuit 32a. As a result, when there is a variation in the first sense current (input current), the current detection circuit 32a can output the detection current Iin without causing a dead zone region (see FIG. 39A and FIG. 39B).

The constant current source I2 generates a constant current IshL which is an intentional offset current. The current obtained by adding the constant current IshL and the current flowing through the sense transistor Tr21a and Tr21b (second sense current) is outputted as the detection current Iin of the current detection circuit 32a. In FIG. 38, the constant current IshL is supplied to the non-inverting terminal of the operational amplifier AMP2. Along with this, a part of the switch in the periphery thereof is replaced with MOS transistor. As a result, when the second sense current (input current) has an offset variation, the current detection circuit 32a can output the detection current Iin without causing the dead zone region (see FIG. 39A and FIG. 39B).

Figure 40:
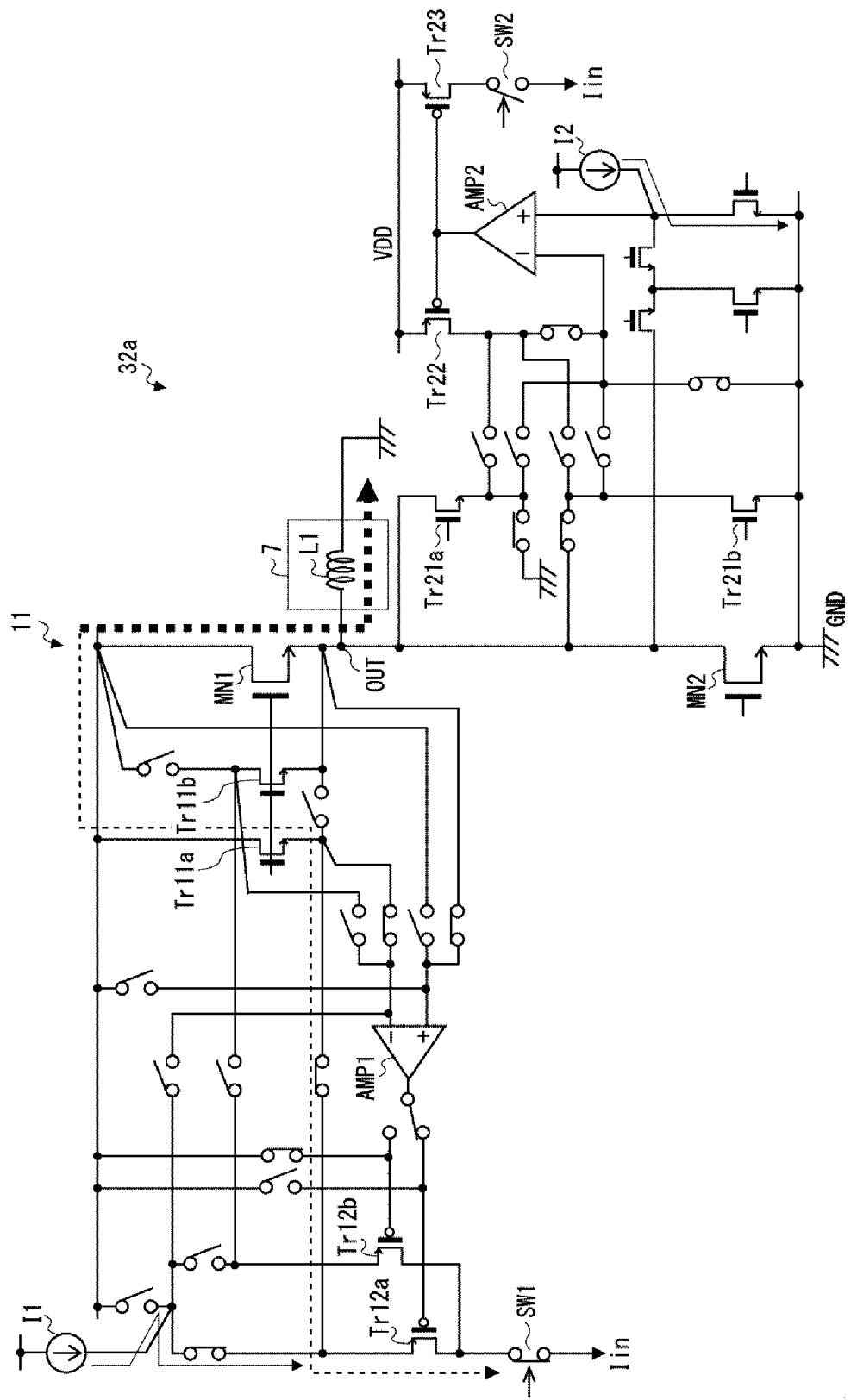
FIG. 40 is a diagram for explaining a connecting relation and a current flow of components of the current detection circuit shown in FIG. 38 when the high side driver is turned on at the time of high side driving.

FIG. 40 is a diagram for explaining the connections of the constituent elements of the current detection circuit 32a and the flow of current when the drive transistor MN1, which is the high side driver, is turned on at the time of the high side driving. In FIG. 40, a thick dotted arrow indicates a path through which the solenoidal current flows, and a thin dotted arrows indicate paths through which the detection currents flow.

Figure 41:
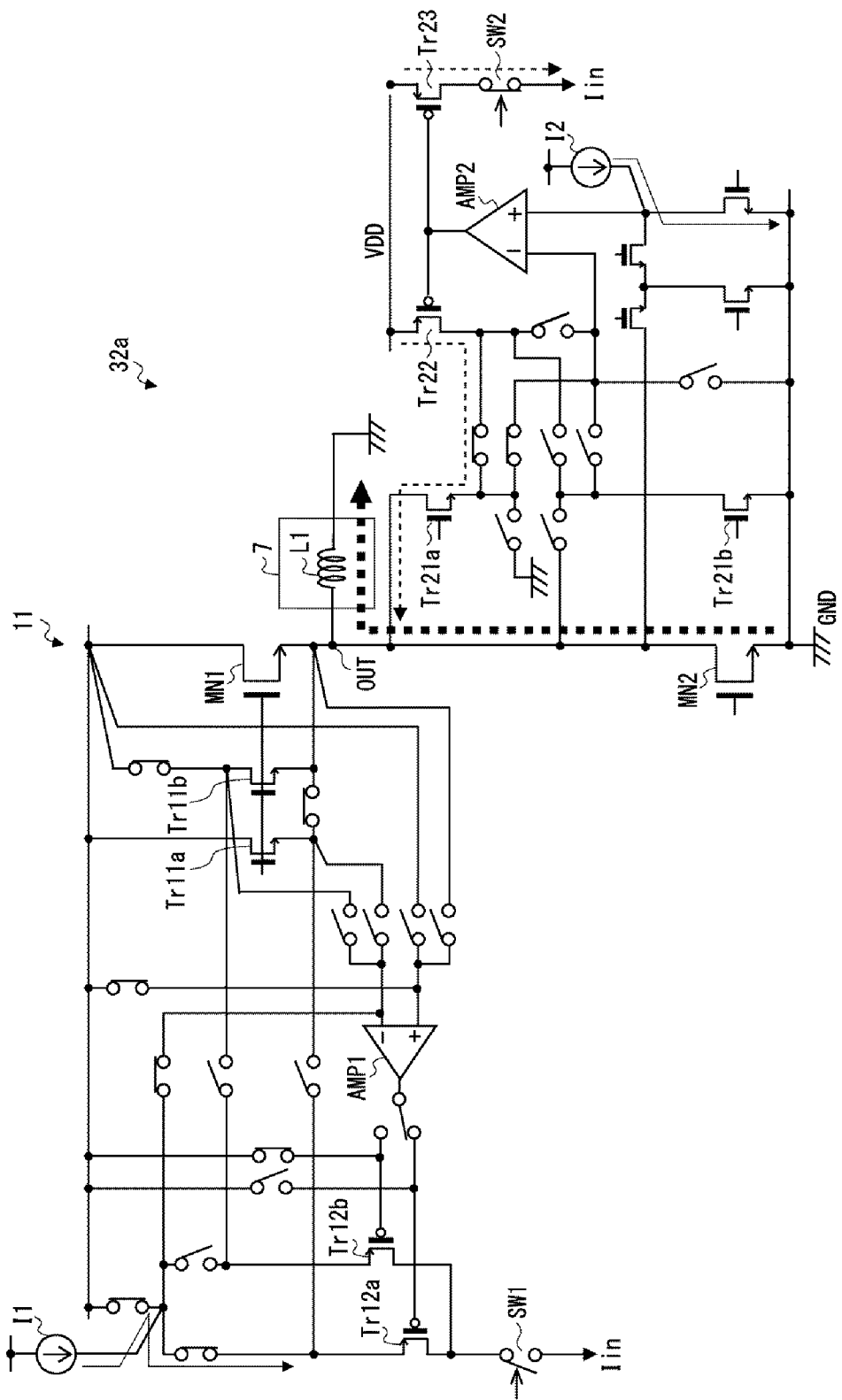
FIG. 41 is a diagram for explaining a connecting relation and a current flow of components of the current detection circuit shown in FIG. 38 when the low side driver is turned on at the time of high side driving.

FIG. 41 is a diagram for explaining the connections of the constituent elements of the current detection circuit 32a and the flow of current when the drive transistor MN2, which is a low side driver, is turned on at the time of the high side driving. In FIG. 41, a thick dotted arrow indicates a path through which the solenoidal current flows, and a thin dotted arrow indicates a path through which the detection current flows.

Figure 42:
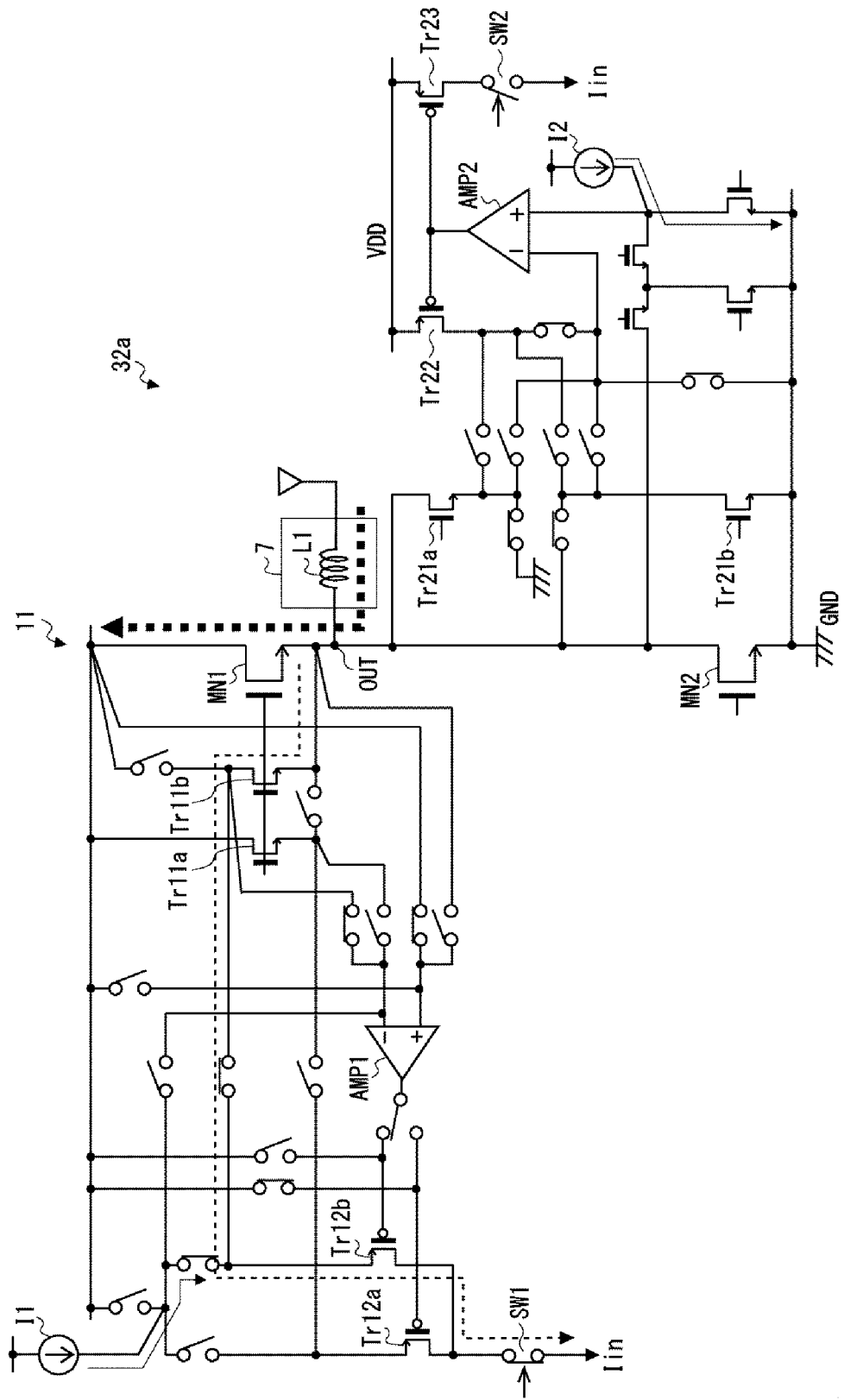
FIG. 42 is a diagram for explaining a connecting relation and a current flow of components of the current detection circuit shown in FIG. 38 when the high side driver is turned on in the low side driving.

FIG. 42 is a diagram for explaining the connections of the constituent elements of the current detection circuit 32a and the flow of current when the drive transistor MN1, which is a high side driver, is turned on at the time of the low side driving. In FIG. 42, a thick dotted arrow indicates a path through which the solenoidal current flows, and a thin dotted arrows indicate a path through which the detection currents flow.

Figure 43:
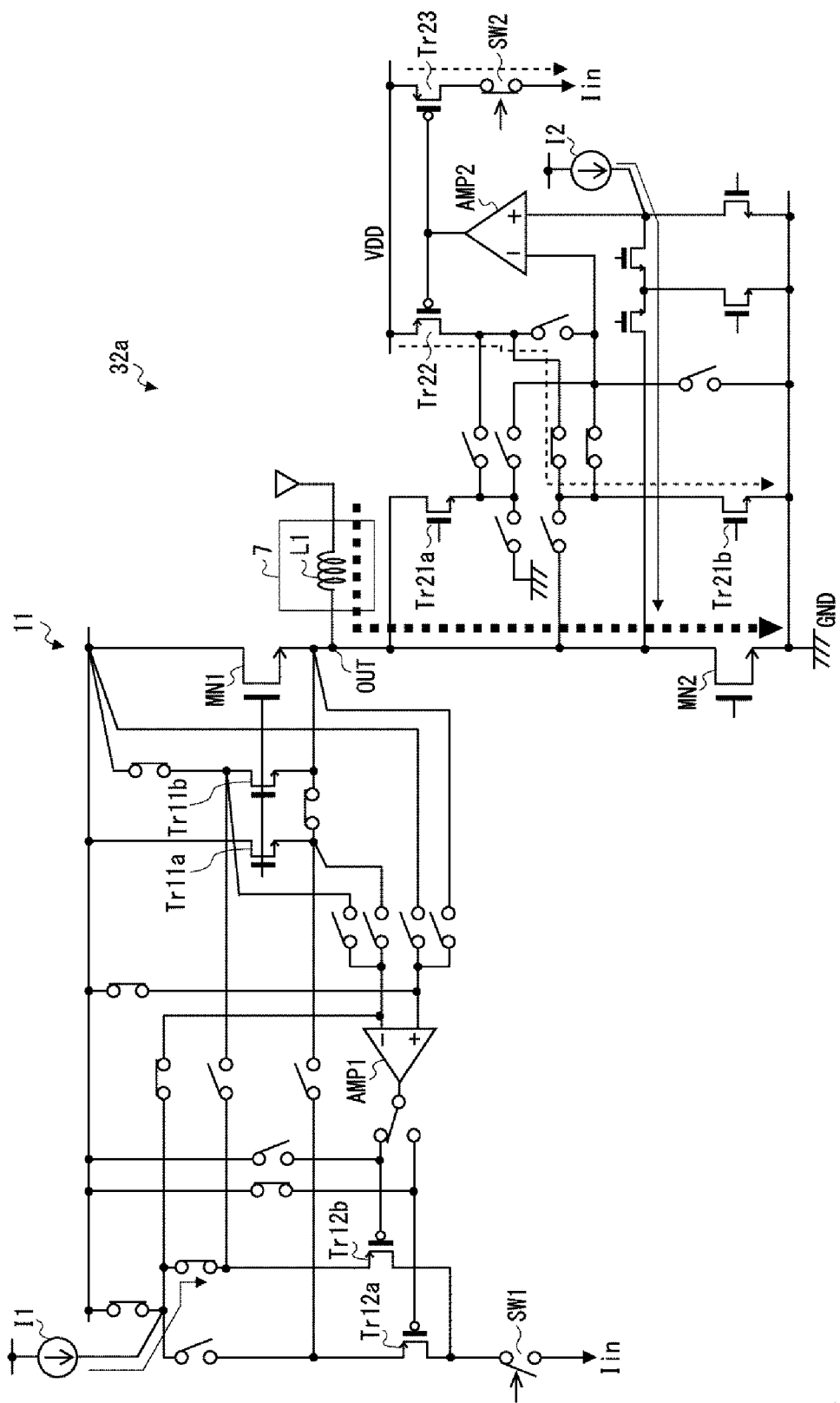
FIG. 43 is a diagram for explaining a connecting relation and a current flow of components of the current detection circuit shown in FIG. 38 when the low side driver is turned on in the low side driving.

FIG. 43 is a diagram for explaining the connections of the constituent elements of the current detection circuit 32a and the flow of the current when the drive transistor MN2, which is the low side driver, is turned on at the time of the low side driving. In FIG. 43, a thick dotted arrow indicates a path through which the solenoidal current flows, and thin dotted arrows indicate paths through which the detection currents flow.

The connection relationships and the current flows of the constituent elements of the current detection circuit 32a shown in FIG. 40 to FIG. 43 are the same as the connection relationships and the current flows of the constituent elements of the current detection circuit 32 shown in FIG. 29 to FIG. 32, and therefore descriptions thereof are omitted.

As described above, the current detection circuit 32a applied to the present embodiment can exhibit the same degree of effects as those of the current detection circuit 32. Further, the current detection circuit 32a applied to the present embodiment can add the constant current IshH and the first sense current, or add the constant current IshL and the second sense current, thereby outputting the detection current Iin without causing the dead zone region when there is an offset variation in the first and second sense currents.

Although the invention made by the inventor has been specifically described based on the embodiment, the present invention is not limited to the embodiment already described, and it is needless to say that various modifications can be made without departing from the gist thereof.

For example, according to the semiconductor device in the above embodiment, the conductivity type (p-type or n-type) of the semiconductor substrate, the semiconductor layer, the diffusion layer (diffused region), or the like may be inverted. Therefore, in the case where one of the conductivity types of the n-type or the p-type is the first conductivity type and the other conductivity type is the second conductivity type, the first conductivity type can be the p-type and the second conductivity type can be the n-type, or on the contrary, the first conductivity type can be the n-type and the second conductivity type can be the p-type.

In the above embodiment, the respective switch may be configured by, for example, a MOS transistor. For example, by using a high withstand voltage MOS transistor only in the switch where a high voltage is applied among a plurality of switches, an increase in the circuit scale can be suppressed.

Part or all of the above embodiments may be described as the following additional statement, but the present invention is not limited thereto.

(Additional Statement 1)

A current detection circuit comprising:

a first sense transistor supplied with a voltage of the first power supply in common with a first drive transistor provided between the first power supply and an outside output terminal, and a first sense current which is proportional to a current flowing through the first drive transistor flows through the first sense transistor;

a first amplifier amplifying a potential difference between a voltage of the outside output terminal and a voltage of an output terminal of the first sense transistor outputting the first sense current;

a first voltage control transistor which is provided in serial with the first sense transistor in a side of the output terminal of the first sense transistor, and an output voltage of the first amplifier is added to a gate of the first voltage control transistor;

a first switch provided between the outside output terminal and the output terminal of the first sense transistor, turned on when the first drive transistor is turned off, and turned off when the first drive transistor is turned on;

wherein the current detection circuit outputs the first sense current as a detection current.

(Additional Statement 2)

The current detection circuit according to additional statement 1, further comprising:

a second sense transistor provided between the outside output terminal and the second power supply, and supplied with the voltage of the outside output voltage in common with a second drive transistor turning on and off in complementary with the first drive transistor, and a sense current which is proportional to a current flowing through the second drive transistor flows through the second sense transistor;

a second voltage control transistor which is provided in serial with the second sense transistor in a side of the output terminal of the second sense transistor, and an output voltage of the second amplifier is added to a gate of the second voltage control transistor;

a second switch provided between the second power supply and an output terminal of the second sense transistor, and turned on when the second drive transistor is turned off, and turned off when the second drive transistor is turned on; and a selection circuit selectively outputs the first sense current or the second sense current as the detection current.

(Additional Statement 3)

The current detection circuit according to additional statement 1, further comprising a first constant current source adding a first constant current to the first sense current.

(Additional Statement 4)

The current detection circuit according to additional statement 2, further comprising:

a first constant current source adding a first constant current to the first sense current; and a second constant current source adding a second constant current to the second sense current.

(Additional Statement 5)

A semiconductor device comprising:

the current detection circuit of additional statement 1;

the first drive transistor provided between the first power source and the outside output terminal; and a second drive transistor provided between the second power supply and the outside output terminal, and switching on and off complementary with the first drive transistor.

(Additional Statement 6)

A semiconductor system comprising:

a first drive transistor controlling a supply of a current flowing through a load based on a pulse signal;

a current detection circuit of additional statement 1 detecting a current flowing through the first drive transistor; and a control circuit controlling a duty rate of the pulse signal based on a detection result by the current detection circuit.

(Additional Statement 7)

A semiconductor system of additional statement 6, wherein the load is a solenoid valve.

(Additional Statement 8)

A current detection circuit comprising:

a first sense transistor to which a voltage of an external output terminal is supplied together with a first drive transistor, of the first drive transistor provided between a first power supply and an external output terminal to which a load is connected, and a second drive transistor provided between the external output terminal and a second power supply, and a first sense current proportional to a current flowing through the first drive transistor flows through the first sense transistor;

a first amplifier amplifying a potential difference between a voltage of the first power suppl and a voltage of the first sense transistor outputting the first sense current;

a first voltage control transistor which is provided in serial with the first sense transistor in a side of the output terminal of the first sense transistor, and an output voltage of the first amplifier is added to a gate of the first voltage control transistor;

a first switch provided between the outside output terminal and the output terminal of the first sense transistor, turned on when the first drive transistor is turned off, and turned off when the first drive transistor is turned on;

wherein the current detection circuit outputs the first sense current as a detection current.

(Additional Statement 9)

The current detection circuit according to statement 8, wherein the first power supply is a low potential side power supply, wherein the load is provided between the outside output terminal and the low potential side power supply, wherein the current detection circuit further comprising a mirror transistor mirroring the first sense current flowing through the first voltage control transistor in common with the first sense transistor, and wherein the current detection circuit outputs the first sense current mirrored by the mirror transistor as the detection current.

(Additional Statement 10)

The current detection circuit according to additional statement 8, wherein the first power supply is a high potential side power supply, wherein the load is provided between the outside output terminal and the high potential power supply.

(Additional Statement 11)

A semiconductor device comprising:

the current detection circuit according to additional statement 8;

a first drive transistor provided between the first power source and the outside output terminal; and a second drive transistor provided between a second power source and the outside output terminal and turning on and off complementary with the first drive transistor.

(Additional Statement 12)

A semiconductor system comprising:

a first drive transistor controlling a supply of a current flowing through a load based on a pulse signal;

the current detection circuit of additional statement 8 detecting a current flowing through the first drive transistor;

a control circuit controlling a duty rate of the pulse signal based on a detection result of the current detection circuit.

(Additional statement 13)

The semiconductor system according to additional statement 12, wherein the load is a solenoid valve.

What is claimed is:

1. A semiconductor device comprising:
   a first drive transistor having a drain supplied with a first power supply voltage and a source connected to an output terminal to which an outside load is connected;
   a first sense transistor having a drain supplied with the first power supply voltage;
   a first voltage control circuit controlling a first sense current flowing from the first sense transistor based on a potential difference between a source voltage of the first drive transistor and a source voltage of the first sense transistor; and
   a first connection control circuit configured to connect the source of the first drive transistor and the source of the first sense transistor,
   wherein the sense current is outputted as a detection current,
   wherein when the first drive transistor is turned off, the source of the first drive transistor and the source of the first sense transistor are short-circuited by the first connection control circuit,
   wherein a first drive current flows from the first drive transistor,
   wherein the first sense current is proportional to the first drive current, wherein the first connection control circuit is comprised of a switch,
wherein the first voltage control circuit is comprised of:
 a first amplifier outputting an amplified potential difference between the source voltage of the first drive transistor and the source voltage of the first sense transistor; and
 a first voltage control transistor having a gate supplied with the output of the first amplifier and one of a source or a drain connected to the source of the first sense transistor, and
 wherein the semiconductor device further comprises a first exchange circuit disconnecting the output terminal and the source of the first sense transistor from two input terminals of the first amplifier.

2. The semiconductor device according to claim 1,
wherein the first power supply voltage is a high potential side power supply voltage, and
wherein the outside load is connected between the output terminal and a low potential side power supply voltage.

3. The semiconductor device according to claim 1, further comprising:
 a second drive transistor having a source supplied with a second power supply voltage and a drain connected to the output terminal, and turned on and off complementary to the first drive transistor;
 a second sense transistor having a drain connected to the output terminal;
 a second amplifier amplifying a potential difference between the second power supply voltage and a source voltage of the second sense transistor;
 a second voltage control transistor having a gate supplied with the output of the second amplifier and one of a source or a drain connected to a source of the second sense transistor;
 a second connection control circuit connected to the source of the second drive transistor and the source of the second sense transistor, and turned off when the second drive transistor is turned on, and turned on when the second drive transistor is turned off; and
 a selection circuit selectively outputs the first sense current or the second sense current as the detection current.

4. The semiconductor device according to claim 3, further comprising a second mirror transistor mirroring the second sense current,
wherein the first power supply voltage is a high potential side power supply voltage,
wherein the second power supply voltage is a low potential side power supply voltage,
wherein the outside load is connected between the output terminal and the low potential side power supply voltage, and
wherein the selection circuit selectively outputs the first sense current or the second sense current as the detection current.

5. The semiconductor device according to claim 1,
wherein when the first drive transistor is turned on, the exchange circuit connects one of the two input terminals of the first amplifier to the output terminal and connects the other of the two input terminals of the first amplifier to the source of the first sense transistor, and
wherein when the first drive transistor is turned off, the exchange circuit connects each of the two input terminals of the first amplifier to the first power supply voltage.

6. A semiconductor system comprising:
the semiconductor device of claim 1; and
a control circuit controlling a duty ratio of a pulse signal,
wherein the first drive transistor is controlled by the pulse signal.

* * * * *